United States Patent
Wolk et al.

(10) Patent No.: US 7,849,424 B2
(45) Date of Patent: Dec. 7, 2010

(54) SYSTEMS, DEVICES, AND METHODS FOR CONTROLLING ELECTRICAL AND OPTICAL PROPERTIES OF TRANSPARENT CONDUCTORS

(75) Inventors: Jeffrey Wolk, Half Moon Bay, CA (US); Haixia Dai, Mountain View, CA (US); Xina Quan, Saratoga, CA (US); Michael A. Spaid, Mountain View, CA (US)

(73) Assignee: Cambrios Technologies Corporation, Sunnyvale, CA (US)

( * ) Notice: Subject to any disclaimer, the term of this patent is extended or adjusted under 35 U.S.C. 154(b) by 446 days.

(21) Appl. No.: 11/871,053

(22) Filed: Oct. 11, 2007

(65) Prior Publication Data

US 2009/0228131 A1    Sep. 10, 2009

Related U.S. Application Data

(60) Provisional application No. 60/829,294, filed on Oct. 12, 2006.

(51) Int. Cl.
*G06F 17/50* (2006.01)
*G06F 19/00* (2006.01)

(52) U.S. Cl. .............. 716/3; 716/4; 700/97; 700/120; 700/121; 977/720; 977/839; 977/855

(58) Field of Classification Search ............... 716/3, 716/4; 700/97, 120, 121; 977/720, 839, 977/855
See application file for complete search history.

(56) References Cited

U.S. PATENT DOCUMENTS

| | | | |
|---|---|---|---|
| 7,135,728 B2 * | 11/2006 | Duan et al. | 257/296 |
| 7,233,041 B2 * | 6/2007 | Duan et al. | 257/296 |
| 7,344,691 B2 * | 3/2008 | Chen et al. | 423/447.2 |
| 7,589,880 B2 * | 9/2009 | Kempa et al. | 359/245 |
| 2004/0112964 A1 * | 6/2004 | Empedocles et al. | 235/491 |
| 2005/0128788 A1 | 6/2005 | Segal et al. | |
| 2005/0184641 A1 | 8/2005 | Armitage et al. | |
| 2007/0107103 A1 * | 5/2007 | Kempa et al. | 977/834 |
| 2007/0228439 A1 * | 10/2007 | Duan et al. | 257/296 |

(Continued)

FOREIGN PATENT DOCUMENTS

EP    1 619 524 A1    1/2006

(Continued)

OTHER PUBLICATIONS

Agarwal et al., "Transport Characteristics of Si Nanowires in Bulk Silicon and SOI Wafers," Emerging Technologies— Nanoelectronics, 2006 IEEE Conference on, 67-70, Jan. 10-13, 2006.

(Continued)

*Primary Examiner*—Phallaka Kik
(74) *Attorney, Agent, or Firm*—Robert Iannucci; Seed IP Law Group PLLC

(57) ABSTRACT

Systems, devices, and methods for designing and/or manufacturing transparent conductors. A system is operable to evaluate optical and electrical manufacturing criteria for a transparent conductor. The system includes a database including stored reference transparent conductor data, and a controller subsystem configured to compare input acceptance manufacturing criteria for a transparent conductor to stored reference transparent conductor data.

25 Claims, 71 Drawing Sheets

U.S. PATENT DOCUMENTS

2010/0155696 A1* 6/2010 Duan et al. .................. 257/14
2007/0276455 A1* 11/2007 Fiset .......................... 607/91

FOREIGN PATENT DOCUMENTS

WO  2007/022226 A2  2/2007

OTHER PUBLICATIONS

Hu et al., "Percolation in Transparent and Conducting Carbon Nanotube Networks," Nano Letters, vol. 4, No. 12, pp. 2513-2517, 2004.

Lindeberg et al., "Interconnected nanowire clusters in polymide for flexible circuits and magnetic sensing applications," Sensors and Actuators A 105:150-161, 2003.

* cited by examiner

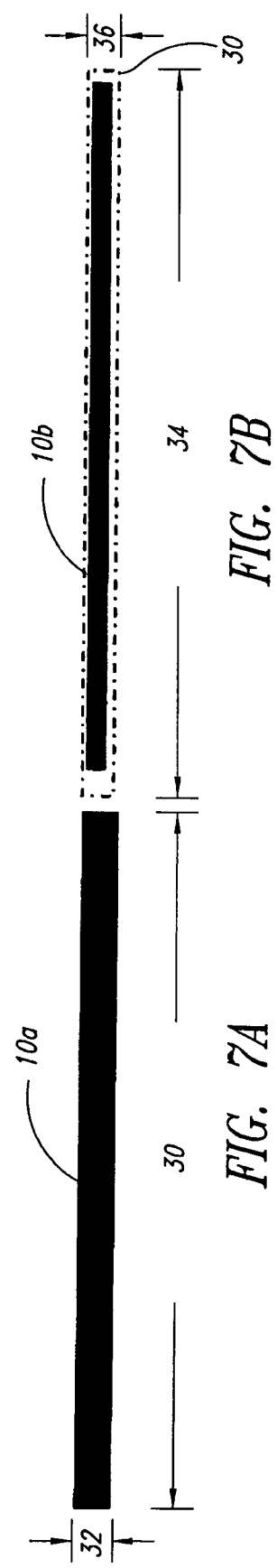

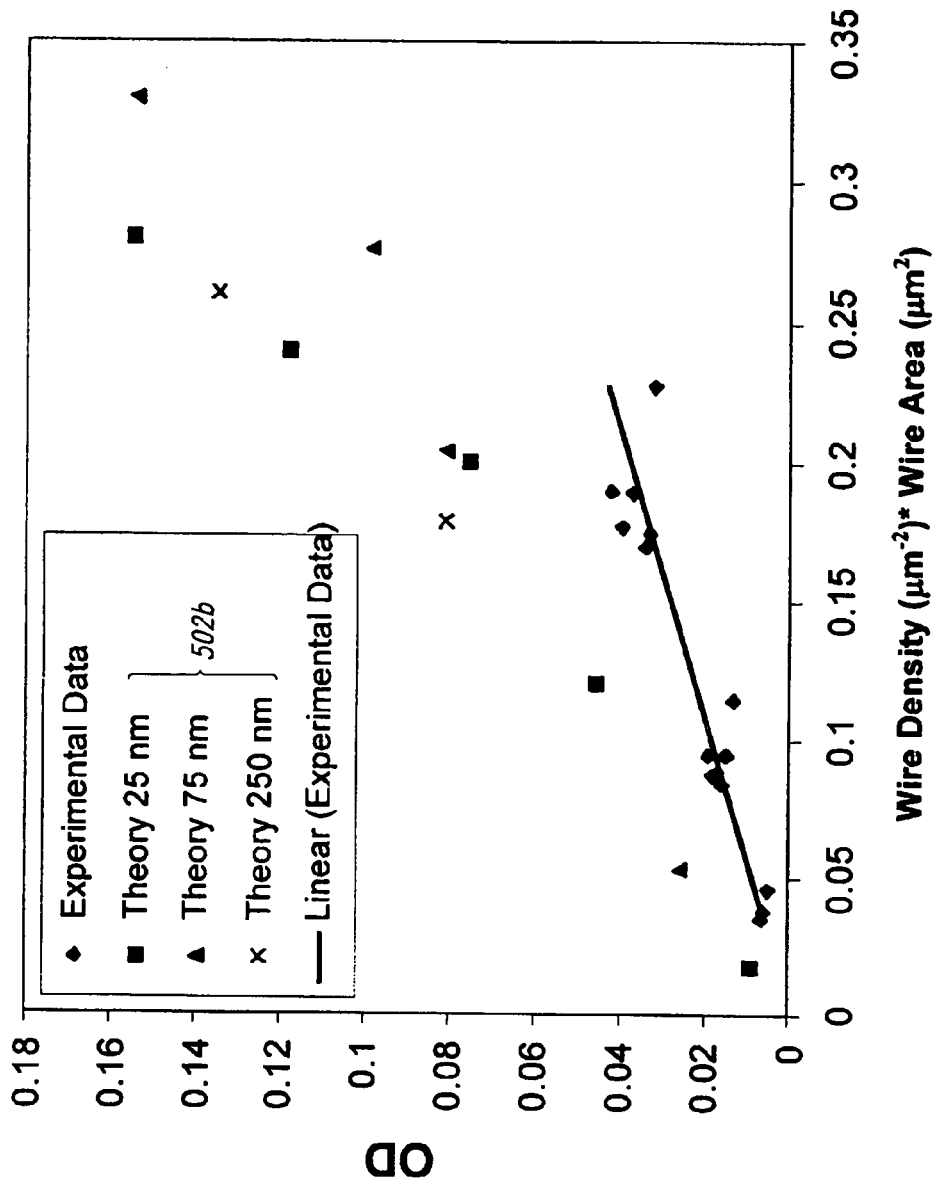

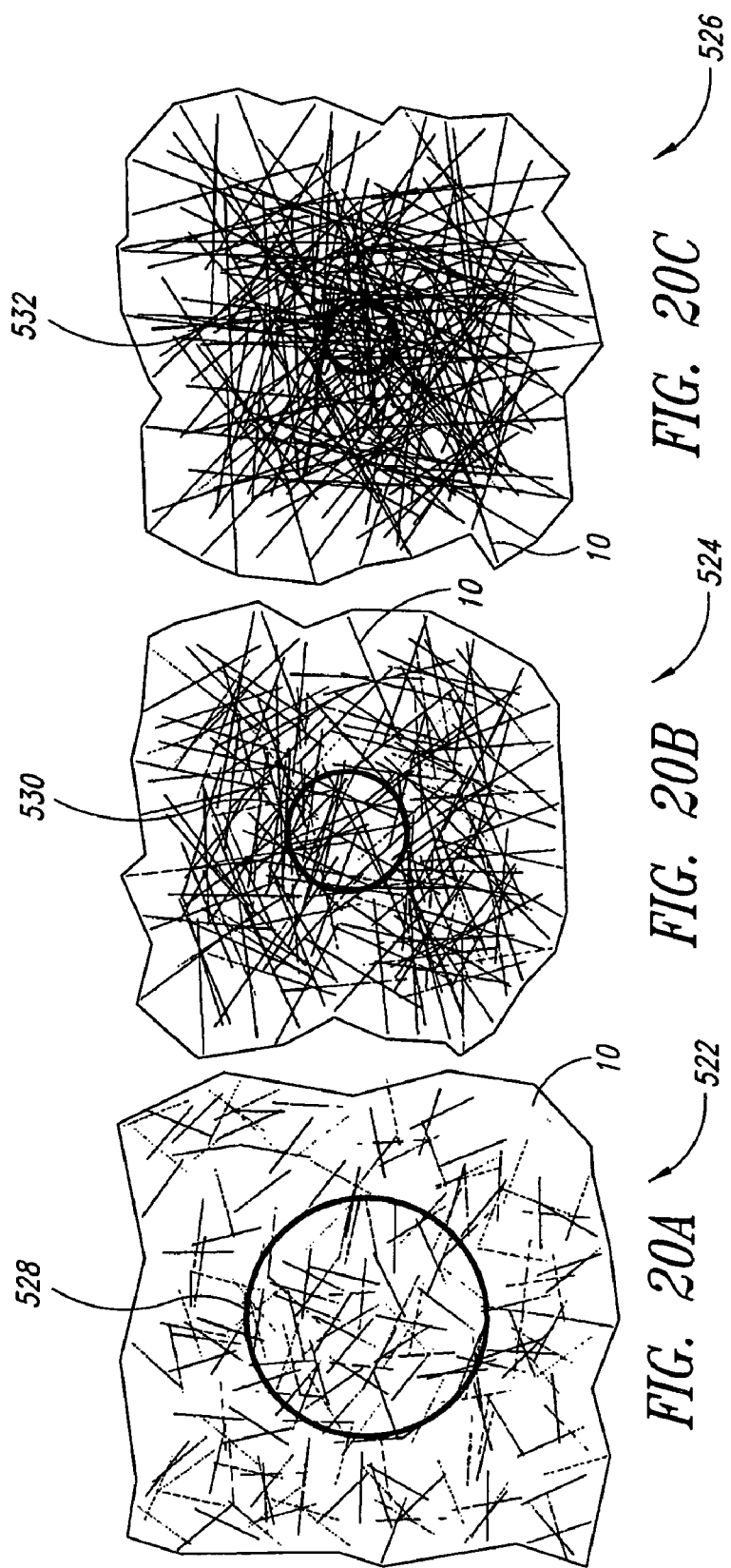

SYSTEMS, DEVICES, AND METHODS FOR CONTROLLING ELECTRICAL AND OPTICAL PROPERTIES OF TRANSPARENT CONDUCTORS

CROSS-REFERENCE TO RELATED APPLICATION

This application claims the benefit under 35 U.S.C. §119 (e) of U.S. Provisional Patent Application No. 60/829,294 filed Oct. 12, 2006, the contents of which are incorporated herein by reference in their entirety.

BACKGROUND

1. Field of Technology

This disclosure generally relates to the field of transparent conductors and, more particularly, to systems, devices, and methods for manufacturing transparent conductors.

2. Description of the Related Art

The term "transparent conductors" typically refers to thin conductive films coated on high-transmittance surfaces or substrates. Transparent conductors may be manufactured to have surface conductivity while maintaining reasonable optical transparency. Such surface conducting transparent conductors are widely used as, for example, transparent electrodes in flat liquid crystal displays, touch panels, electroluminescent devices, and thin-film photovoltaic cells, as well as anti-static layers and electromagnetic wave shielding layers.

Currently, vacuum deposited metal oxides, such as indium tin oxide (ITO), are the industry standard materials to provide optically transparent electrical conductivity to dielectric surfaces such as glass and polymeric films. The metal oxide films, however, are fragile and prone to damage during bending or other physical stresses. They also require elevated deposition temperatures and/or high annealing temperatures to achieve high conductivity levels. There also may be issues with the adhesion of metal oxide films to substrates that are prone to adsorbing moisture such as plastic and organic substrates (e.g. polycarbonates, and the like). Applications of metal oxide films on flexible substrates are therefore severely limited. In addition, vacuum deposition is a costly process and requires specialized equipment. Moreover, the process of vacuum deposition is not conducive to forming patterns and circuits. This typically results in the need for expensive patterning processes such as photolithography.

Conductive polymers have also been used in the manufacture of optically transparent electrical conductors. The polymers, however, generally have lower conductivity values, exhibit higher optical absorption (particularly at visible wavelengths) compared to the metal oxide films, and suffer from lack of chemical and long-term stability.

Commercial acceptance of transparent conductors is dependent on a variety of factors, such as cost to manufacture, versatility, reliability, and ease of design and manufacture. For example, it may be desirable to have novel approaches for manufacturing transparent conductors possessing desirable electrical, optical, and mechanical properties. Accordingly, there remains a need in the art to provide transparent conductors having desirable electrical, optical, and mechanical properties, in particular transparent conductors that are adaptable to any substrates, and can be manufactured and patterned in a low-cost, reliable high-throughput process.

The present disclosure is directed to overcoming one or more of the shortcomings set forth above, and providing further related advantages.

BRIEF SUMMARY

In one aspect, the present disclosure is directed to a system for evaluating optical and electrical manufacturing criteria for a transparent conductor. The system includes a database comprising stored reference transparent conductor data. In some embodiments, the stored reference transparent conductor data includes data correlating a nanowire length, a nanowire diameter, a nanowire density, or a nanowire concentration to electrical or optical properties of a transparent conductor film. The system further includes a controller to compare input acceptance manufacturing criteria for a transparent conductor to the stored reference transparent conductor data, and to generate a response based on the comparison. In some embodiments, the inputted acceptance manufacturing criteria comprises at least one of a sheet resistance ($R_s$) level, an optical density (OD) level, a transmission level, or a haze level.

In another aspect, the present disclosure is directed to a method for controlling a process of fabricating a transparent conductor film including nanowires. The method includes receiving an input specification of a physical characteristic of the transparent conductor film, and comparing the input specification to stored reference data correlating a physical characteristic of reference transparent conductor films to a physical characteristic of reference nanowires. The method further includes generating a manufacturing specification comprising a target physical characteristic of the nanowires that correlates to the input specification. In some embodiments, the method includes controlling a physical characteristic of the nanowires of the transparent conductor film based on the manufacturing specification.

In another aspect, the present disclosure is directed to a computer readable storage medium comprising instructions that, when executed on a computer, executes a method for designing a nanowire transparent conductor. The method includes determining sets of nanowire values based on information indicative of a desired electrical or optical property of the nanowire transparent conductor. In some embodiments, the sets of nanowire values include a nanowire length, a nanowire width and/or diameter, and a corresponding density. The method further includes generating a manufacturing specification based on the determined sets of nanowire values for manufacturing the transparent conductor.

In yet another aspect, the present disclosure is directed to a method for designing a nanowire transparent conductor. The method includes automatically determining sets of nanowire values based on information indicative of a desired electrical or optical property of the nanowire transparent conductor. In some embodiments, the sets of nanowire values include a nanowire length, a nanowire width or diameter, and a corresponding density. The method may further include automatically generating a manufacturing specification based on the determined sets of nanowire values for manufacturing the transparent conductor.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements, as drawn, are not intended to convey any information regarding the actual shape of the particular elements, and have been solely selected for ease of recognition in the drawings.

FIGS. 7A and 7B are top plan views of nanowires of varying geometry according to multiple illustrated embodiments.

FIG. 14B is an exemplary optical density (OD) versus the product of nanowire density and nanowire area plot according to one illustrated embodiment.

FIGS. 20A, 20B, and 20C are top plan views of nanowire networks of varying density according to multiple illustrated embodiments.

DETAILED DESCRIPTION

Figures 1A, 1B, 1C:
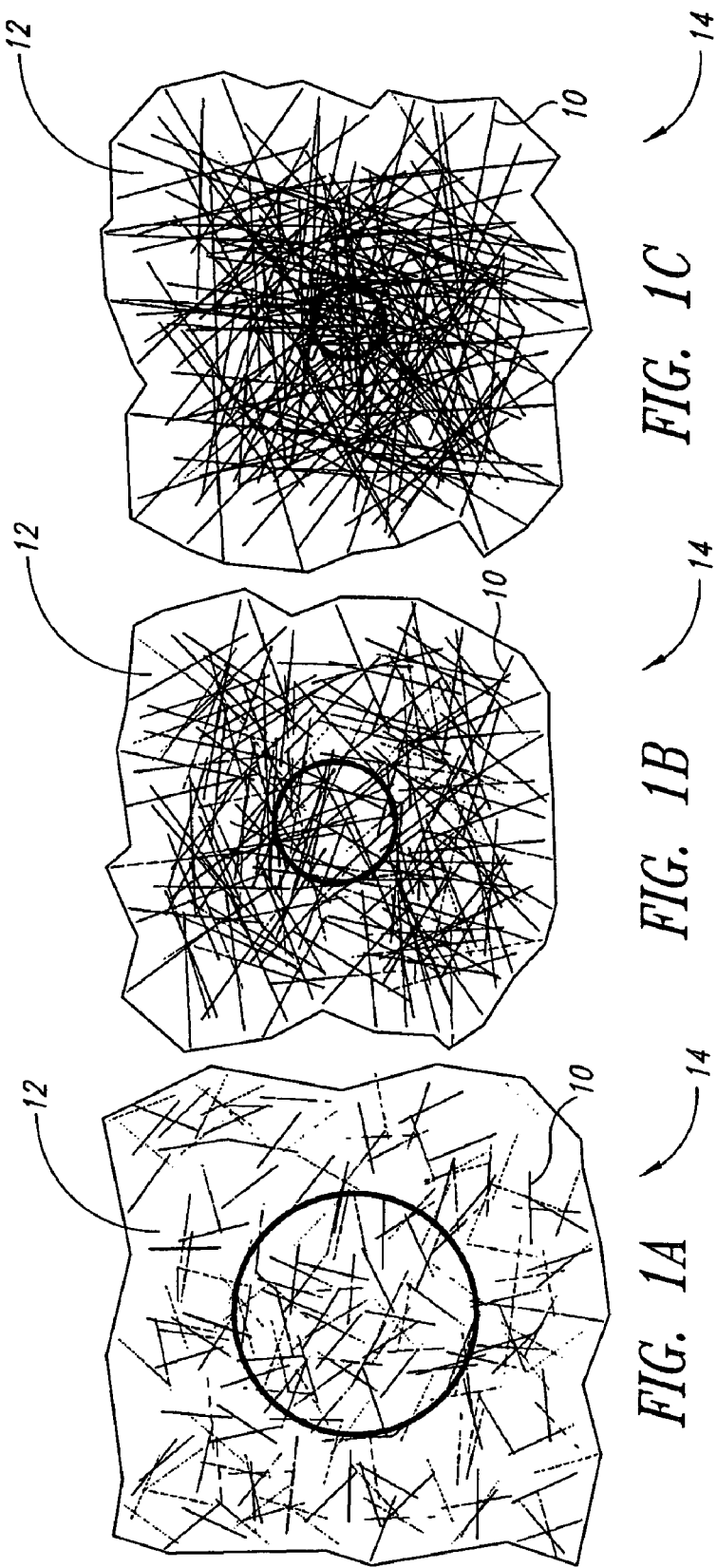
FIGS. 1A, 1B, and 1C are top plan views of nanowire networks of varying density according to multiple illustrated embodiments.

In the following description, certain specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with transparent conductor manufacturing process controllers including but not limited to power supplies, voltage and/or current regulators have not been shown or described in detail to avoid unnecessarily obscuring descriptions of the embodiments.

Unless the context requires otherwise, throughout the specification and claims which follow, the word "comprise" and variations thereof such as "comprises" and "comprising" are to be construed in an open, inclusive sense, that is as "including, but not limited to."

Reference throughout this specification to "one embodiment," or "an embodiment," or "in another embodiment" means that a particular referent feature, structure, or characteristic described in connection with the embodiment is included in at least one embodiment. Thus, the appearance of the phrases "in one embodiment," or "in an embodiment," or "in another embodiment" in various places throughout this specification are not necessarily all referring to the same embodiment. Furthermore, the particular features, structures, or characteristics may be combined in any suitable manner in one or more embodiments.

It should be noted that, as used in this specification and the appended claims, the singular forms "a," "an," and "the" include plural referents unless the content clearly dictates otherwise. Thus, for example, reference to a system for evaluating optical and electrical manufacturing criteria for a transparent conductor electrically powered device including "a controller" includes a single controller, or two or more controllers. It should also be noted that the term "or" is generally employed in its sense including "and/or" unless the content clearly dictates otherwise.

Optical and Electrical Properties of Nanowire Networks

A wide variety of methods and technologies can be used to manufacture transparent conductors (e.g., conductors, conductor substrates, conductor films, thin-film transparent conductors, transparent conductive films, optically active transparent conductors, and the like) including those disclosed in, for example, commonly assigned U.S. patent application Ser. No. 11/504,822, filed Aug. 14, 2006, which is hereby incorporated by reference in its entirety. Additionally, applicants have found that the electrical and optical properties of transparent conductors can be tailored by manipulating various aspects of percolating networks of nanowires used in making transparent conductors.

For example, varying the density of the nanowire networks may vary one or more of the optical and electrical properties of the resulting transparent conductors. In some embodiments, networks of nanowires of various densities can be used to manufacture and/or design transparent conductors having specific optical and electrical properties.

FIGS. 1A, 1B, and 1C show three exemplary nanowire networks 14 formed using a plurality of nanowires 10 of varying nanowire network densities deposited on a transparent conductor 12. FIGS. 1A, 1B, and 1C correspond to nanowire network densities 14 of approximately 0.09 nanowires/µm$^2$, approximately 0.6 nanowires/µm$^2$, and approximately 1.4 nanowires/µm$^2$ respectively.

Varying the density of the nanowire networks 14 may vary the electrical and optical properties of the resulting transparent conductors 12. To form a conductive network without the need for sintering, however, the density of nanowires 10 on a surface (e.g., transparent conductor 12, and the like) should exceed a percolation threshold density. The term "percolation threshold density" generally refers to the minimum density of nanowires 10 on a surface that on average will form a continuous path from one end of a sample to the other. Samples having no continuous paths are typically non-conductive. For a two-dimensional network, for example, the percolation threshold density is approximately equal to 5.71 divided by the average of the square of the nanowire length $$[5.71/<L^2>, \text{ where } <L^2>=\Sigma(L_i^2)/(\text{Number of nanowires})]. \quad (\text{eq. 1})$$

The brackets <x> around a quantity x denote the average of that quantity. For instance, a uniform distribution of nanowires 10, where each nanowire 10 is 20 µm long, corresponds to an <L$^2$> of 400 dm$^2$. A random distribution of nanowire 10 of varying lengths ranging from about 0 to about 40 µm long, with an average length of 20 µm, corresponds to an <L$^2$> of approximately 535 µm.

As a network density approaches the percolation threshold density, differing samples (comprising multiple samples made using the same nanowire solutions) will exhibit significant fluctuation in their characteristic resistance. This is due in part to the randomness of the process of placing the nanowires 10 on the transparent conductor surface 12.

Figure 2:
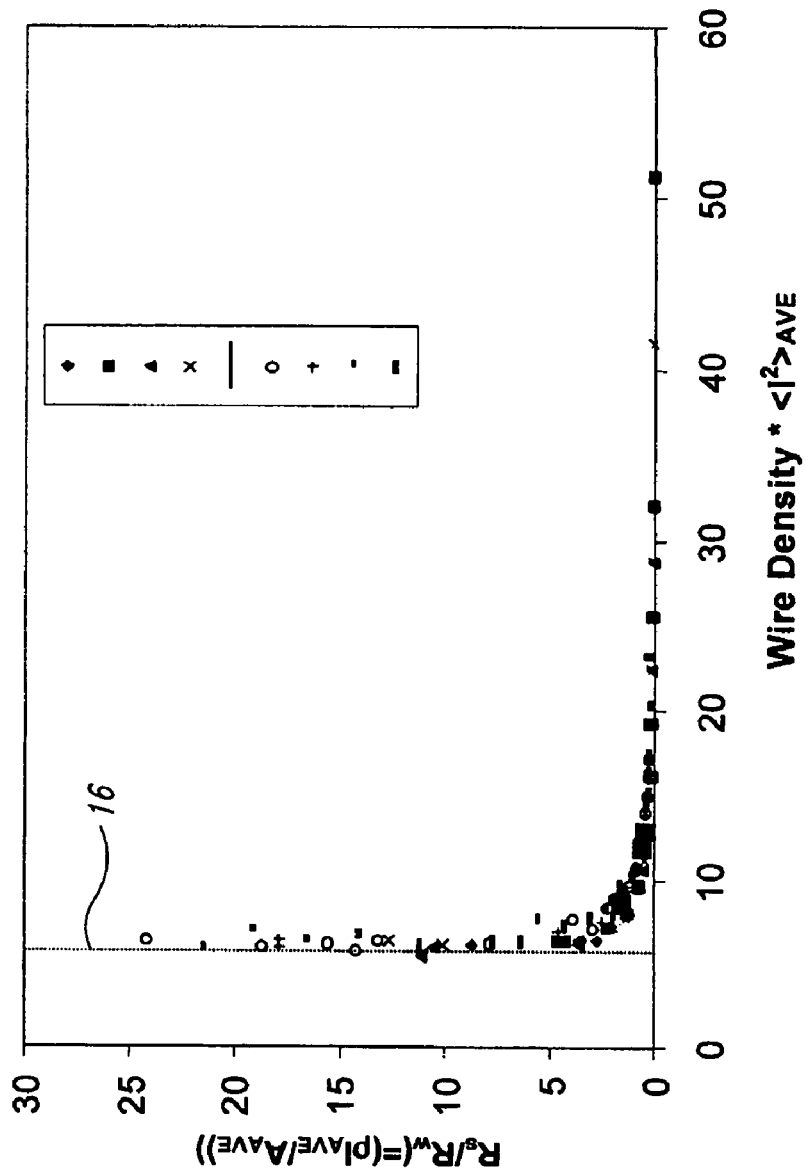
FIG. 2 is an exemplary resistivity versus nanowire density plot according to one illustrated embodiment.
Figure 3A:
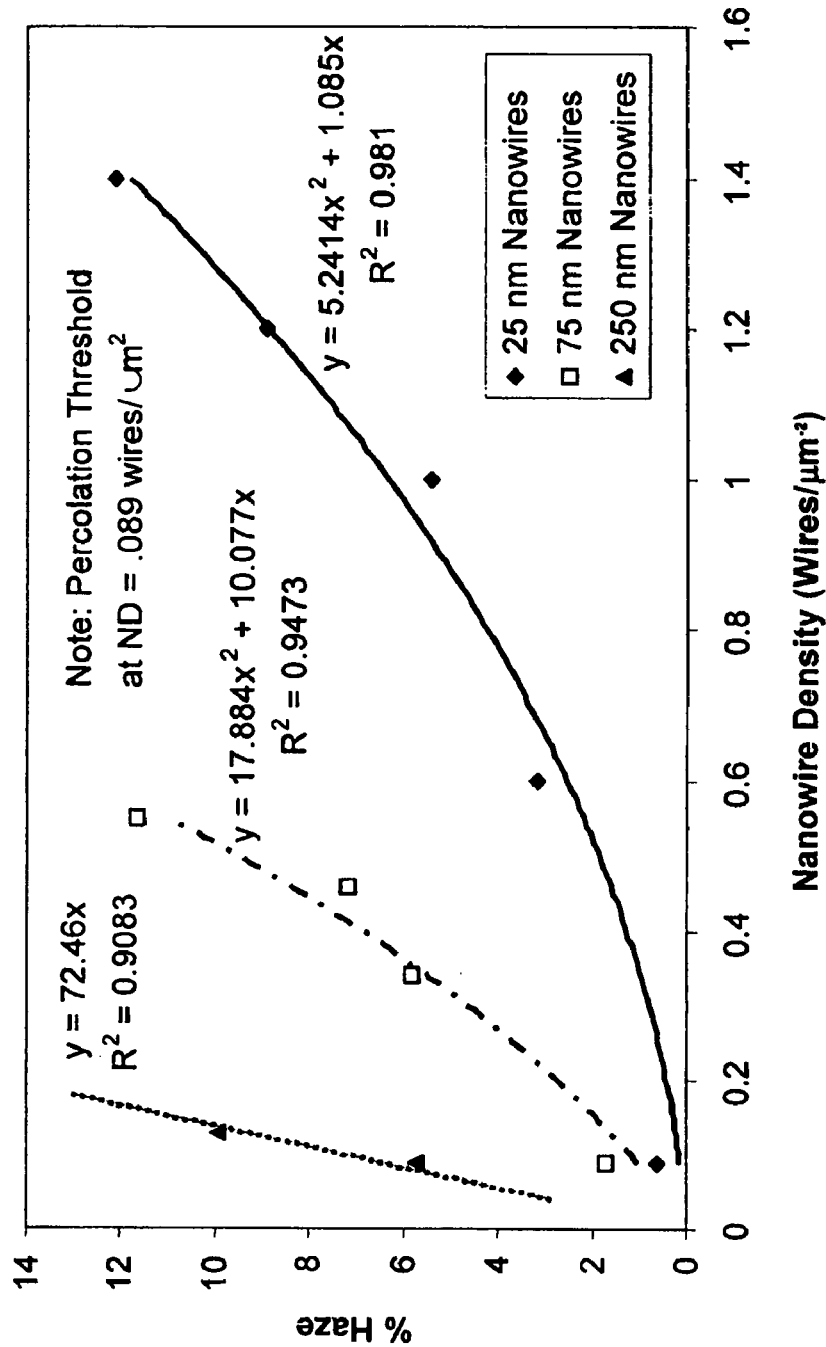
FIG. 3A is an exemplary % haze versus nanowire density plot according to one illustrated embodiment.
Figure 3B:
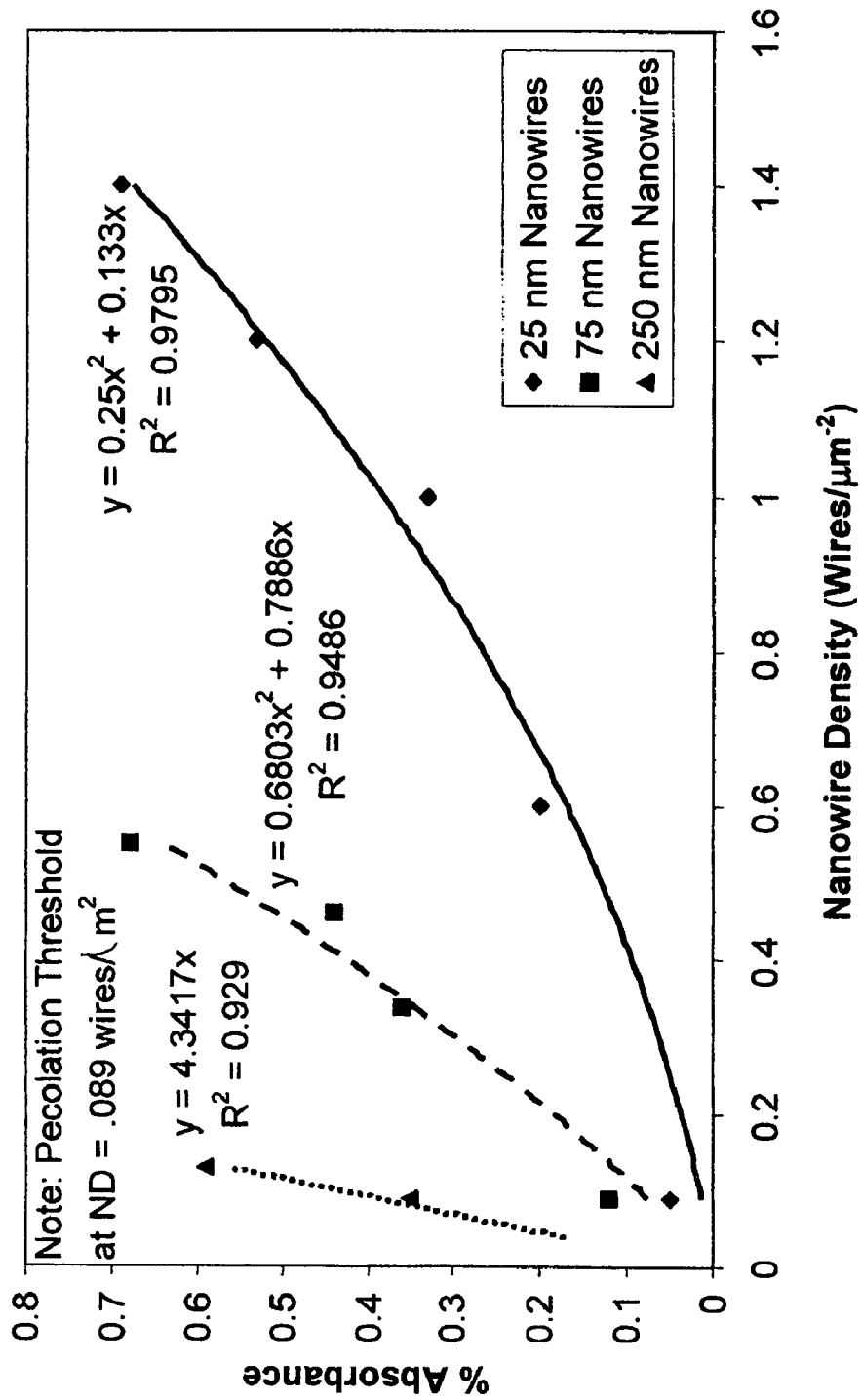
FIG. 3B is an exemplary % absorbance versus nanowire density plot according to one illustrated embodiment.
Figure 3C:
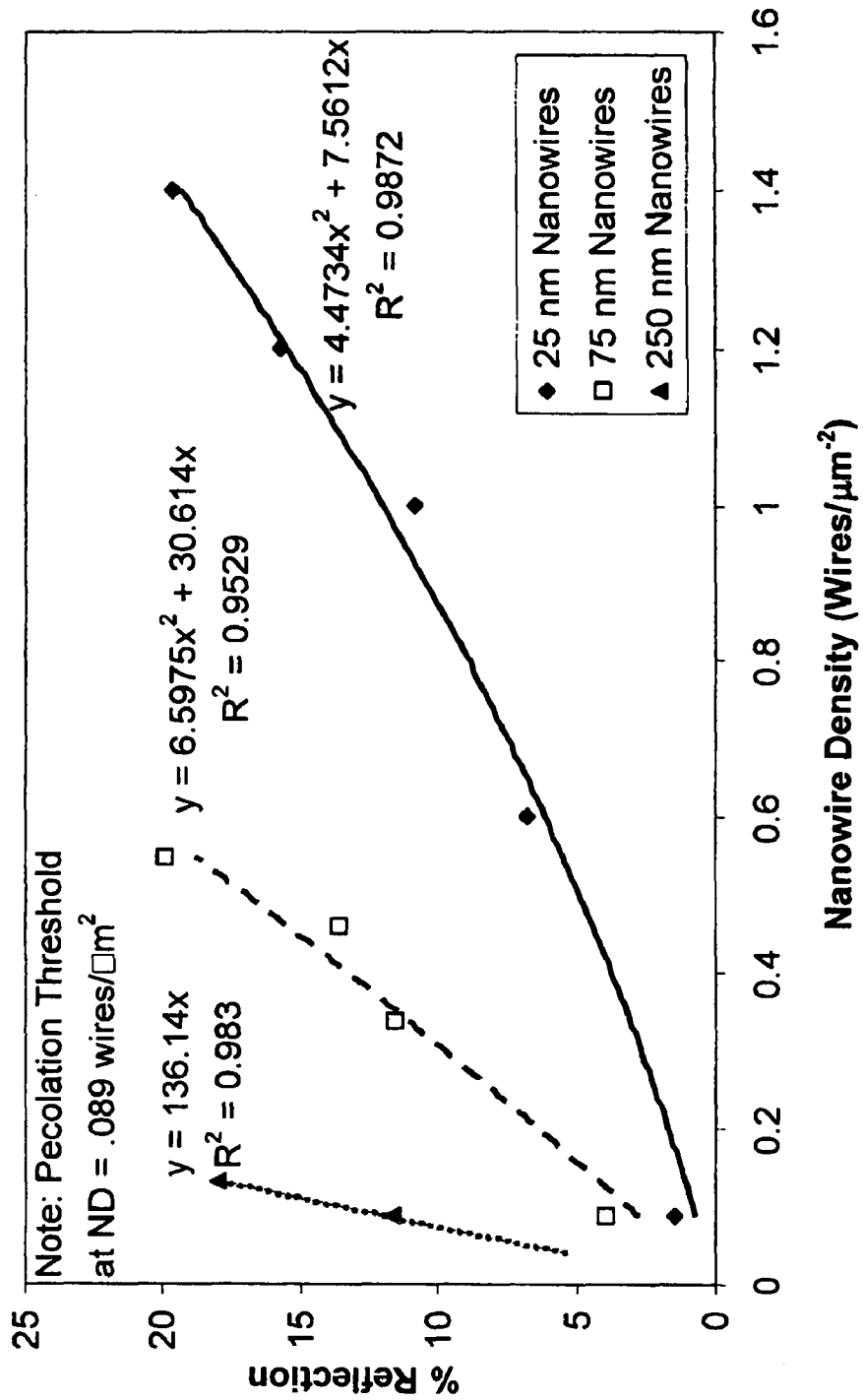
FIG. 3C is an exemplary % reflection versus nanowire density plot according to one illustrated embodiment.
Figure 3D:
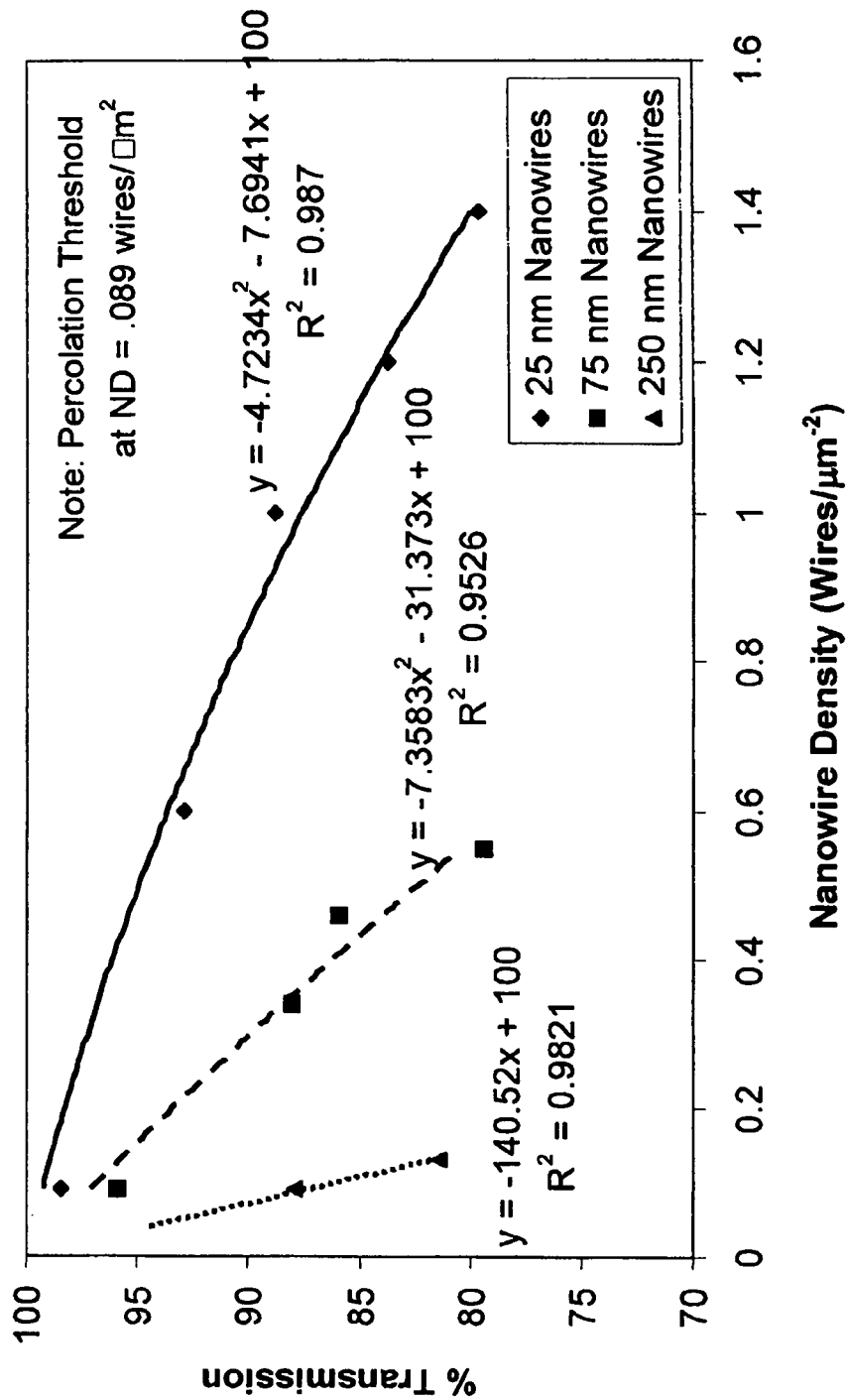
FIG. 3D is an exemplary % transmission versus nanowire density plot according to one illustrated embodiment.

FIG. 2 shows an exemplary plot of resistivity versus nanowire density (typically defined as the number of wires per unit area) for transparent conductors 12 made with nanowires 10 with a variety of geometries. As shown along the ordinate, the sheet resistivity (R$_s$) is scaled by the resistivity of a single nanowire ($R_{NW}$), while the nanowire density plotted along the abscissa is scaled by the square of the nanowire length. Typically, a thin-film conductor becomes less transmissive as the density of nanowires 10 increases. Applicants have found that it is possible to control the conductivity of the transparent conductor 12 over a broad range of values by depositing different numbers of nanowires 10 on the transparent conductor substrate. Note that below a certain nanowire density, however, a percolative network is not formed and there is no conductivity. This effect is illustrated on FIG. 2 by including a percolation density threshold line 16.

FIGS. 3A through 3D illustrate the theoretical dependence of nanowire density on transparent conductor optical properties including, respectively, haze, absorbance, reflection, and transmission for three different diameters of nanowires.

In some embodiments, the relationships illustrated in FIGS. 3A through 3D are used to design and/or manufacture a transparent conductor 12 for a given acceptance manufacturing criteria or specification. For example, if a specific haze, reflection, absorption, and/or transmission is desired in a resulting transparent conductor 12, an appropriate nanowire width (or diameter, and the like) and network density may be selected from the relationships illustrated in FIGS. 3A through 3D to yield a desired transparent conductor specification. Additionally, functional relationships between the diameter of nanowires and haze, absorbance, reflection, and transmission are provided in FIGS. 3A through 3D, respectively. In some embodiments, the functional relationship between the diameter of a nanowire and haze, absorbance, reflection, and transmission may also be used to design a transparent conductor 12 having a given haze, absorbance, reflection, and transmission.

Figure 4A:
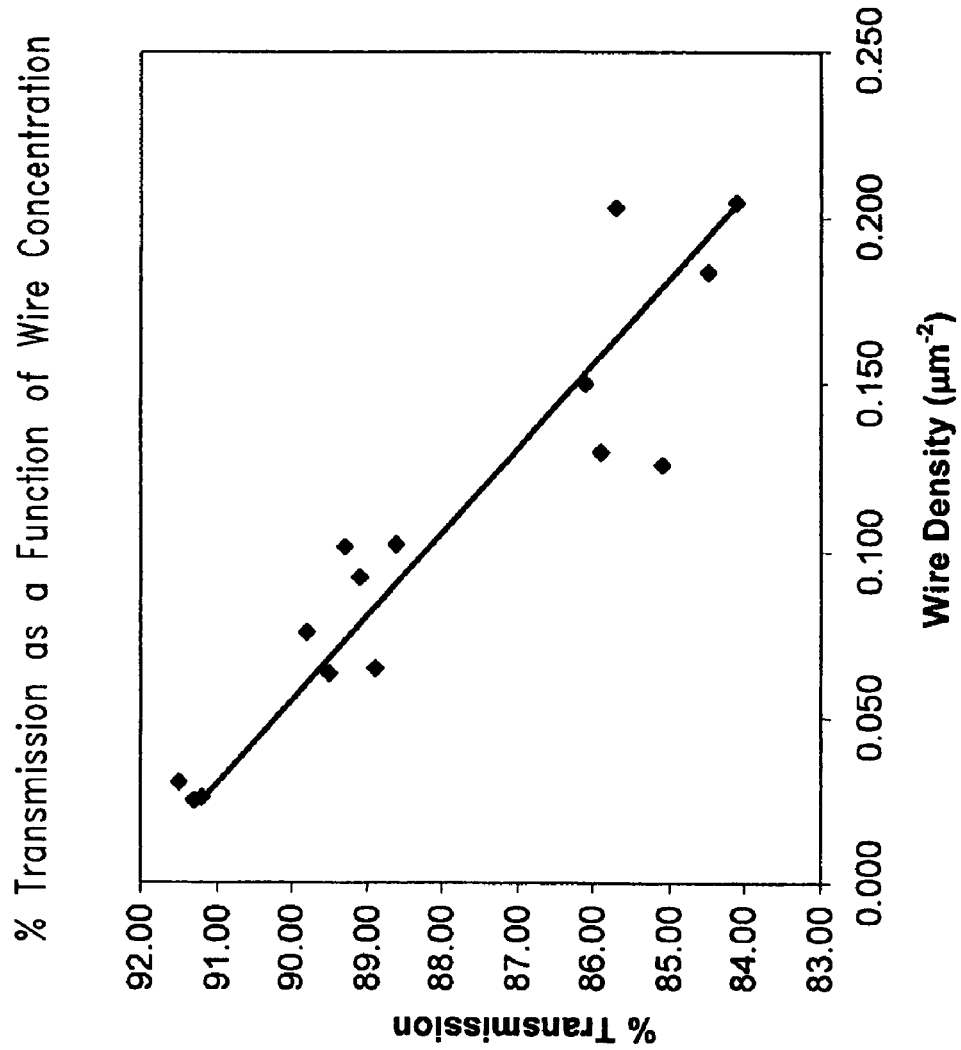
FIG. 4A is an exemplary % transmission versus nanowire density plot according to one illustrated embodiment.
Figure 4B:
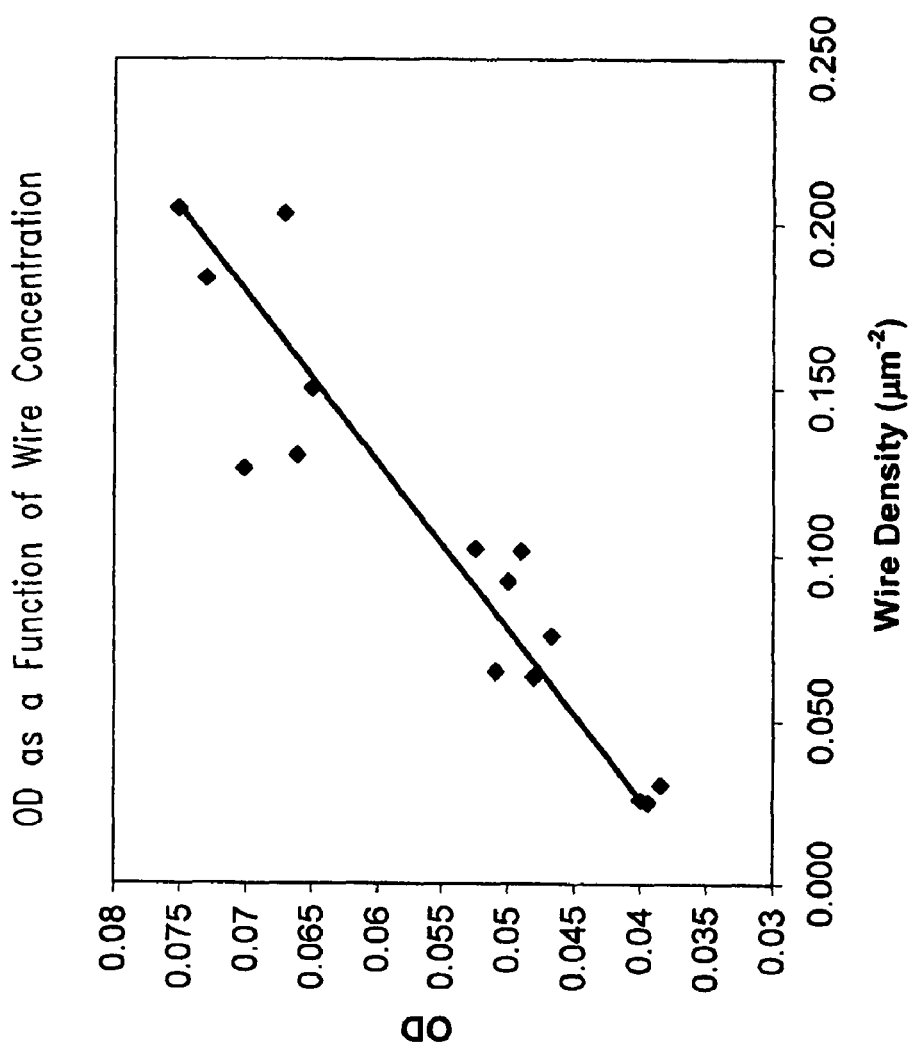
FIG. 4B is an exemplary optical density (OD) versus nanowire density plot according to one illustrated embodiment.
Figure 4C:
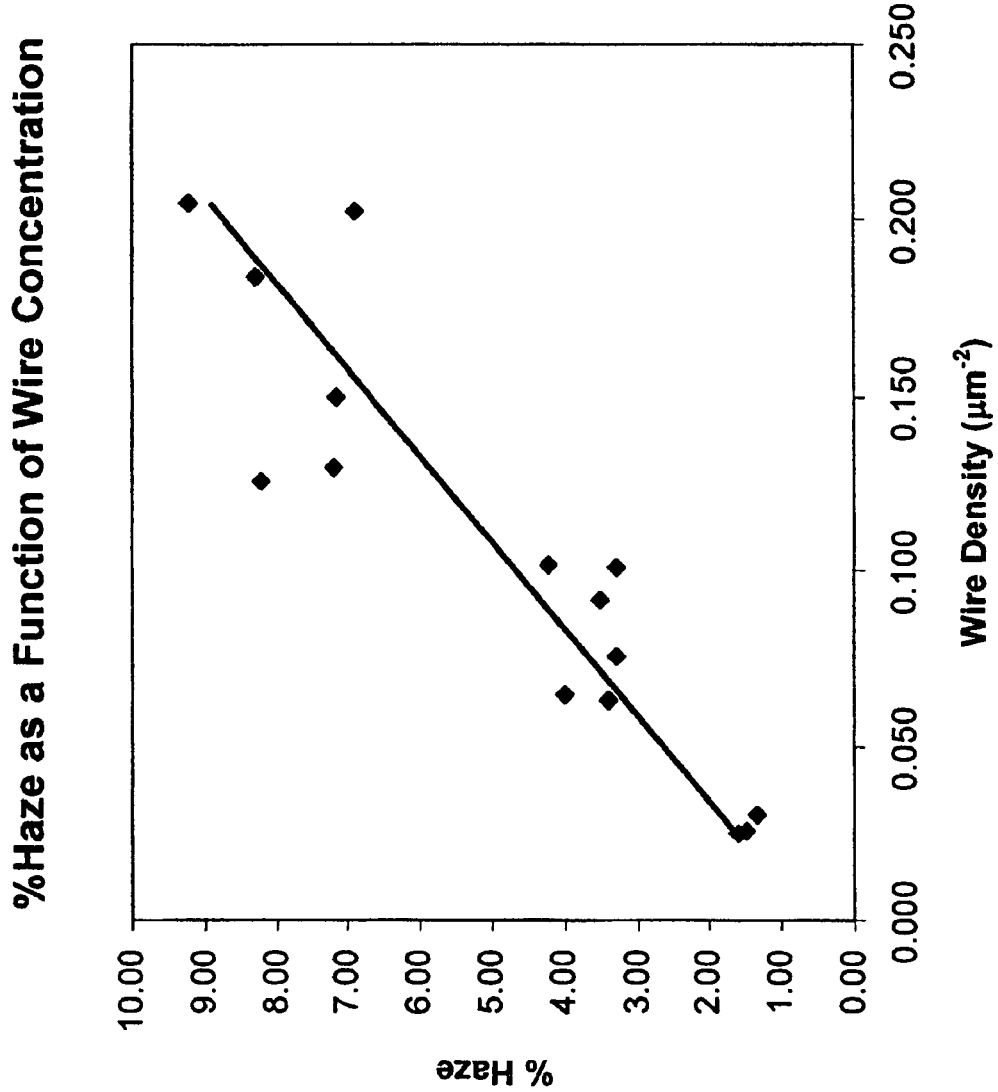
FIG. 4C is an exemplary % haze versus nanowire density plot according to one illustrated embodiment.

FIGS. 4A, 4B, and 4C show the dependence of, respectively, % transmission, optical density (OD), and % haze on nanowire density. The plots shown in FIGS. 4A, 4B, and 4C were generated using empirical measurements of transparent conductors 12 formed from metallic nanowires on a substrate. In some embodiments, the relationships illustrated in FIGS. 4A, 4B, and 4C may be used to design a transparent conductor 12 of a given transmission, optical density (OD), and/or haze.

Varying the geometry of the nanowires 10 may vary one or more of the optical and electrical properties of the resulting transparent conductors 12. For example, in some embodiments, networks of nanowires 10 of varying lengths and/or varying diameters can be used to manufacture and/or design a transparent conductor 12 having specific optical and electrical properties. In some embodiments, a nanowire length can be used to control the optical and electrical properties of the transparent conductor 12.

For example, a first sample (Sample 1) comprising a plurality of 10 μm long nanowires will have a resulting average of the square of the nanowire length ($<L^2>$) of 100 dm². A second sample (Sample 2) comprising a plurality of 20 μm long nanowires, but having the same diameter as that of Sample 1, will have a resulting $<L^2>$ of 400 μm² (a factor of four greater that Sample 1). Referring to equation 1, this comparison implies that the density of nanowires required to reach the percolation threshold is a factor of four less for Sample 2. Since the nanowires are twice as long, however, the amount of silver in the network for Sample 2 is one half that of Sample 1. Accordingly, provided that the nanowires all have the same diameter, Sample 2 will have about one half the conductivity of Sample 1.

There is, however, an added benefit for the decrease in conductivity. Because there is less silver in the film, there is much less scattering of light traveling through the film, resulting in an increased transmission level. Accordingly, in some embodiments, it is possible to control the conductivity and optical properties of the resulting transparent conductor 12 by controlling $<L^2>$ in the process of making nanowire batches.

Figure 5:
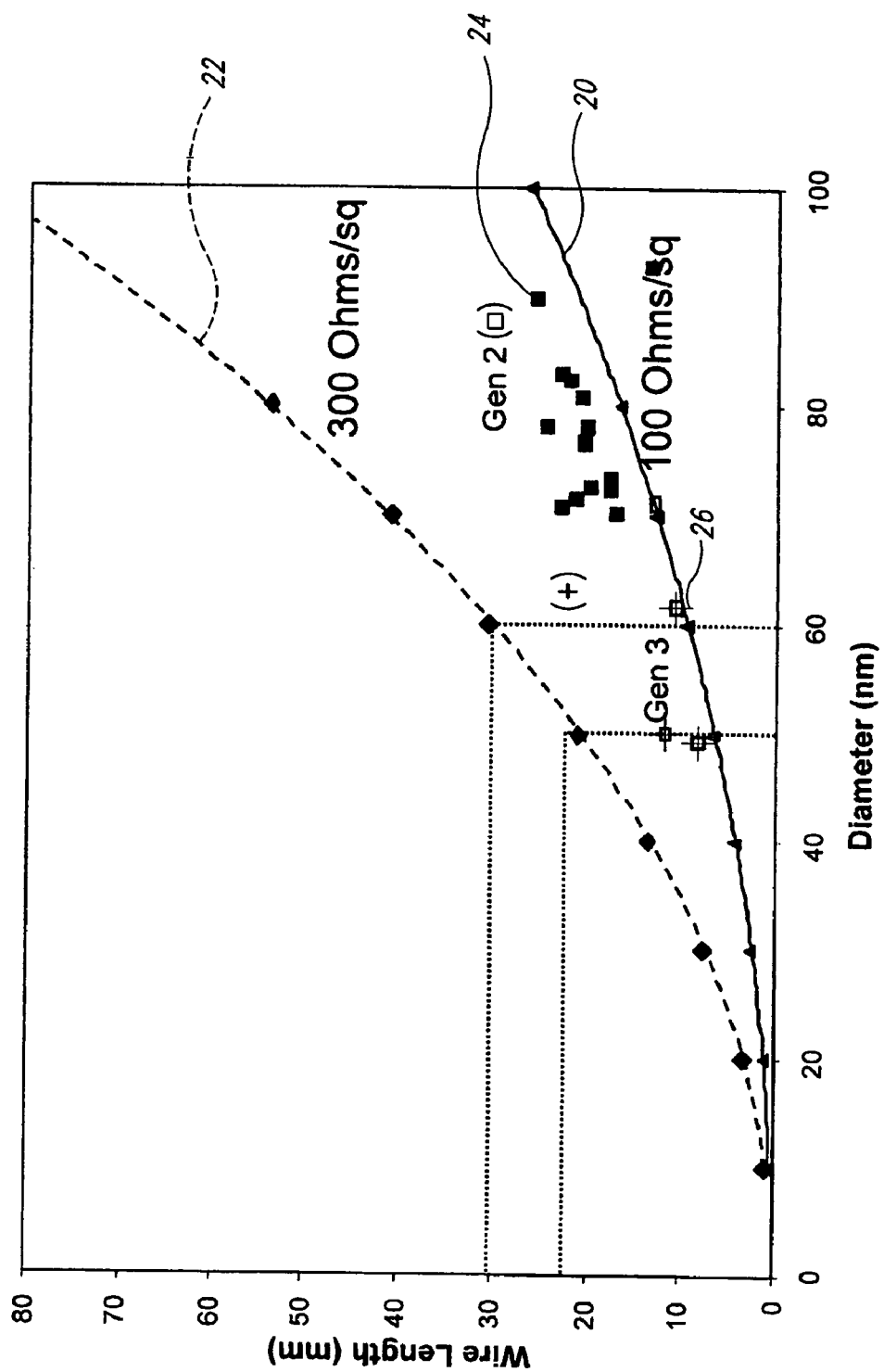
FIG. 5 is an exemplary nanowire length versus nanowire diameter plot for 100 Ohms/sq and 300 Ohms/sq transparent conductors according to one illustrated embodiment.
Figure 6A:
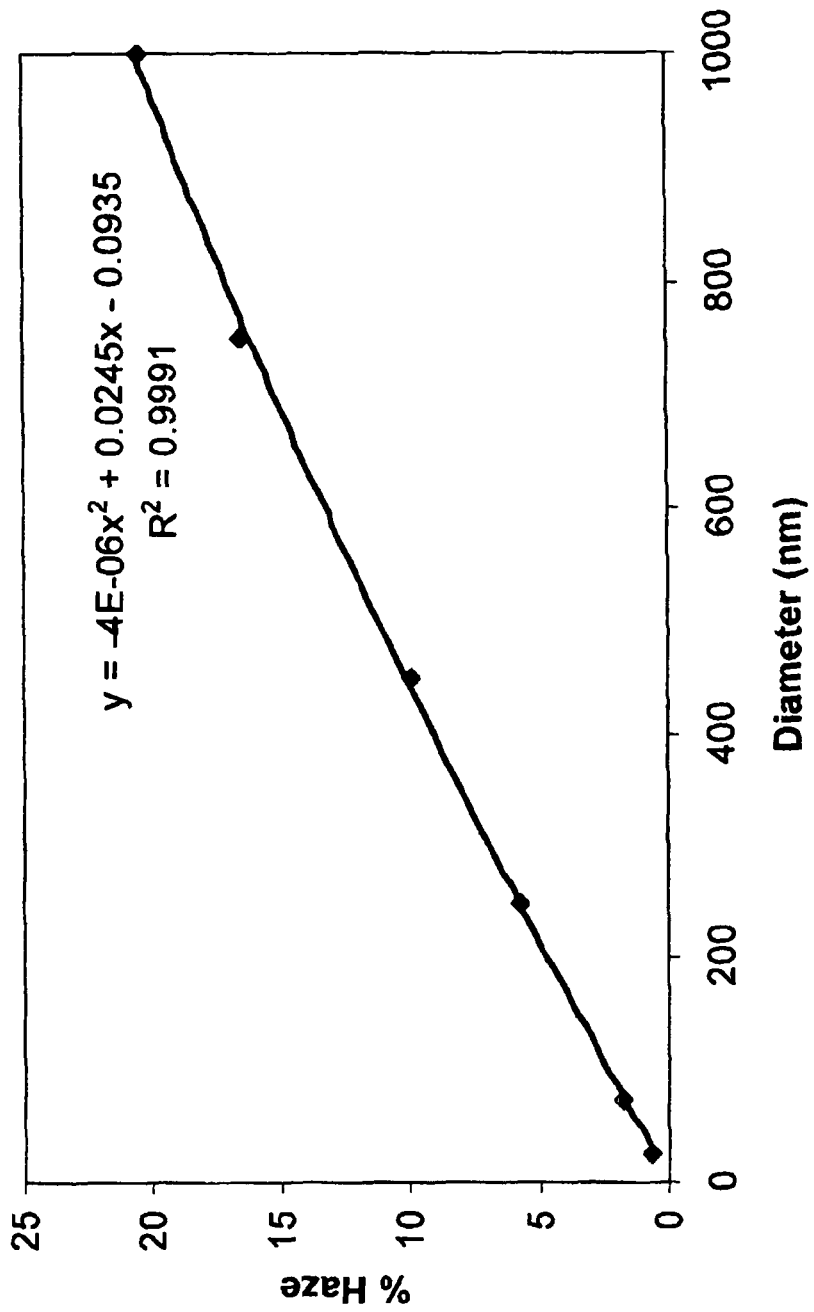
FIG. 6A is an exemplary % haze versus nanowire diameter plot according to one illustrated embodiment.
Figure 6B:
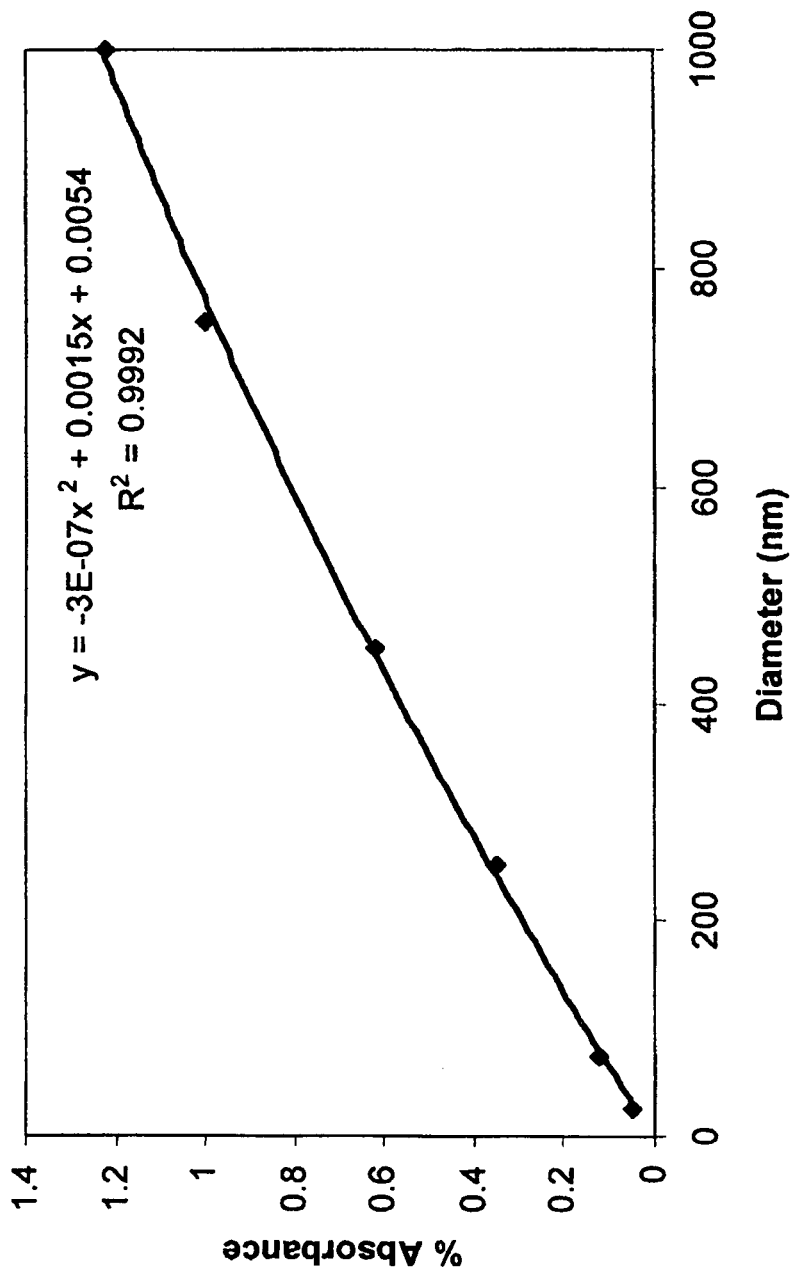
FIG. 6B is an exemplary % absorbance versus nanowire diameter plot according to one illustrated embodiment.
Figure 6C:
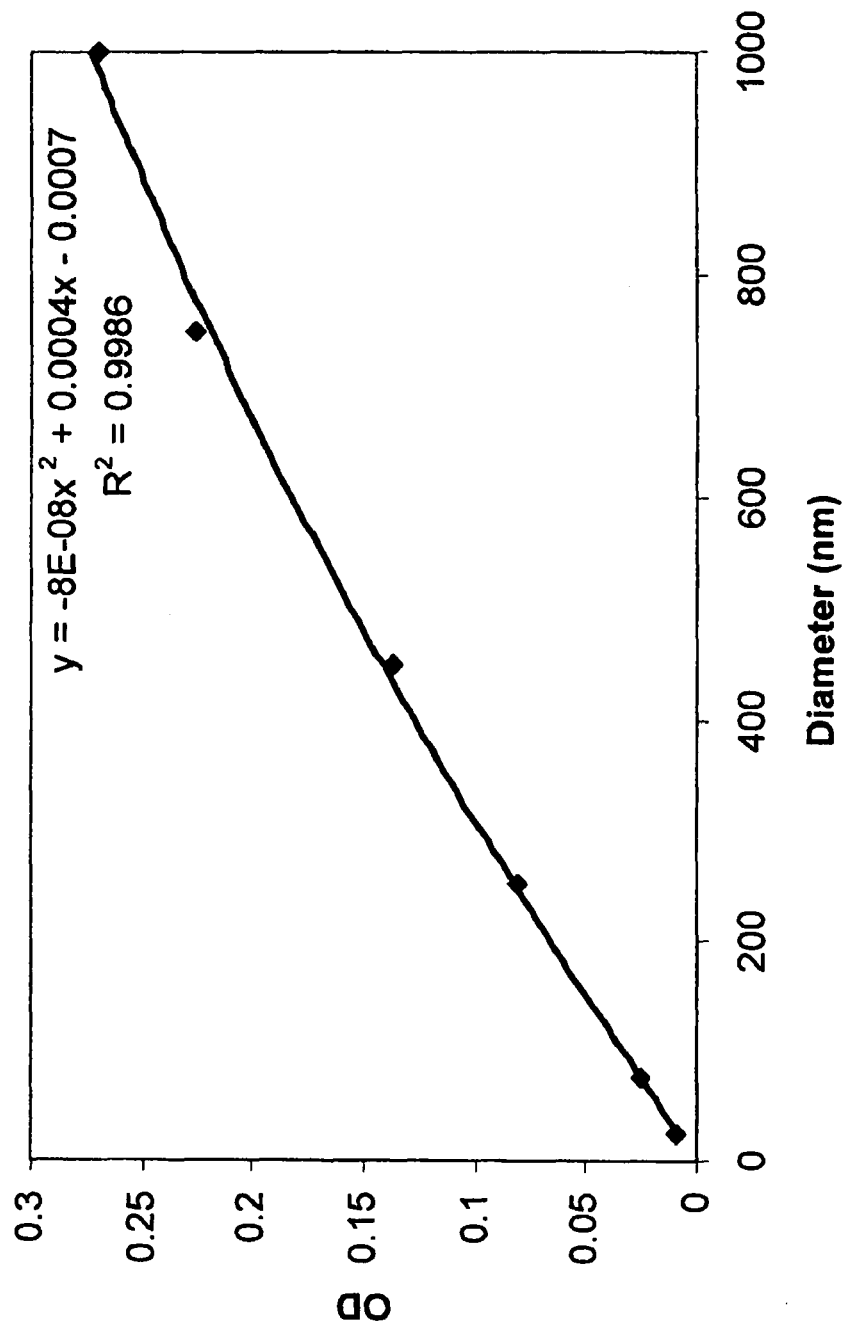
FIG. 6C is an exemplary optical density (OD) versus nanowire diameter plot according to one illustrated embodiment.
Figure 6D:
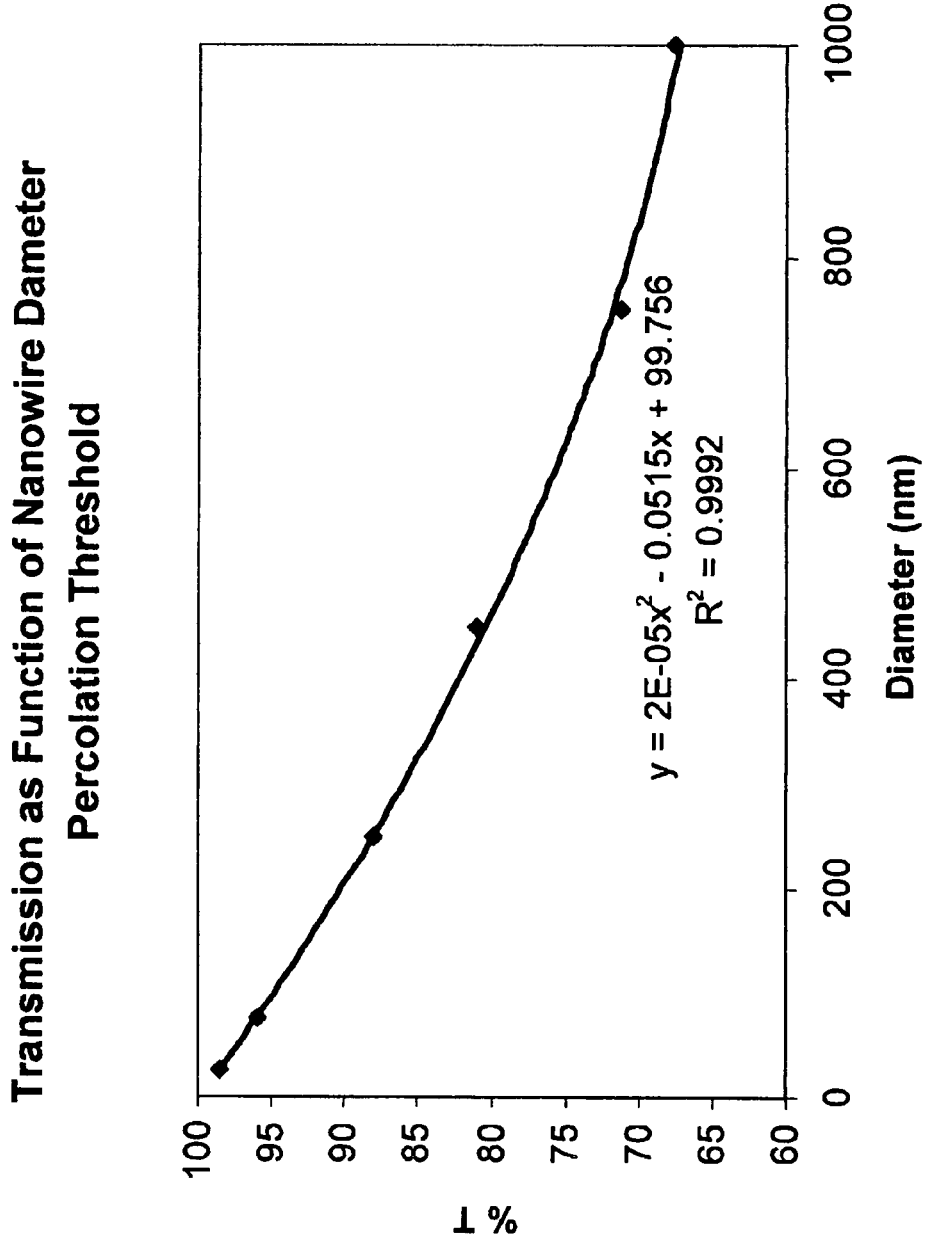
FIG. 6D is an exemplary % transmission versus nanowire diameter plot according to one illustrated embodiment.
Figure 6E:
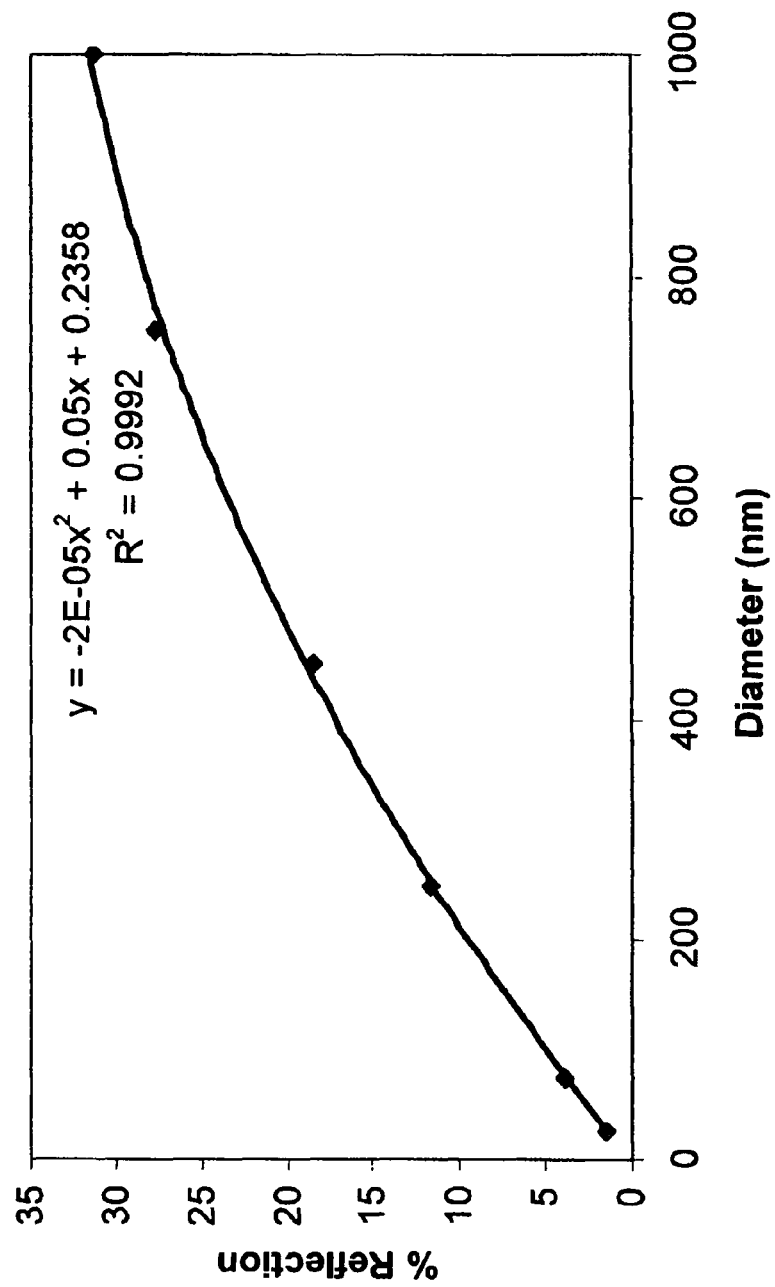
FIG. 6E is an exemplary % reflection versus nanowire diameter plot according to one illustrated embodiment.

FIG. 5 shows a theoretical dependence of nanowire diameter on nanowire length for transparent conductors 12 of different resistivities. For a given resistivity of a transparent conductor 12 (e.g., 100 Ohms/sq, 300 Ohms/sq, and the like) and a given nanowire diameter, the relationship depicted in FIG. 5 provides for a method to determine a nanowire length. In some embodiments, theoretical dependences of nanowire diameter and nanowire length for transparent conductors of different resistivities are generated and stored in memory in a reference data set.

FIG. 5 also includes empirical data 24, 26 for transparent conductors 12 having 100 Ohms/sq resistivity formed from nanowires 10 of the indicated lengths and diameter. In particular, "Gen 2" nanowires 24 varied from about 70 nm to about 90 nm in diameter and from about 10 nm to about 25 μm in length. "Gen 3" nanowires 24 varied from about 48 nm to about 72 nm in diameter and about 8 nm to about 12 μm in length. These empirical points may also be used to design transparent conductors 12 of given resistivities formed from nanowires 10 of given lengths and/or diameters.

In some embodiments, varying a nanowire diameter may vary the optical and electrical properties of the transparent conductor 12.

Generally, the current carrying capacity of a nanowire is proportional to its cross section, and thus to the square of its diameter. Accordingly, a way of increasing the conductivity of the nanowire networks is to increase the average diameter of the nanowires. Note, however, that because conductivity is inversely related to the optical properties of the nanowire 10, increasing the diameter of the nanowire 10 has the effect of scattering light more effectively, and thereby decreasing the transmission of the resulting films.

FIGS. 6A through 6E illustrate the theoretical dependence of transparent conductor properties including, respectively, haze, light absorbance, optical density (OD), transmission, and reflection on nanowire diameter, at the percolation threshold.

Designing and Manufacturing Nanowire-Based Transparent Conducting Networks

The relationships depicted in FIGS. 6A through 6E may be used to design a transparent conductor 12 of given haze, light absorbance, optical density (OD), transmission, or reflection. Additionally, a functional relationship between the diameter of a nanowire and haze, light absorbance, optical density (OD), transmission and reflection are provided in FIGS. 6A through 6E, respectively. These functional relationships may also be used to design a transparent conductor 12 having a given haze, light absorbance, optical density (OD), transmission, and/or reflection.

Varying the materials and/or compositions of the nanowires 10 may also vary the electrical and the optical properties of the resulting transparent conductor 12. In some embodiments, networks of nanowires 10 comprising specific alloy compositions can be used to manufacture and/or design a transparent conductor 12 having specific optical and electrical properties.

For example, by incorporating nanowires 10 made from different metals, or alloys thereof, it may be possible to vary the electrical and the optical properties of the resulting transparent conductors 12. Since different metals have different conductivities, the electrical properties of the films may scale directly with this conductivity. For instance, a sample made with silver nanowires (conductivity=$6.2 \times 10^6$ Scm$^{-1}$) will have a conductivity that is four times greater than a sample made using similarly sized nickel nanowires (conductivity=1.4×10⁶ Scm⁻¹). Note, however, that the optical scattering properties of nickel and silver will differ slightly. Also note that in those embodiments where the nanowires 10 cover only a small fraction of the transparent conductor 12, the optical properties will not be affected dramatically.

In some embodiments, the transparent conductors 12 created using random networks of nanowires 10 may result in transparent conductors 12 with higher conductivities than those made by other processes. Accordingly, it is important to develop ways to limit the conductivity of these networks. An exemplary method for limiting the conductivity of these networks is to create networks of alloyed nanowires.

TABLE 1

Binary Silver Alloys

| Name | Composition | Annealed Hardness | Elec. Cond. % IACS |
|---|---|---|---|
| Fine Silver | 99.9 Ag | 30 HR 15T | 104 |
| Sterling Silver | 92.5 Ag 7.5 Cu | 65 HR 15T | 88 |
| Coin Silver | 90 Ag 10 Cu | 70 HR 15T | 85 |
|  | 72 Ag 28 Cu | 79 HR 15T | 84 |
|  | 97 Ag 3 Pt | 45 HR 15T | 45 |
|  | 97 Ag 3 Pd | 45 HR 15T | 58 |
|  | 90 Ag 10 Pd | 63 HR 15T | 27 |
|  | 40 Ag 60 Pd | 65 HR 15T | 8 |
|  | 90 Ag 10 Au | 57 HR 15T | 40 |
|  | 25 Ag 75 Au | 50 HR 15T | 17 |

Referring to Table 1, alloying silver with other materials such as, for example, copper, palladium, gold, and the like, provides a method for lowering the conductivity of the resulting nanowire networks. In some embodiments, this may result in a nanowire made from a composite material having a conductivity more than an order of magnitude lower than that of a nanowire made from, for example, silver. In some embodiments, the methods and techniques used to make silver nanowires may also be use to make nanowires of, for example, palladium and/or alloys of palladium (e.g., palladium-silver alloys, and the like).

Other exemplary ways to increase the resistance of the nanowire network and/or transparent conductors 12 include using nanowires 10 of a less conductive material, limiting the inter-nanowire connectivity by using additives in a nanowire ink (ink used to print the nanowire networks), selectively removing a fraction of the material present on the surface, lowering the concentration of conductive nanowires, and the like.

Varying the synthetic and/or manufacturing processes used to form the nanowires 10 may also vary the electrical and optical properties of the resulting transparent conductors 12. In some embodiments, networks of nanowires 10 that are etched can be used to manufacture and/or design transparent conductors 12 having specific optical and electrical properties.

For example, the transparency, haze, and/or resistivity of transparent conductor 12 made from silver nanowires are related to the aspect ratio of the silver nanowires. Accordingly, varying the aspect ratio of the nanowires may also vary the electrical and optical properties of the resulting transparent conductor 12. Given nanowires of similar lengths but varying thinness, the thinner nanowires will possess a higher transparency, a lower haze, and a higher resistivity. In some embodiments, varying the etching power and/or etching time may vary the aspect ratio of the resulting nanowires 10.

One exemplary method for altering the aspect ratio of a nanowire 10 is by etching. The etching process typically results in shorter and thinner nanowires. For example, as shown in FIGS. 7A and 7B, a nanowire 10a with an aspect ratio of approximately 100 (e.g., having a length 30 of approximately 20 μm, and a diameter 32 of approximately 0.2 μm) may be etched 0.05 μm in each direction, resulting in a nanowire 10b having an aspect ratio of 190 (e.g., having a length 34 of approximately 19 μm, and a diameter 36 of approximately 0.1 μm). Etching silver nanowires, for example, generally involves two main components: an oxidizing reagent (e.g., nitrate, nitrite, potassium permanganate, hydrogen peroxide, oxygen, and the like), and a compatible counter ion (e.g., a nitrate ion, a metal chelating reagent including, for example, SCN⁻ or CN⁻ ions, and the like) that will not form an insoluble silver compound.

Etching may take place while the silver nanowires are in solution or coated on a transparent conductor 12. In some embodiments, the etching solution comprises a 25% HNO₃ solution. For HNO₃ based etching, silver is oxidized to silver ion while HNO₃ is reduced to HNO₂ (as shown in equation 2 below).

$$Ag+n/2HNO_3+nH^+=Ag^++n/2HNO_2+n/2H_2O \quad (eq.\ 2)$$

Example 1

HNO₃ Etching

Figure 8B:
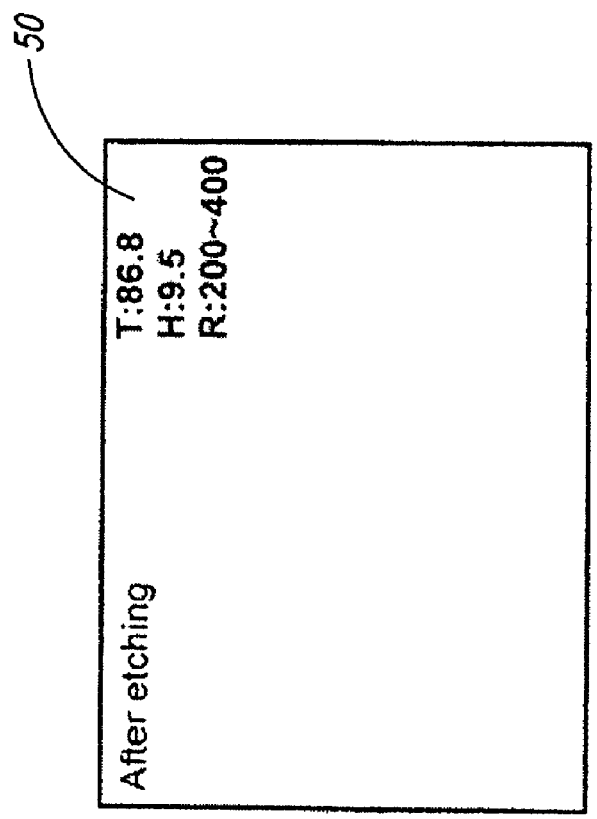
FIGS. 8A and 8B are SEM (scanning electron microscope) images of PET (polyethylene terephthalate) films coated with silver nanowires, before and after etching, according to multiple illustrated embodiments.
Figure 8A:
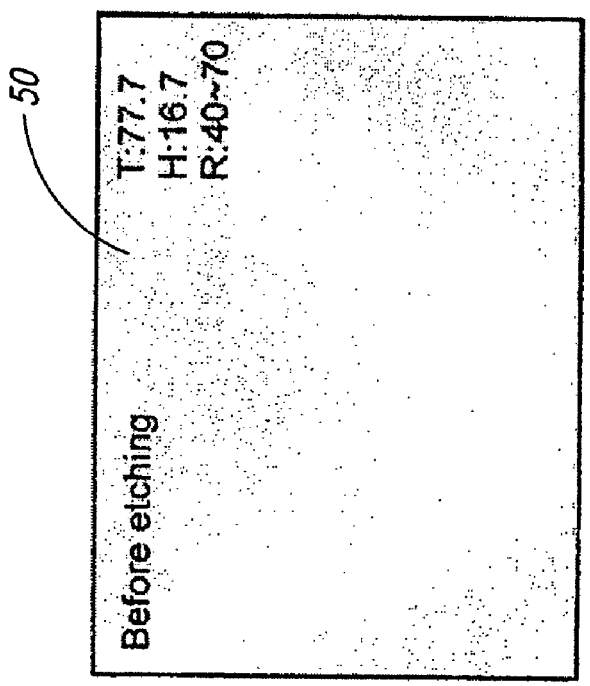

FIGS. 8A and 8B show SEM images of PET films 50 coated with silver nanowires 10 before and after etching in 25% HNO₃. Referring to FIG. 8A, prior to etching, the film 50 exhibited a transparency of 77.7%, a haze of 16.7%, and a resistivity of approximately 40-70 Ohms/sq. Referring to FIG. 8B, after etching for 30 seconds, the film 50 exhibited an increased transparency of 86.8%, a decreased haze of 9.5%, and an increased resistivity of approximately 200-400 Ohms/sq.

In some embodiments, varying the concentration of HNO₃ may vary etching strength. For example, exposing PET films coated with silver nanowires to a 40% HNO₃ solution for 1 second resulted in the etching of a substantial portion of the nanowires. Due to the autocatalytic etching nature of the HNO₃ mechanism, however, a more stable controllable etching solution may alternatively be used.

Example 2

NaNO₃/HNO₃/KMnO₄ Etching

PET films coated with silver nanowires were etched with a solution comprising 5% NaNO₃, 5% HNO₃, and 0.004% KMnO₄. Table 2 shows the transparency, haze, and resistivity of the PET films before and after etching for varying time periods.

TABLE 2

Before and After Etching Results

| | T (%) | H (%) | R (Ohms/sq) |
|---|---|---|---|
| Before Etching | ~79 | ~16.2 | 40~134 |
| After 30 s | ~82.1 | ~12.6 | 60.9~90 |
| After 60 s | ~82.9 | ~11.1 | 131~140 |
| After 120 s | ~82.7 | ~9.91 | 295~310 |
| After 240 s | ~86.7 | ~7.7 | 0 |

In some further embodiments, etching may also be used to release nanowires synthesized using alumina templated synthesis techniques, template-directed synthesis techniques, and the like. Nanowires under these conditions are typically difficult to separate because the nanowires tend to stick onto the back of the supporting materials (e.g., platinum). Etching may provide a process for thinning the individual nanowires, as well as increasing the distance between the nanowires.

Some embodiments employ an in-line etching process that is compatible with roll-to-roll web processing of plastic film, as well as coating lines designed for glass substrates used in, for example, touch screens and flat panel displays. It is envisioned that a film, a transparent conductor substrate, and the like could be pulled through an etching solution that would provide the necessary etching to the nanowires to satisfy a particular set of specifications. In some embodiments, wet or dry chemical etching methods could be used.

For example, a silver etching process may form part of, or be included in, the nanowire manufacturing process. Nanowires made via, for example, the polyol process may be made to a fixed aspect ratio using a single manufacturing process. See e.g. Y. Sun, B. Gates, B. Mayers, & Y. Xia, "Crystalline silver nanowires by soft solution processing", *Nanoletters*, (2002), 2(2) 165-168. A modified polyol method, described in U.S. Provisional Application No. 60/815,627 (incorporated by reference herein in its entirety) in the name of Cambrios Technologies Corporation, produces more uniform silver nanowires at higher yields than does the conventional "polyol" method.

After various processing steps (e.g., solvent exchange, purification, and the like), the nanowires may then be etched in a batch or continuous process using, for example, one of the methods and/or techniques previously described, as well as techniques known in the relevant art.

Using the described techniques, as well as techniques well known in the relevant art, it may be possible to manufacture nanowires 10 having a wide variety of aspect ratios, each tailored for a specific application with a particular set of requirements for haze, transmission, and resistivity. For example, the etching reaction could be quenched at a particular point in time when the desired aspect ratio is achieved. The quenching (or termination of the etch reaction) may be precipitated by a variety of mechanisms including, for example, a reduction in temperature for temperature sensitive etch reactions, exchange of the etching solution with a non-etching solution, or the addition of a chemical species in excess concentration that renders the etching solution inactive. For example, addition of NaOH to the etching solution of 25% $HNO_3$ substantially terminates the etching process once a desired aspect ratio is achieved.

Varying the oxidation of the nanowires 10 may also vary the electrical and optical properties of the resulting transparent conductor 12. In some embodiments, networks of nanowires 10 that are controllably oxidized can be used to manufacture and/or design a transparent conductor 12 having specific optical and electrical properties.

Transparent conductor nanowire networks used in, for example, touch screens generally have a resistivity of about 300 Ohms/sq to about 500 Ohms/sq. In some instances (depending on the specifics of the nanowire diameter, length, and the like) the resistivity of nanowire networks near the percolation threshold may be too low to be compatible with standard touch screen electronics. In some embodiments, low resistivity may be addressed by tailoring the nanowire geometry (length (L), diameter (D), width, and the like) to raise the resistivity of the network near the percolation threshold. In some embodiments, the resistivity meets or exceeds the percolation threshold.

One method of altering the resistivity of the resulting transparent conductors, as well imparting further unique benefits, involves the controlled oxidation of, for example, a silver nanowire network. Silver metal will generally oxidize spontaneously upon exposure to free oxygen. This process is commonly referred to as "tarnishing." Silver metal is a grayish white color, while silver oxide is a black color.

The chemical reaction and related thermodynamic constants describing the oxidation process are shown in equation 3 and Table 3.

$$4Ag_{(s)} + O_{2(g)} \rightarrow 2Ag_2O_{(s)} \quad \text{(eq. 3)}$$

TABLE 3

| Thermodynamic Constants of Compounds of Interest | | | |
|---|---|---|---|
| Compound | $\Delta H^0_f$ (kJ/mol) | $\Delta G^0_f$ (kJ/mol) | $S^0$ (J/mol*K) |
| $Ag_{(s)}$ | 0 | 0 | 42.6 |
| $O_{2(g)}$ | 0 | 0 | 205.2 |
| $Ag_2O_{(s)}$ | −31.1 | −11.2 | 121.3 |

Silver is oxidized spontaneously in air at a very slow rate. A variety of chemical methods, both wet and dry, are available for accelerating the oxidation process of silver, including, for example, oxidation through strong oxidizing agents in solution, electrochemical oxidation, oxidation by heating in an oxygen atmosphere, oxidation using oxygen plasma, and the like. Further examples for oxidation of silver include corona or UV ozone treatment techniques. In some embodiments, one or more methods for oxidizing the nanowires 10 may be used in conjunction with a high-speed roll-to-roll process in which the silver nanowire film is created and then oxidized by a wet or dry chemical process in a controlled way to achieve the desired product specifications.

In some embodiments, a method to control the oxidation process, and indirectly the electrical and optical properties of the conducting nanowire networks, includes controlling the $O_2$ plasma oxidation of nanowire films by controlling the power, flow, and residence time of the nanowires in the $O_2$ plasma.

Higher power and a longer residence time may generally result in nanowire networks with a higher degree of oxidation and higher resistivity. Lower power and shorter residence time may generally result in nanowire networks with a lower degree of oxidation and lower resistivity (although still elevated relative to the initial resistance of the film).

In addition to affecting the electrical properties of the nanowire network (e.g., resistivity), oxidation of the nanowire networks under certain conditions may also affect the optical properties of resulting transparent conductors 12. For example, oxidation of a silver nanowire network may yield transparent conductors 12 having a lower (or higher) haze and a higher (or lower) transmission.

Example 3

Oxygen Plasma Oxidation of Nanowires

In some embodiments, oxygen plasma techniques can be used to alter the optical and electrical properties of transparent conductors 12. As illustrated by the following example, oxygen plasma was used to alter the properties of a transparent film of silver nanowire on glass. Samples 1-3 comprised fluoroalkylsilanes (FAS) on glass (0.1% HPMC, 200 ppm Triton-X100, 2× nanowires).

The film is first treated with Argon plasma to render the network conductive, followed by $O_2$ plasma to alter the resistivity, haze, and transmission.

TABLE 4

Resistivities

| | Resistivity | | |
|---|---|---|---|
| | Pre Ar Plasma | Post Ar Plasma | Post $O_2$ Plasma |
| Sample 1 | 50-1000 Ohms/Sq | 25-50 Ohms/Sq | Nonconductive |
| Sample 2 | 50-1000 Ohms/Sq | 25-50 Ohms/Sq | 100-200 Ohms/sq |
| Sample 3 | 50-1000 Ohms/Sq | 25-50 Ohms/Sq | 250-1000 Ohms/sq |

TABLE 5

Plasma Conditions

| | $O_2$ Plasma Conditions | | | |
|---|---|---|---|---|
| | Power | Duration | Flow | Pressure |
| Sample 1 | 50 W | 15 s | 25% | 100 mTorr BP |
| Sample 2 | 10 W | 5 s | 25% | 100 mTorr BP |
| Sample 3 | 10 W | 10 s | 25% | 100 mTorr BP |

As summarized in Tables 4 and 5, the resistivity of Sample 1 was altered from an initial value of about 20-50 Ohms/sq to a resulting nonconductive state (50 W, 15 s), the resistivity of Sample 2 was altered from an initial value of about 20-50 Ohms/sq to a resulting value of about 100-200 Ohms/sq (10 W, 5 s), and the resistivity of Sample 3 was altered from an initial value of about 20-50 Ohms/sq to a resulting value about 250-1000 Ohms/sq (10 W, 10 s). No visible differences were detected between samples treated with $O_2$ using dark field microscopy, SEM.

TABLE 6

Optical Properties

| | % Transmission | | % Haze | |
|---|---|---|---|---|
| | Post Ar Plasma | Post $O_2$ Plasma | Post Ar Plasma | Post $O_2$ Plasma |
| Sample 1 | — | — | — | — |
| Sample 2 | 80.4 | 81.3 | 9.1 | 7.5 |
| Sample 3 | 76.3 | 78.5 | 11.8 | 6.98 |

As summarized in Table 6, the exposure of Samples 2 and 3 to $O_2$ plasma also resulted in a reduction in haze and an increased transmission. In some embodiments, the electrical and optical properties of the transparent conductor may be further tailored by varying the residence time and power of the $O_2$ plasma. For example, a higher power coupled with longer residence times may result in highly oxidized films that exhibit haze increases and transmission decreases.

Further examples for varying the oxidation of nanowires include wet oxidizing methods. Wet oxidizing methods generally involve solution oxidation by some strong oxidizing reagents such as $KMnO_4$, $H_2O_2$, and the like. Applicants have found that silver can be oxidized to a dark silver oxide in 50 ppm $KMnO_4$ after an exposure of only 5 seconds. Various degrees of oxidation can be achieved by varying time and/or concentration of oxidizing reagents, or by adding external electricity through electrochemical oxidation. Applicants note that an additional benefit of the oxidation process is a reduced "milky" appearance of the resulting transparent conductor film. Accordingly, it is expected that oxidized films may exhibit a smaller amount of reflected haze.

Figure 9A:
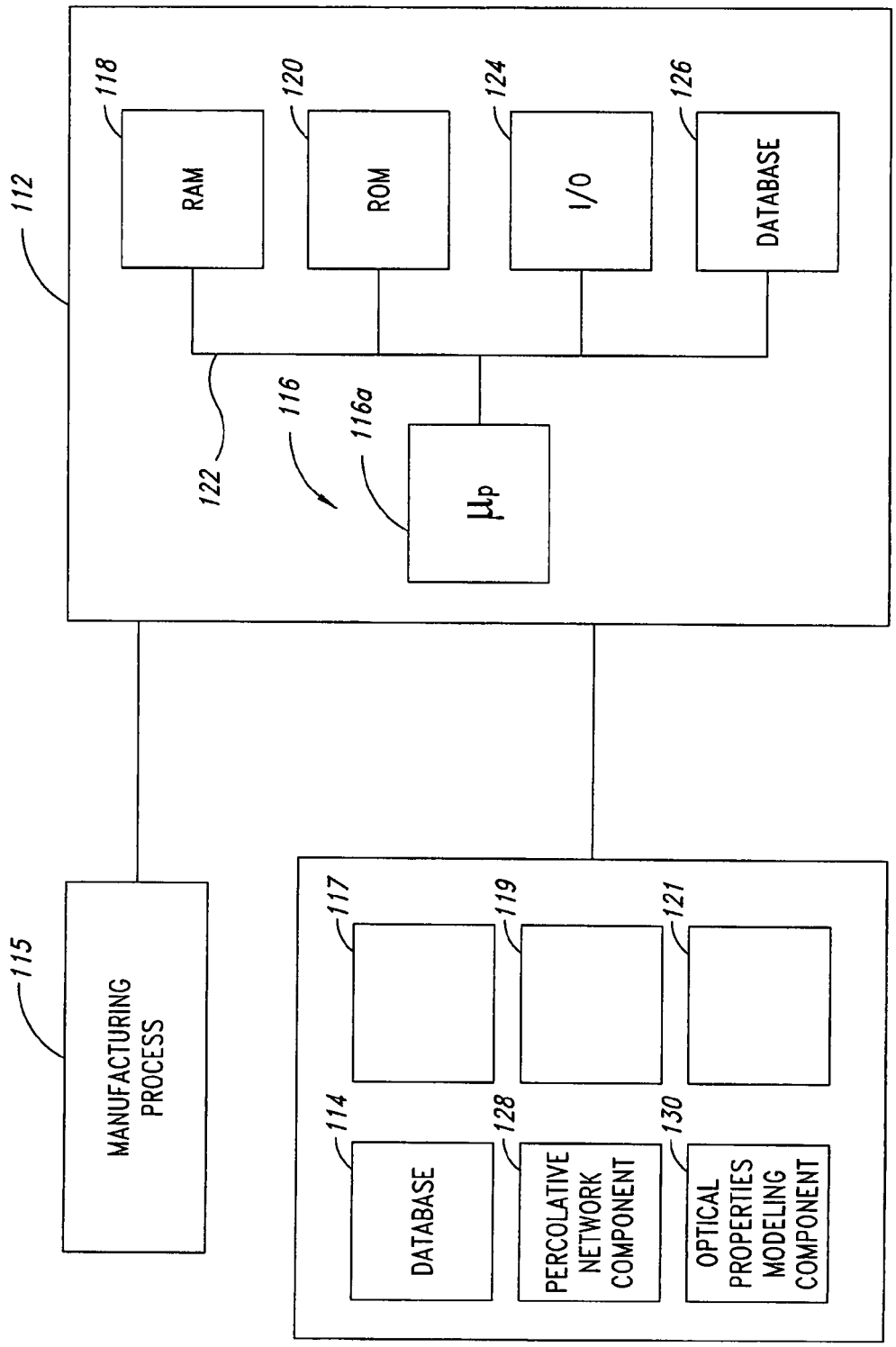
FIG. 9A is a functional block diagram of a system for evaluating optical and electrical manufacturing criteria for a transparent conductor according to one illustrated embodiment.

Systems for Evaluating Optical and Electrical Properties of Transparent Conductor and/or Controlling Fabrication of Transparent Conductor FIG. 9A shows an exemplary system 100 for evaluating optical and electrical manufacturing criteria for a transparent conductor 12. The system 100 includes a controller subsystem 112.

The controller subsystem 112 may include one or more processors 116 such as a microprocessor 116a, a digital signal processor (DSP), an application-specific integrated circuit (ASIC), a central processing unit (CPU), a field programmable gate array (FPGA), and the like. The controller subsystem 112 may also include one or more memories, for example random access memory (RAM) 118, read-only memory (ROM) 120, and the like, coupled to the processors 116 by one or more buses 122. The controller subsystem 112 may further include one or more input devices 124 (e.g., a display, a touch-screen display, a keyboard, and the like). While illustrated as having a single bus 122, the control subsystem 100 may include more than one bus 122. For example, separate buses may be provided for power, control, and data comparison and/or collection.

The control subsystem 112 may further include logic 115a for controlling the process of fabricating a transparent conductor 12. For example, the control subsystem 112 may include logic for automatically controlling, during the process of fabricating the transparent conductor film, a physical characteristic of the nanowires of the transparent conductor film based on the manufacturing specification.

The control subsystem 112 may also include logic for processing signals from the system 100 for evaluating optical and electrical manufacturing criteria for a transparent conductor 12. In some embodiments, the control subsystem 112 is configured to compare input acceptance manufacturing criteria for a transparent conductor 12 to stored reference transparent conductor data, and to generate a response based on the comparison. The input acceptance manufacturing criteria may include, for example, at least one of a sheet resistance ($R_s$) level, an optical density (OD) level, a transmission level, or a haze level.

The system 100 may further include a database 114 comprising, for example, stored reference transparent conductor data. The stored reference transparent conductor data may include, for example, data correlating a nanowire length, a nanowire diameter, a nanowire density, a nanowire concentration to electrical or optical properties of a transparent conductor film, and the like, or combinations thereof. In some embodiments, the stored reference transparent conductor data comprises characteristic sheet resistance ($R_s$) data 117, characteristic optical density (OD) data 119, and characteristic transmission haze data 121, or combinations thereof. In some embodiments, the stored reference transparent conductor data comprises empirical sheet resistance ($R_s$) data, empirical optical density (OD) data, and empirical transmission or haze data, or combinations thereof. In some further embodiments, the stored reference transparent conductor data comprises nanowire density versus sheet resistance ($R_s$) over nanowire resistance ($R_{NW}$) data; nanowire length (L) versus nanowire diameter (D), for a given sheet resistance ($R_s$) data; nanowire length (L) over nanowire diameter square ($D^2$) versus sheet resistance ($R_s$) data; percent haze versus nanowire density times nanowire cross-sectional area data; optical density versus nanowire density times nanowire cross-sectional area data; or combinations thereof.

The system 100 may further include a percolative network component 128. In some embodiments, the percolative network component 128 is configured to model the electrical conductivity of a percolative network of nanowires, and to automatically generate nanowire networks based on the results of the model.

The system 100 may further include an optical properties modeling component 130. In some embodiments, the optical properties modeling component 130 is configured to evaluate the optical properties of a transparent conductor 12 including a plurality of nanowires. In some embodiments, the optical properties modeling component 130 is configured to model optical properties of generated nanowire networks. In some embodiments, system 100 may be used to control a manufacturing process 115 for a transparent conductor 12 including nanowires 10.

Both the percolative network component 128 and the optical properties modeling component 130 will be discussed in further detail below.

Figure 9B:
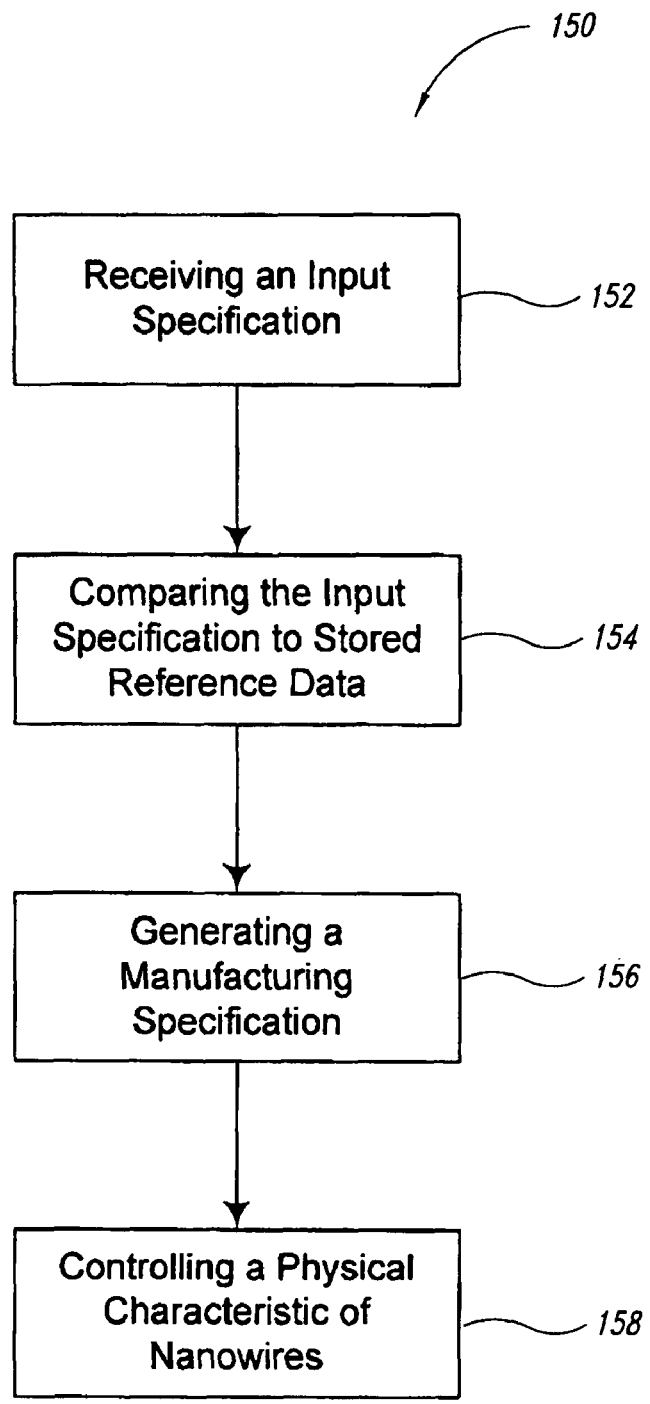
FIG. 9B is a flow diagram of a method for controlling a process of fabricating a transparent conductor film including nanowires according to one illustrated embodiment.

FIG. 9B shows an exemplary method 150 for controlling a process of fabricating a transparent conductor film including nanowires. In some embodiments, controlling a process of fabricating a transparent conductor film may include, for example, controlling, adjusting, or setting, or combinations thereof, a target physical characteristic of the nanowires to control the input specification of the transparent conductor film. In some embodiments, controlling a process of fabricating a transparent conductor film including nanowires may include, for example, controlling, adjusting, or setting, or combinations thereof, a fabrication process of the transparent conductor film that employs the use of nanowires having a set of target physical characteristics (e.g., a length, a diameter, a metal content, and the like).

At 152, the method includes receiving an input specification of a physical characteristic of the transparent conductor film. Physical characteristic of the transparent conductor film include, but are not limited to, a sheet resistance (Rs), an optical density (OD), a transmission level, a haze level, and the like. In some embodiments, the input specification comprises at least one of a sheet resistance (Rs), an optical density (OD), a transmission level, and a haze level.

At 154, the method includes comparing the input specification to stored reference data correlating a physical characteristic of reference transparent conductor films to a physical characteristic of reference nanowires. In some embodiments, the target physical characteristic of the nanowires comprises at least one of a nanowire length, nanowire diameter, or nanowire density. In some embodiments, the stored reference data comprises one or more reference data sets indicative of characteristic sheet resistances ($R_s$), characteristic optical densities (OD), characteristic transmission levels, and characteristic haze levels, or combinations thereof.

At 156, the method further includes generating a manufacturing specification comprising a target physical characteristic of the nanowires that correlates to the input specification. In some embodiments, the manufacturing specification comprises one or more nanowire dimensions and corresponding nanowire densities that satisfy at least one physical characteristic of the input specification, and that satisfy or exceed a minimum percolation density. In some embodiments, the minimum percolation density is about a factor of 5.7 greater than the inverse of an average of a square of nanowire lengths. In some embodiments, the manufacturing specification comprises a nanowire dimension and a corresponding nanowire density that satisfies at least one physical characteristic of the transparent conductor film from the received input specification 152, and that satisfies or exceeds a minimum percolation density. In some embodiments, the manufacturing specification comprises a nanowire dimension and a corresponding nanowire density that satisfies at least one physical characteristic of the transparent conductor film from the received input specification 152, and that satisfies or exceeds a minimum percolation density by at least a factor of about 1.1. In some embodiments, the manufacturing specification comprises a nanowire dimension and a corresponding nanowire density that satisfies at least one physical characteristic of the transparent conductor film from the received input specification 152, and that satisfies or exceeds a minimum percolation density by at least a factor of about 1.5.

In some embodiments, generating the manufacturing specification includes generating a manufacturing specification comprising at least a nanowire length, a corresponding nanowire diameter, and a corresponding nanowire density such that the product of the nanowire length, the corresponding nanowire diameter, and the corresponding nanowire density is less than or about a predetermine value based in part on a sheet resistance ($R_s$) level, an optical density (OD) level, a transmission level, or a haze level.

In some embodiments, generating the manufacturing specification includes generating a manufacturing specification further comprising generating a manufacturing specification that satisfies at least one physical characteristic of the transparent conductor film from the received input specification 152.

The manufacturing specification may include one or more nanowire density versus sheet resistance ($R_s$) over nanowire resistance ($R_{NW}$) plots; nanowire length (L) versus nanowire diameter (D) for a given sheet resistance ($R_s$) plots; nanowire length (L) over nanowire diameter square ($D^2$) versus sheet resistance ($R_s$) plots; percent haze versus nanowire density times nanowire cross-sectional area plots; or optical density (OD) versus nanowire density times nanowire cross-sectional area plots.

At 158, the method may further include controlling a physical characteristic of the nanowires of the transparent conductor film based on the manufacturing specification.

Figure 10A:
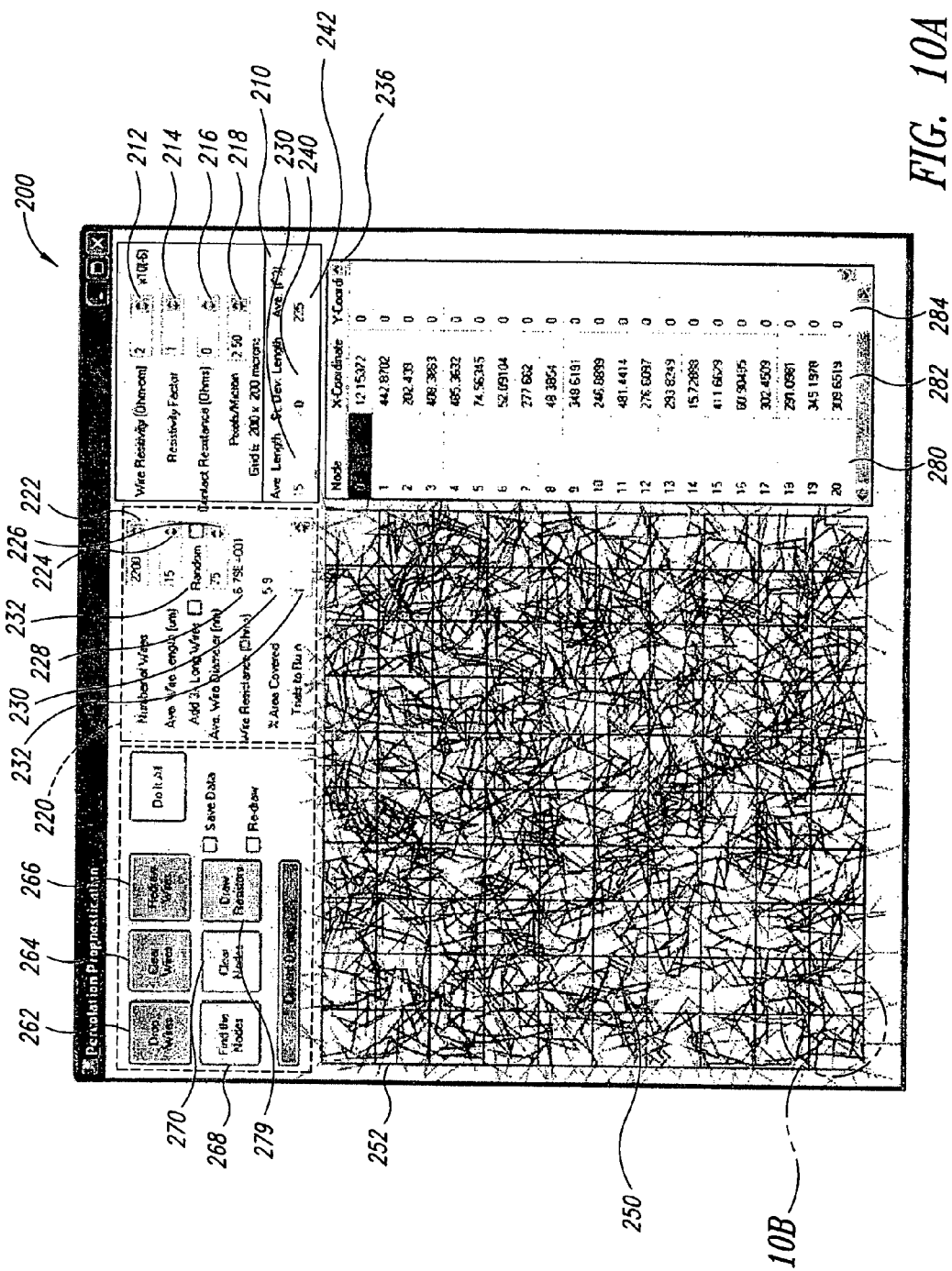
FIG. 10A is an exemplary screen display for a system for evaluating optical and electrical manufacturing criteria for a transparent conductor according to one illustrated embodiment.

FIG. 10A shows an exemplary screen display 200 for a system 100 for determining the electrical behavior of nanowire networks and/or for manufacturing transparent conductor substrates. The screen display 200 may include a transparent conductor specification component 210 for providing and/or displaying properties and characteristics of a transparent conductor 12. The transparent conductor specification component 210 may include at least one of a nanowire resistivity subcomponent 212, a resistivity factor subcomponent 214, a contact resistance subcomponent 216, a pixels/micron subcomponent 218, and the like.

The screen display 200 may also include a nanowire specification component 220 for providing and/or displaying properties and characteristics associated with the nanowires and/or nanowire networks. The nanowire specification component 220 may include at least one of a number of nanowires subcomponent 222, an average nanowire length subcomponent 224, an average nanowire diameter subcomponent 226, a nanowire resistance subcomponent 228, a % area covered subcomponent 230, a random and/or uniform distribution subcomponent 232, a trial runs subcomponent 233 and the like.

In some embodiments, the nanowire specification component 220 may further include a subcomponent 236 for providing and/or displaying a deviation associated with one or more of the properties and characteristics associated with the nanowires and/or nanowire networks including, for example, an average length subcomponent 238, a standard deviation associated with the average length subcomponent 240, an average of the square of the length of a nanowire subcomponent 242.

The screen display 200 may also include one or more user-interface components and/or user-selectable controls operable to initiate and/or effect an instruction or a user selection. Examples of an instruction or a user selection may include populating nanowires in an area 262; clearing nanowires from the area 266, redrawing all the wires in the area 266; finding the intersection of the nanowires and displays them 268; clearing information on the intersections of the nanowires 270; drawing resistors, which represent the parts of the wires which connect two nodes, and form the network being modeled 279; labeling the nodes 280; determining an x-position of a node 282 in the figure in, for example, pixels; or determining a y-position of the node 284 in the figure in, for example, pixels.

Figure 10B:
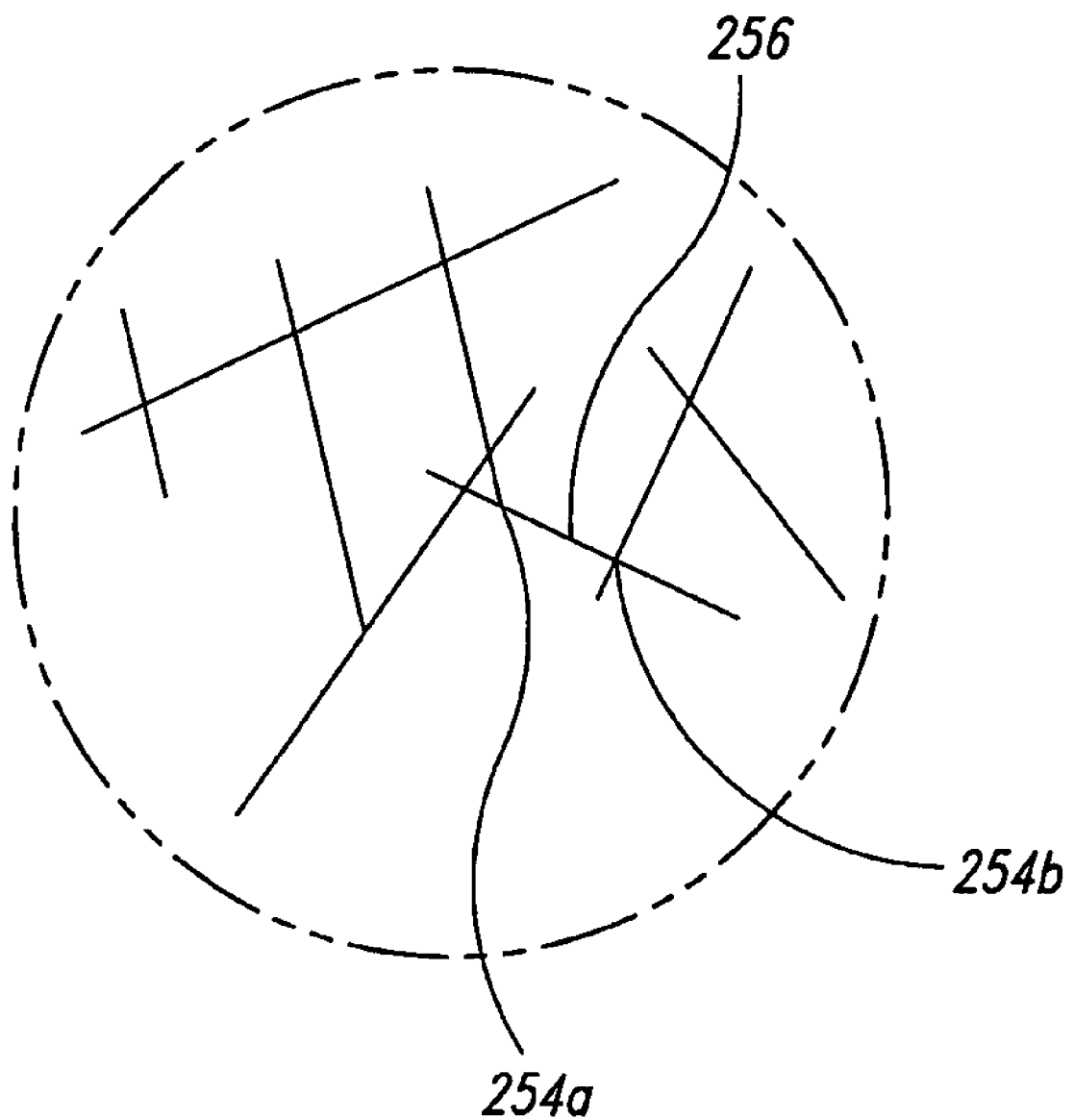
FIG. 10B is an exploded view of the nanowire network of FIG. 11A according to one illustrated embodiment.

In some embodiments, the transparent conductor specification component 210 of system 100 is operable to receive an input associated with the nanowires including, for example, the number of nanowires 222, the average length of the nanowires 224, the average diameter of the nanowires 226, the average resistivity ($R_{NW}$) of the nanowires 228, any contact resistance between nanowires, the area over which the nanowires will be deposited 230, and the like. The percolative network component 128 receives the input and automatically generates a random and/or uniform distribution 250 of the nanowires 252 over the specified area 230. The percolative network component 128 then automatically determines all of the intersection 254a, 254b (referred to as nodes) between the nanowires 252. As shown in FIG. 10B, for each node 254a connected to another node 254b, a resistor 256 is drawn connecting the two nodes 254a, 254b. The resistance value for each resistor 256 is then determined based on the distance between the two nodes 254a, 254b, the resistivity of the nanowire material, and the diameter of the nanowires 252.

Referring to Example A, in some embodiments, a file comprising at least one of a total number of nanowires; an average nanowire length; an average squared nanowire length; a percent area covered; an average nanowire diameter; a nanowire resistivity, and the like, is generated and stored in, for example, memory 126.

TABLE A

| FILE CONTENT | |
|---|---|
| Description | Value |
| Total Number of Wires | 10000 |
| Average Length (um) | 20 |
| St. Dev. Length (um) | 0 |
| Average [Length^2] (um^2) | 400 |
| % Area Covered (um 2) | 1.847204 |
| No. of Dist. A Wires (um) | 10000 |
| Average Length A (um) | 20 |
| Random Distribution | FALSE |
| Average Wire Diameter A (nm) | 60 |
| Gaussian Distribution A | FALSE |
| St. Dev. Wire Diam. A (nm) | 0 |
| Wire Resistivity A (Ohm-cm) | $2 \times 10(-6)$ |
| No. of Dist. B Wires (um) | 0 |
| Average Length B (um) | NaN |
| Random Distribution | FALSE |
| Average Wire Diam. B (nm) | NaN |
| Gaussian Distribution b | FALSE |
| St. Dev. Wire Diam. B (nm) | NaN |

TABLE A-continued

| FILE CONTENT | |
|---|---|
| Description | Value |
| Wire Resistivity B (Ohm-cm) | $2 \times 10(-6)$ |
| Contact Resistance (Ohms) | 0 |
| Pixels per Micron | 0.625 |
| Grid Size (um) | 800 |

For each resistor 256 the file includes the nodes 254a, 254b forming the two endpoints of the resistor 256, and its resistance (See also, for example Table B). This information is then supplied into the percolative network component 128 that is operable to calculate the current flowing through the network at a given applied voltage. The percolative network component 128 may be implemented using, for example, LTSpice/Switcher CAD (Linear Technologies).

TABLE B

| LIST OF RESISTORS IN A NETWORK. | | | | |
|---|---|---|---|---|
| Resistor Label | Label of First Node Defining Resistor | label of Second Node Defining Resistor | | Number of Nanowire where Nodes are Located |
| R2447 | 3110 | 3106 | 1.90E+01 | 805 |
| R2448 | 3106 | 3107 | 2.12E+01 | 805 |
| R2449 | 3107 | 3105 | 2.46E+01 | 805 |
| R2450 | 3105 | 2125 | 1.41E+01 | 805 |
| R2451 | 3114 | 3112 | 1.30E+01 | 806 |
| R2452 | 3112 | 3113 | 3.12E+01 | 806 |
| R2453 | 3113 | 220 | 2.94E+01 | 806 |
| R2454 | 220 | 3111 | 2.58E+01 | 806 |
| R2455 | 1851 | 3119 | 5.12E+01 | 807 |
| R2456 | 3119 | 3116 | 2.52E+01 | 807 |
| R2457 | 3116 | 3115 | 1.38E+01 | 807 |
| R2458 | 3115 | 3117 | 3.17E+01 | 807 |

Figure 11:
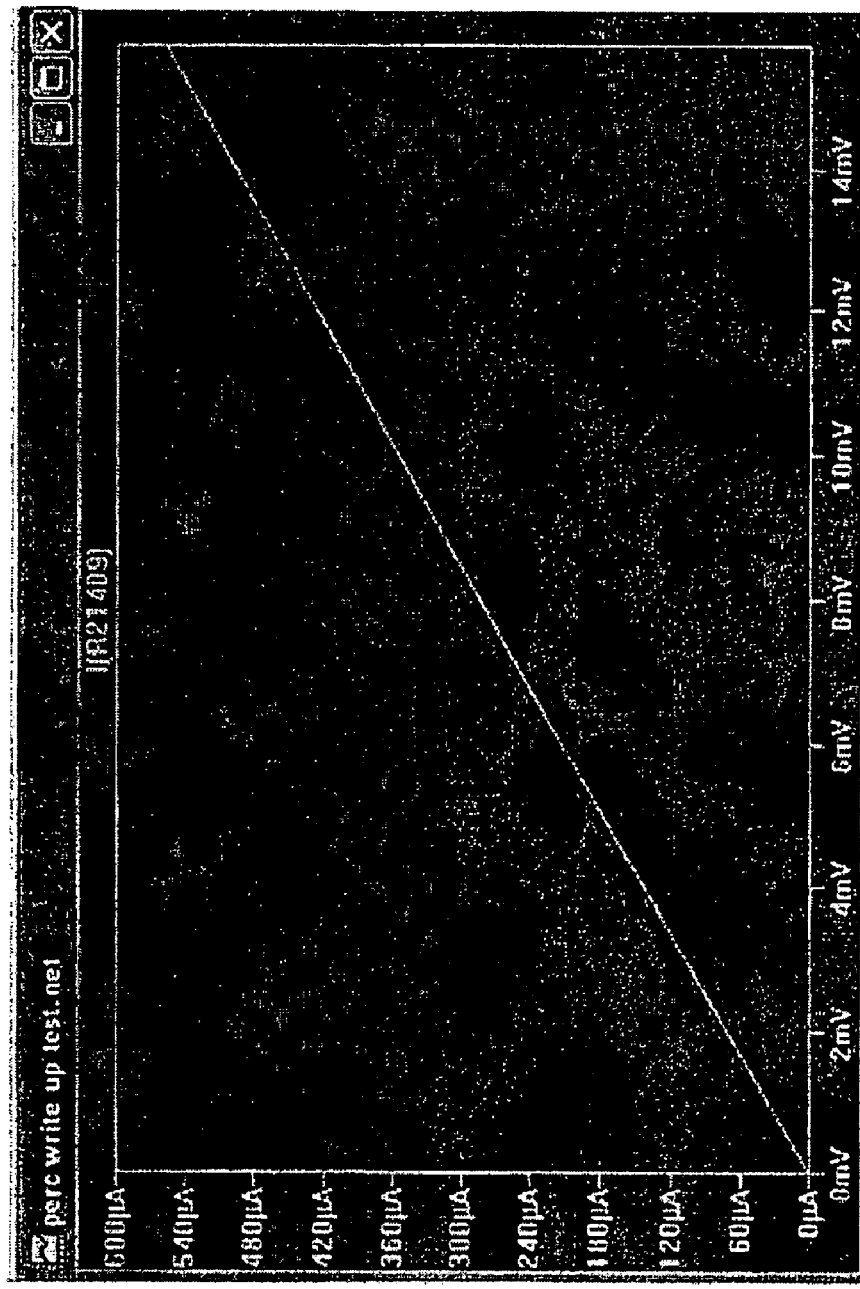
FIG. 11 is a generated current flowing through a nanowire network versus applied voltage plot according to one illustrated embodiment.

FIG. 11 shows an exemplary plot of generated current flowing through a nanowire network versus applied voltage.

The percolative network component 128 may be generalized to evaluate random distributions of nanowire lengths. In some embodiments, the percolative network component 128 may include the ability to evaluate nanowire batches with Gaussian diameter, as well as the ability to evaluate and compare nanowire networks of varying characteristics.

In some embodiments, based on an input acceptance manufacturing criteria, the percolative network component 128 is operable to generate nanowire networks by modeling the conductivity of a percolative network 250 of nanowires 252, as well as by modeling the optical properties of these networks. The input acceptance manufacturing criteria may include one or more properties associated with the conductivity and/or the optical properties of a transparent conductor. For example, the input acceptance manufacturing criteria may include at least one of a sheet resistance ($R_s$) level, an optical density (OD) level, a transmission level, a haze level, a conductivity range, and the like.

In some embodiments, given an input acceptance manufacturing criteria, the system 100 is operable to automatically generate nanowire dimensions and corresponding nanowire networks 250 of varying densities that satisfy one or more of the input acceptance manufacturing criteria.

Figure 12:
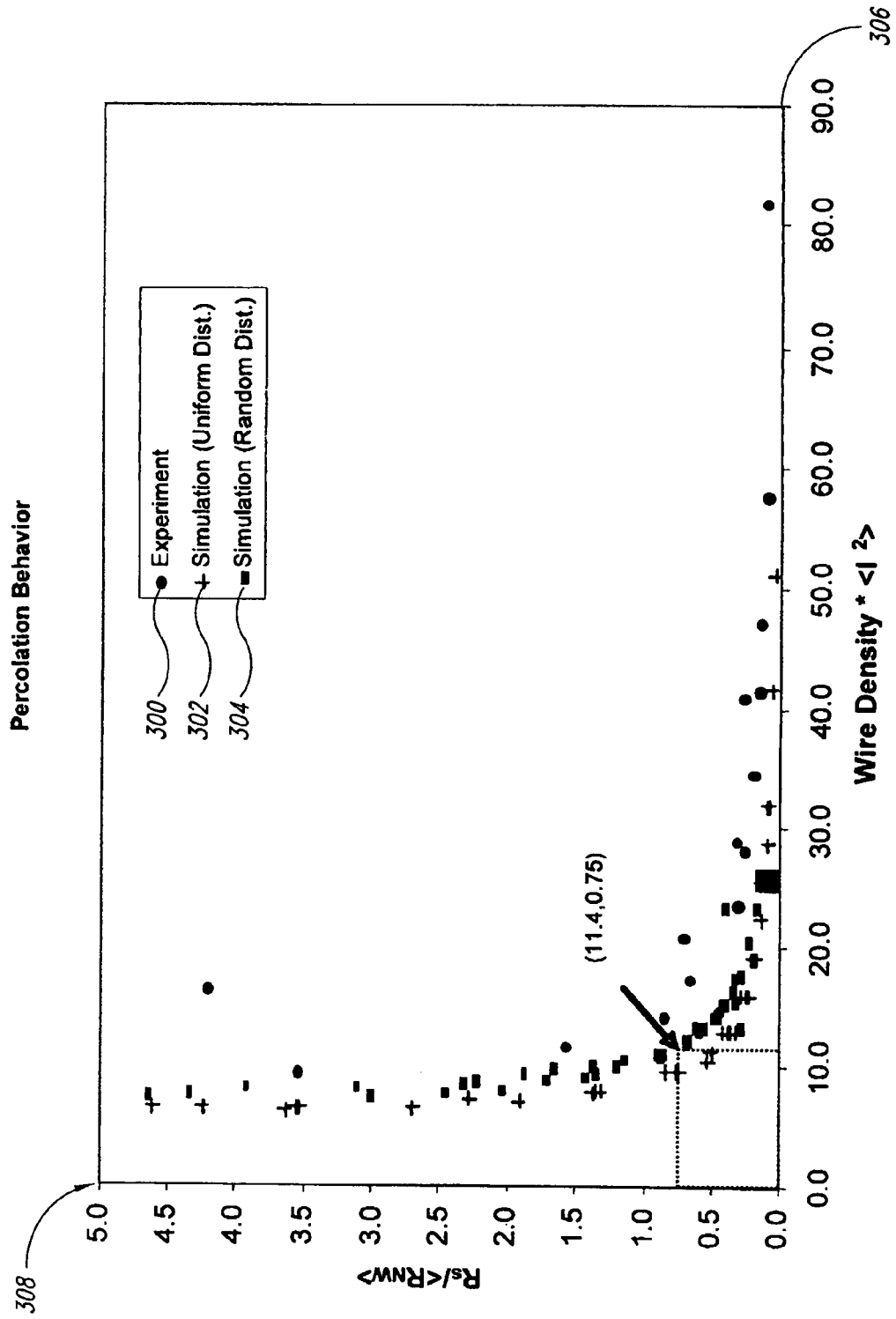
FIG. 12 is a sheet resistance ($R_s$) over nanowire resistance ($R_{NW}$) versus the product of nanowire density ($\beta$) and the average of the square of the length of the nanowires ($<L^2>$) plot according to one illustrated embodiment.

FIG. 12 shows experimental measurements 300, as well as simulated 302, 304 percolation behavior results in the form of a plot of sheet resistance ($R_s$) of nanowire network divided by the resistance ($R_{NW}$) of a single nanowire versus the product of nanowire density and the average of the square of the length of the nanowires ($<L^2>$). The plotted percolation behavior results correspond to an input manufacturing criteria comprising: a sheet resistance ($R_s$) of about 100±10 Ohms/sq; a haze value of less than about 3%; and an optical density (OD) of less than about 0.02 (corresponding to 95% transmission (OD=−log [(% T)/100]).

Along the abscissa 306 is the product of nanowire density (β) and the average of the square of the length of the nanowires ($<L^2>$). Along the ordinate 308 is the sheet resistance of nanowire network divided by the resistance of a single nanowire. The resistance of a nanowire is simply $R_{NW}=\rho L/A$, where (ρ) is the resistivity of the nanowire material, (L) is the length of the nanowire, and (A) is the cross-sectional area of the nanowire. The cross-sectional area (A) is equal to $\pi(D^2/4)$, where (D) is the nanowire diameter. For a non-uniform distribution, $<L>$ and $<D^2>$ are used to determine the average nanowire resistance. In some embodiments, the target nanowire network density meets or exceeds the percolation threshold density.

FIG. 12 includes simulations for both uniform 302 and random 304 distributions of nanowire lengths, as well as experimental measurements 300 of actual samples of varying nanowire dimensions and/or densities.

The simulated values 302, 304 include results for nanowire networks with a wide range of lengths and widths (or diameters, and the like), showing the universal applicability of the plotted curves. Accordingly, these results may be applicable to a wide range of nanowire geometries. The result illustrated in FIG. 12 demonstrates that, although there is a slight offset between the theoretical and experimental points, there is agreement between the simulated values 302, 304 and the experimental values 300, and that the general behavior of the theoretical calculations (once corrected by an offset value) are in agreement with experimental results. There is approximately a factor of two disagreements between the experimental and theoretical resistance of the transparent conductor film samples made. Accordingly, if the theoretical model generates a manufacturing specification having a sheet resistance ($R_s$) of about 50 Ohms/sq, after a correction, the actually sheet resistance ($R_s$) is predicted to be about 100 Ohms/sq.

In some embodiments, generating a nanowire network density (β) of twice the percolation threshold may result in having fluctuations in the resistance of the nanowire networks of less than 10%. The percolation threshold is typically at $(\beta)(<L^2>)=5.71$. Accordingly, in some embodiments, the network density (β) is chosen to be approximately $11.4/<L^2>$. As shown in FIG. 13, this implies that the modeled random distribution should operate at about $(R_s/R_{NW})=0.75$.

Figure 14A:
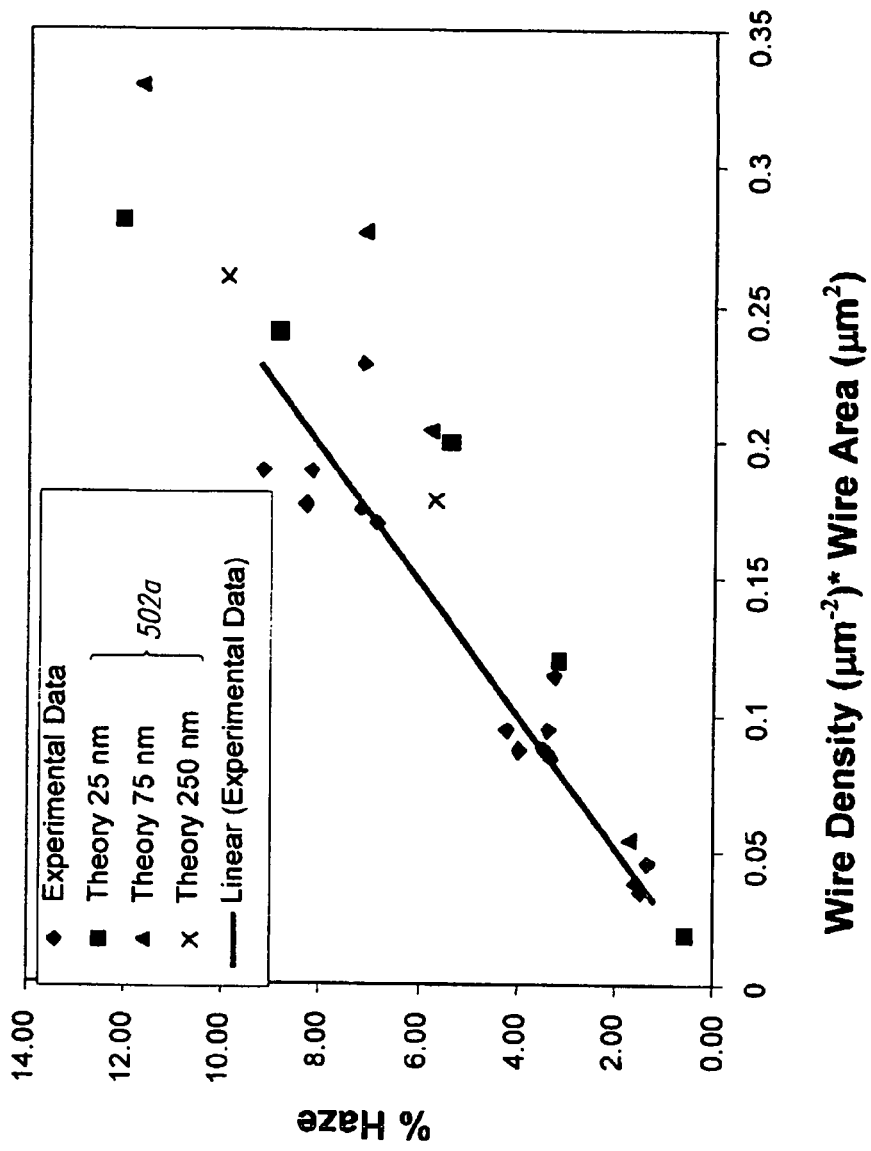
FIG. 14A is an exemplary % haze versus the product of nanowire density and nanowire area plot according to one illustrated embodiment.

Applicants note that since $R_{NW}$ is related to the length and the diameter of the nanowires ($R_{NW}=4\rho L/(\pi D^2)$), this provides for a method to generate nanowire networks for a given sheet resistance as a function of nanowire length and diameter. FIG. 14A was generated using a theoretical sheet resistance ($R_s$) of 50 Ohms/sq and, as previously discussed, the actual samples will result in a sheet resistance ($R_s$) of approximately 100 Ohms/sq.

Figure 13A:
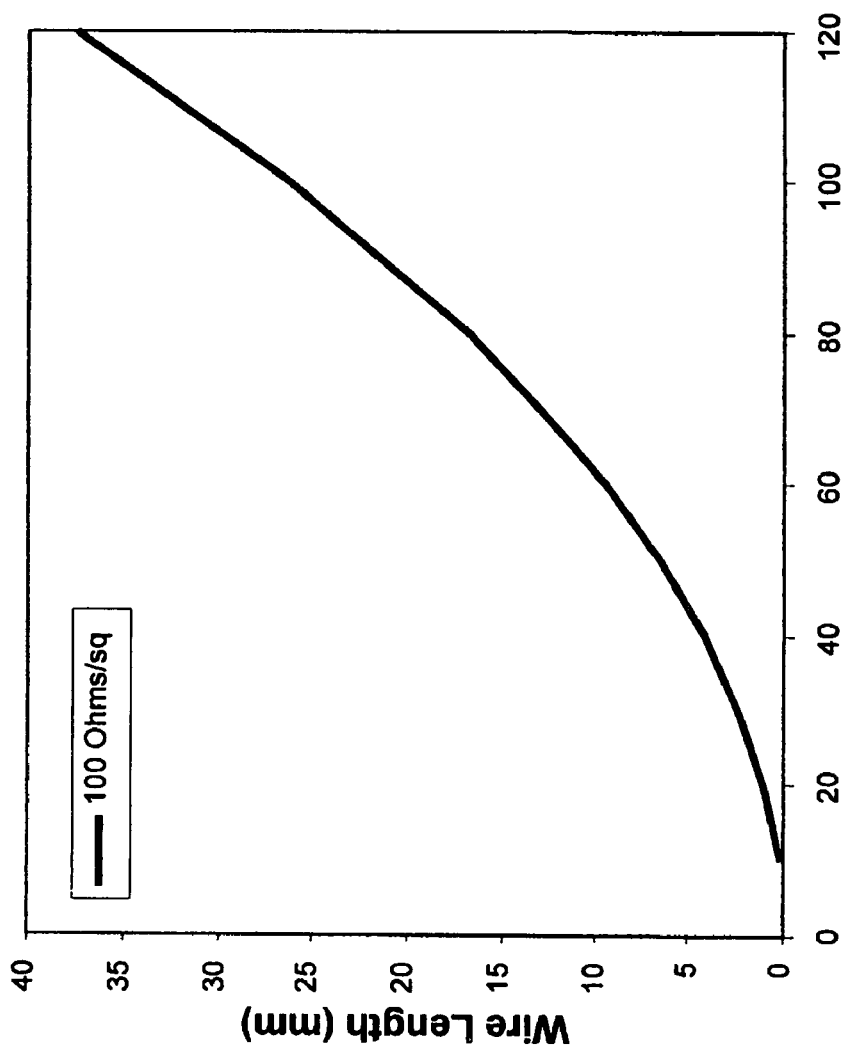
FIG. 13A is an exemplary nanowire length versus nanowire diameter plot for a 100 Ohms/sq transparent conductor according to one illustrated embodiment.
Figure 13B:
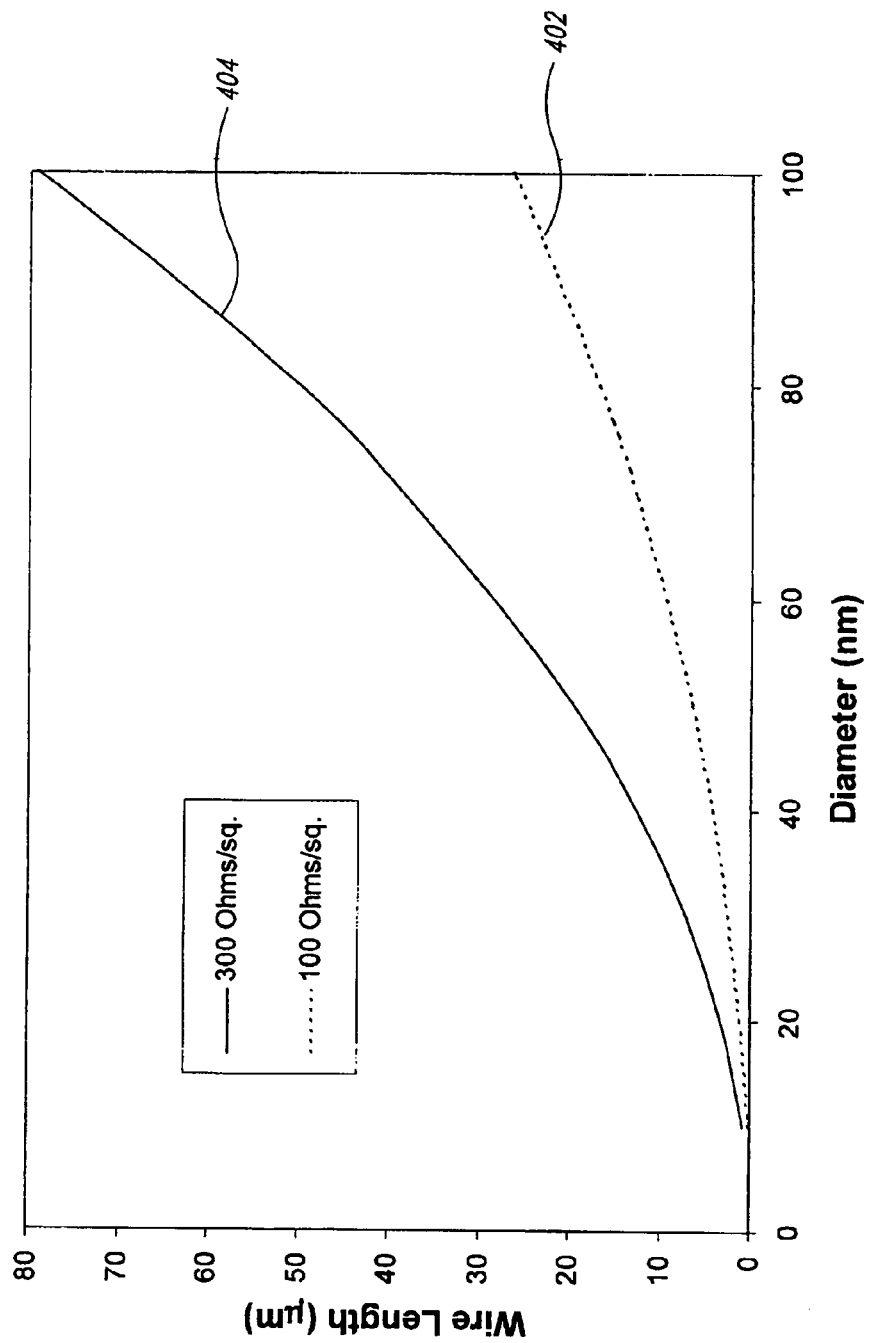
FIG. 13B is an exemplary nanowire length versus nanowire diameter plot for 100 Ohms/sq and 300 Ohms/sq transparent conductors according to one illustrated embodiment.

As can be seen from FIG. 13A, it is possible to select sets of nanowire lengths and corresponding diameters that will satisfy the desired sample sheet resistance ($R_s$) at network density (β) equal to about twice the percolation threshold. Accordingly, a family of curves can be generated for different sheet resistances ($R_s$) (e.g., curves for 100 Ohms/sq and 300 Ohms/sq transparent conductors shown in FIG. 13B). In some embodiments, similar plots can be generated to account for nanowire networks 250 of varying density. The accompanying increase or decrease in fluctuations in sheet resistance ($R_s$) will result in the generation of different curves.

By picking a point along one of the curves 402, 404 shown in FIG. 14B, it is possible to achieve a specified conductivity for nanowire density at, for example, twice the percolation threshold.

As previously noted, the system 100 may further include an optical properties modeling component 130. FIGS. 14A and 14B show a plot of % haze versus the product of nanowire network density and nanowire area, and a plot of optical density (OD) versus the product of nanowire network density and nanowire area, respectively. In some embodiments, a nanowire area is approximately defined as the length of the nanowire multiplied by its diameter. This area can be looked upon as the projected area of the nanowire as viewed from above. Theoretical data points 502a, 502b are shown for several different nanowire diameters, again demonstrating that the particular geometry of the nanowire does not significantly affect the theoretical behavior. Applicants note that the haze measurements agree with the theoretical haze values. Accordingly, in some embodiments, the system 10 is operable to generate sets of nanowires lengths and corresponding widths (or diameters, and the like) that satisfy a specified % haze and nanowire density.

There is an important consideration that should be taken into account when evaluating the optical density (OD) data. The proportionality factor relating optical density (OD) to β*L*D is not the same for the measured samples as it is for the theoretical data. There is approximately a factor of about 2.5 difference between the theoretical and measured values. Accordingly, $[\beta*L*D]_{(experimental)}$ is approximately equal to about $2.5*[\beta*L*D]_{(theoretical)}$.

Since haze and optical density (OD) are correlated, it is only possible to specify one or the other, but not both. In some embodiments, a desired haze is specified and the corresponding optical density (OD) is determined. In some embodiments, a desired optical density (OD) is specified and the corresponding haze is determined.

Figure 15:
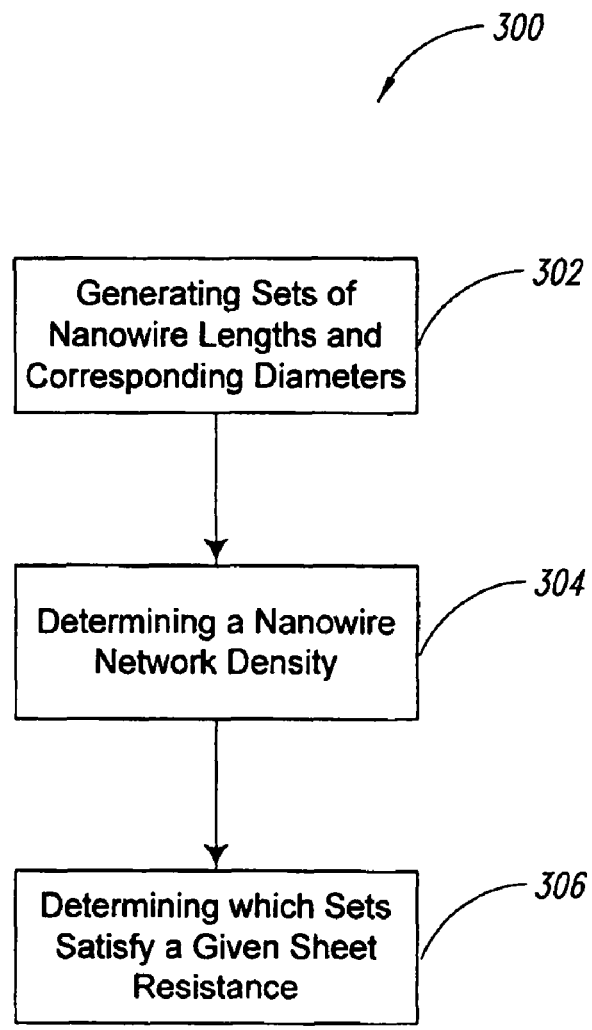
FIG. 15 is a flow diagram of a method for determining suitable nanowire dimensions that satisfy one or more specified electrical or optical manufacturing criteria for a resulting transparent conductor according to one illustrated embodiment.

FIG. 15 shows an exemplary method 300 for determining suitable nanowire dimensions that satisfy one or more specified electrical or optical manufacturing criteria for a resulting transparent conductor.

At 302 the method includes generating one or more sets of nanowire lengths and corresponding diameters that satisfy a given sheet resistance ($R_s$) for a resulting transparent conductor. For example, 314A illustrates an exemplary nanowire length versus nanowire diameter plot for a specified electrical manufacturing criteria of a sheet resistivity ($R_s$) of 100 Ohms/sq.

At 304 the method includes determining a density of a nanowire network that satisfy or exceed a minimum percolation threshold based on the generated sets of nanowire lengths and corresponding diameters that satisfy a given sheet resistance ($R_s$) for a resulting transparent conductor. In some embodiments, the method includes determining a density of a nanowire network that exceeds a minimum percolation threshold by at least a factor of about 1.1. In some embodiments, the method includes determining a density of a nanowire network that exceeds a minimum percolation threshold by at least a factor of about 1.5. In some embodiments, the method includes determining a density of a nanowire network at about twice the percolation threshold ($\beta*<L^2>$ is greater than or equal to about twice the percolation threshold value of 5.71).

At 306 the method includes determining which of the generated sets of nanowire lengths and corresponding diameters satisfy a given sheet resistance ($R_s$) and at least one of the optical manufacturing criteria for a resulting transparent conductor. In some embodiments, determining which of the generated sets of nanowire lengths and corresponding diameters satisfy a given sheet resistance ($R_s$) and at least one of the optical manufacturing criteria includes comparing the generated sets of nanowire lengths and corresponding diameters to % haze versus the product of nanowire density versus nanowire area data. An exemplary % haze versus $\beta*L*D$ data plot is shown in FIG. 14A. As illustrated, % haze is equal to about $40.5*\beta*L*D$. If the optical manufacturing criteria includes a % haze of less than about 3% and an optical density (OD) of less the about 0.02, the appropriate nanowire specification criteria can be determined from the following relationships:

$$40.5*\beta*L*D<3, \text{ or } \beta*L*D<0.074 \quad \text{(eqs. 4 and 5)}.$$

From the result summarized in Table 7, it is possible to see that those nanowires having a length of 10 μm or larger satisfy the optical specification of a % haze of less than about 3%.

TABLE 7

Nanowire Network Specification Results
for a 100 Ohms/sq Transparent Conductor

| l (μm) | β(μm$^{-2}$) | For 100 Ω/sq d (nm) | β*l*d(μm$^{-2}$) | β*l*d(<0.74 μm$^{-2}$) |
|---|---|---|---|---|
| 5 | 0.456 | 43.9 | 0.100 | N |
| 10 | 0.114 | 62.0 | 0.071 | Y |
| 15 | 0.051 | 76.0 | 0.058 | Y |
| 20 | 0.029 | 87.7 | 0.050 | Y |
| 25 | 0.018 | 98.1 | 0.045 | Y |
| 30 | 0.013 | 107.4 | 0.041 | Y |

An exemplary optical density (OD) versus $\beta*L*D$ plot is shown in FIG. 14B. Using the data shown in FIG. 14B it is possible to see that those nanowires having a length of 10 μm or larger further satisfy a specification that the optical density be less than 0.02.

Figure 16A:
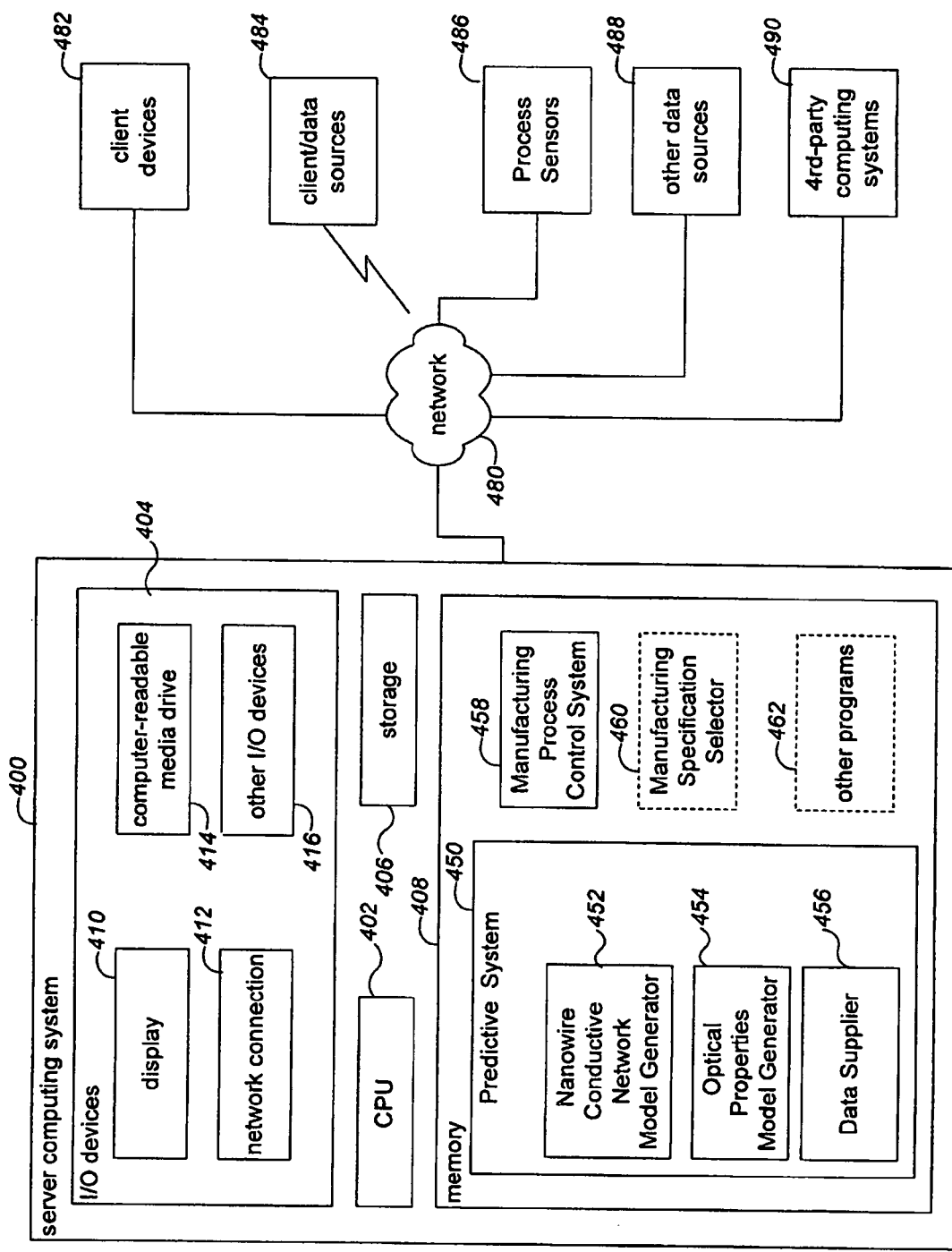
FIG. 16A is a functional block diagram of a system for designing a nanowire transparent conductor and/or evaluating optical and electrical manufacturing criteria for a transparent conductor according to multiple illustrated embodiments.

FIG. 16A shows an exemplary server computing system 400 that is suitable for performing at least some of the described methods and techniques, such as, for example, by executing an embodiment of a method for designing a nanowire transparent conductor, executing an embodiment of a predictive electrical percolation system and/or a transparent conductor manufacturing specification selector system. In some embodiments, the exemplary server computing system 400 is suitable for determining and/or evaluating the electrical and/or optical behavior of nanowire networks.

The system 400 includes a central processing unit ("CPU") 402, various input/output ("I/O") components 404, storage 406, and memory 408, with the illustrated I/O components including a display 410, a network connection 412, a computer readable media drive 414, and other I/O devices 416 (e.g., keyboards, mice or other pointing devices, microphones, speakers, and the like).

In the illustrated embodiments, a predictive electrical and optical system 450, a nanowire conductive network model generator 452, an optical properties model generator 454, and other systems provided by programs 462 are executing in memory 408 in order to perform at least some of the described methods and techniques. In some embodiments, the system 400 may further include at least one of a data supplier 456, a manufacturing process control system 458, and a transparent conductor manufacturing specification selector system 460. In some embodiments, the predictive electrical and optical system 450 is operable to predict and/or determine the electrical and optical behavior of transparent conductors comprising nanowire networks. For example, the predictive electrical and optical system 450 may also include a nanowire conductive network model generator for generating electrical specification relationships based on empirical and/or theoretical data, as well as optical properties model generator 454 for generating optical specification relationships based on the generated electrical specification relationships and/or based on empirical and/or theoretical data.

The server computing system 400 and its executing systems may communicate with, for example, other computing systems via a network 480 (e.g., the Internet, one or more cellular telephone networks, etc.), such as various client devices 482, manufacturing facility devices and/or data sources 484, process sensors 486, other data sources 488, third-party computing systems 490, and the like. In some embodiments, one or more of the predictive electrical and optical system 450 components (generators, systems, subsystems, subcomponents, suppliers, and the like) are configured to receive various information regarding optimal transparent conductor specifications, current manufacturing process conditions and/or previously observed manufacturing data from various sources, such as from manufacturing facilities, from experimental facilities, from client-based data sources, and from other data sources. The predictive electrical and optical system 450 then uses the received data to generate nanowire networks conductivity predictions for multiple manufacturing specifications (using for example the nanowire conductive network model generator 452, the optical properties model generator 454, and the like) and to provide the predicted information to, for example, the manufacturing specification selector system 458 and optionally to one or more other recipients, such as one or more predictive percolation systems, client devices, manufacturing controllers, third-party computing systems, users, and the like.

In some embodiments, the manufacturing specification selector system 458 uses the received predictive electrical percolation information to generate a manufacturing specification that includes, for example, a manufacturing process protocol, an average nanowire length, an average nanowire diameter, an average nanowire resistance, an average nanowire density, and the like In some embodiments, the system 400 may further include an optical properties model generator 454 for generating optical specification relationships based on empirical and/or theoretical data and/or for analyzing the optical properties of an assembly of nanowires as a function of, for example, shape, network density, and orientation. Examples of programs useful in implementing the optical properties model generator 454 include ZEMAX Optical Design Program (ZEMAX Development Corporation), MATLAB (The MathWorks, Inc.), ZPL macros (ZEMAX Programming Language), and the like. In some embodiments, a ZEMAX optical ray tracing program is used to theoretically evaluate the optical properties of an assembly of nanowires as a function of, for example, shape, network density, orientation, and the like.

In some embodiments, the evaluation of the optical properties of an assembly of nanowires is restricted to geometric optical properties (i.e., ignoring diffraction effects and non-classical optical effects, and the like). This approach is typically valid for nanowires whose lengths and diameters are large compared to the wavelength of an incident light. In some embodiments, the evaluation of the optical properties of an assembly of nanowires may further include diffraction and non-classical optical effects. In such an embodiment, it may be important that the theoretical analysis converges to the classical optics result in the large rod diameter limit in order to be valid.

Figure 16B:
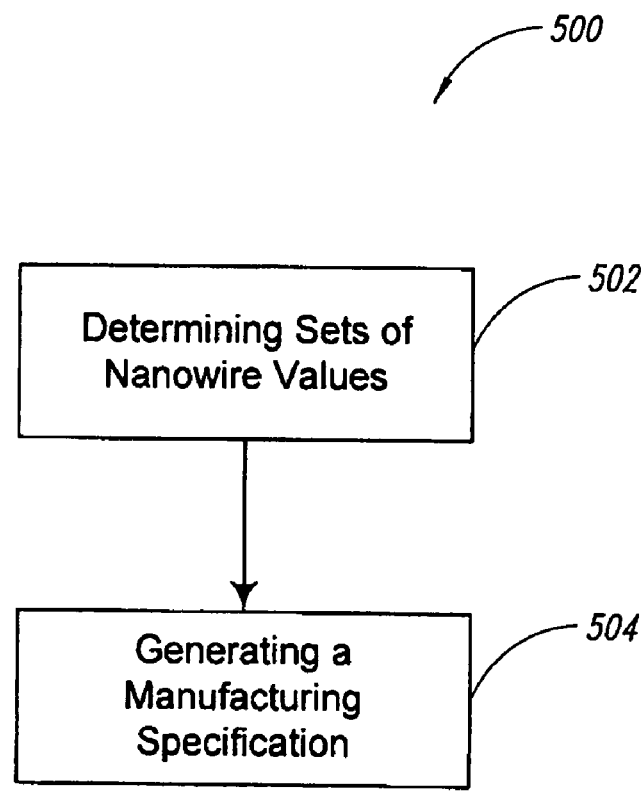
FIG. 16B is a flow diagram of a method for designing a transparent conductor including a nanowire network according to one illustrated embodiment.

In some embodiments, the computer readable storage medium comprises instructions that, when executed on a computer, execute a method for designing a nanowire transparent conductor. FIG. 16B shows an exemplary method 500 for designing a nanowire transparent conductor. Examples of storage media include networks, optical media, magnetic media, etc.

At 502, the method includes determining sets of nanowire values based on information indicative of a desired electrical or optical property of the nanowire transparent conductor. In some embodiments, the sets include a nanowire length, a nanowire width (or diameters, and the like), and a corresponding density. In some embodiments, determining the sets of nanowire values includes retrieving model data, correlating a nanowire length, nanowire diameter or nanowire density, or combinations thereof, to corresponding electrical or optical properties of reference nanowire transparent conductors, from a memory on which is stored a model for modeling sets of nanowire values based on information indicative of the desired electrical or optical property of the nanowire transparent conductor. In some embodiments, determining the sets of nanowire values may further include determining sets of nanowire values based on the retrieved model data. In some embodiments, determining the sets of nanowire values includes retrieving stored data correlating electrical or optical property of reference nanowire transparent conductors to physical measurements of reference nanowire-including transparent conductors, experimental measurements of nanowire compositions, or manufacturing conditions that affect electrical and optical properties of the nanowire-including transparent conductor, and determining sets of nanowire values based on the retrieved stored data.

At 504 the method further includes generating a manufacturing specification based on the determined sets of nanowire values for manufacturing the transparent conductor. Generating a manufacturing specification based on the determined sets of nanowire values for manufacturing the transparent conductor may include generating at least one of a manufacturing process protocol, an average nanowire length, an average nanowire diameter, an average nanowire resistance, an average nanowire density, and the like. In some embodiments, the manufacturing specification includes a nanowire density versus sheet resistance ($R_s$) over nanowire resistance ($R_{NW}$) plot; a nanowire length (L) versus nanowire diameter (D), for a given sheet resistance ($R_s$) plot; a nanowire length (L) over nanowire diameter square ($D^2$) versus sheet resistance ($R_s$) plot; a percent haze versus nanowire density times nanowire cross-sectional area plot; or an optical density (OD) versus nanowire density times nanowire cross-sectional area plot.

Figure 17:
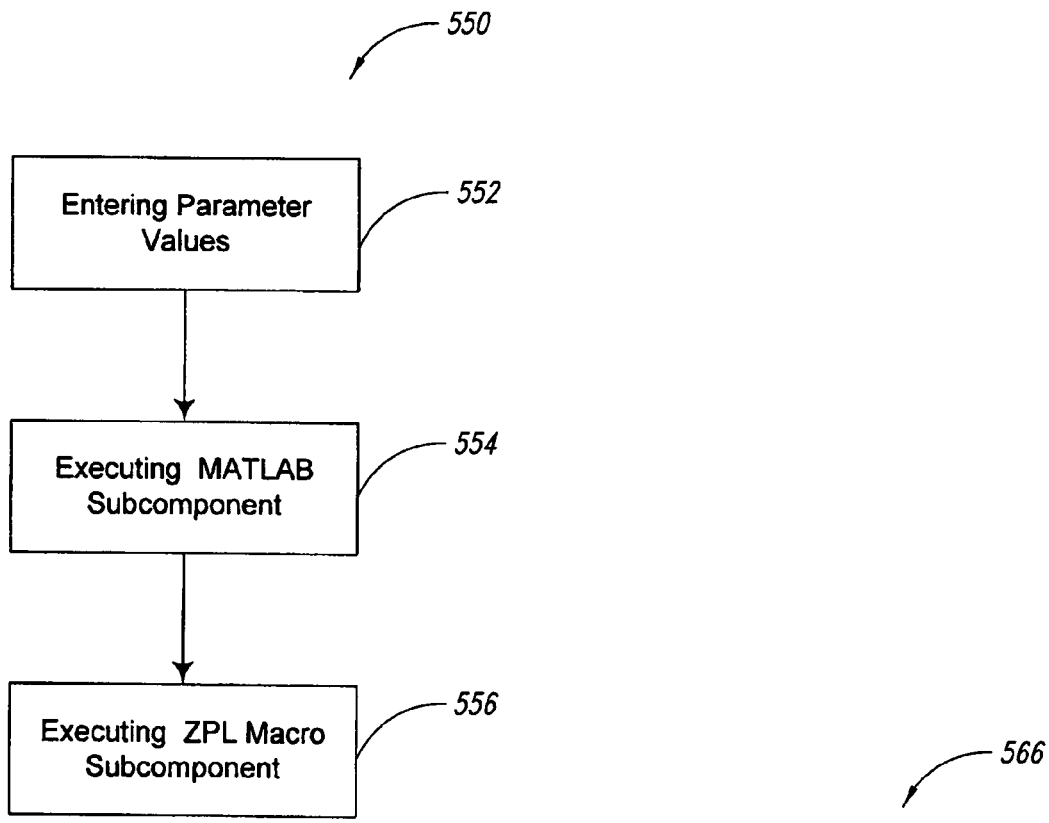
FIG. 17 is a flow diagram of a method for evaluating the optical properties of a transparent conductor according to one illustrated embodiment.

As shown in FIG. 17, in some embodiments, subcomponents of the optical properties model generator 454 comprise instructions that, when executed on a computer system 400, execute a method 550 for evaluating the optical properties of a transparent conductor.

At 552, the method includes entering parameter values into the MATLAB subcomponent and storing the MATLAB subcomponent in memory 408.

At 554, the method includes executing the MATLAB subcomponent and determining the side length (s) of the nanowire area, the random position in (x, y, z) space, and the random orientation for each of 206 nanowires, and several other relevant values, and stores the data into an output data file in memory 408.

At 556, the method includes executing the ZEMAX ZPL macro subcomponent that when executed on a computer is operable to set the overall thickness of the aggregate nanowire stack, set the length, diameter, (x, y, z) position and θ orientation of each nanowire, store in memory an image of the nanowire assembly (viewed from along the optical axis), execute a ray trace which traces approximately 1,000,000 rays through the nanowire assembly, store in memory 408 an image of the results displayed on four detector windows, and store in memory 408 one or more key parameters for further analysis.

The following description provides a non-limiting illustration of the process for generating optical specification relationships employed by the system 400 in evaluating the optical properties of transparent conductors.

Example 4

Generation of Optical Specification Relationships for Designing and/or Manufacturing Transparent Conductors The following cases were considered in the evaluation of EXAMPLE 4:

Nanowire length L=8 μm.

Nanowire diameter (D) ranging from about 0.025 μm to about 1 μm.

Nanowire density (ρ) (rods/unit area) ranging from a minimum value of about 0.0892 rods/μm$^2$ (corresponding to the percolation threshold) to a value that would yield a minimum zero-order transmittance (with no substrate) of approximately 75%.

N=number of nanowires=206 (this was selected as a number that was small enough to avoid bogging down the computations but large enough to reduce statistical noise in the calculations to reasonably low levels).

Substrates considered: air (no substrate), PET, PET with AR coating on both sides.

Randomly oriented nanowires.

Bipolar orientation of nanowires—either 0° or 90° orientation.

In performing the optical analysis of the nanowire assemblies, it is important to ensure that the transmittance and reflectance of the beam incident on the nanowire film are not being influenced by nanowire film edge effects.

Figure 18:
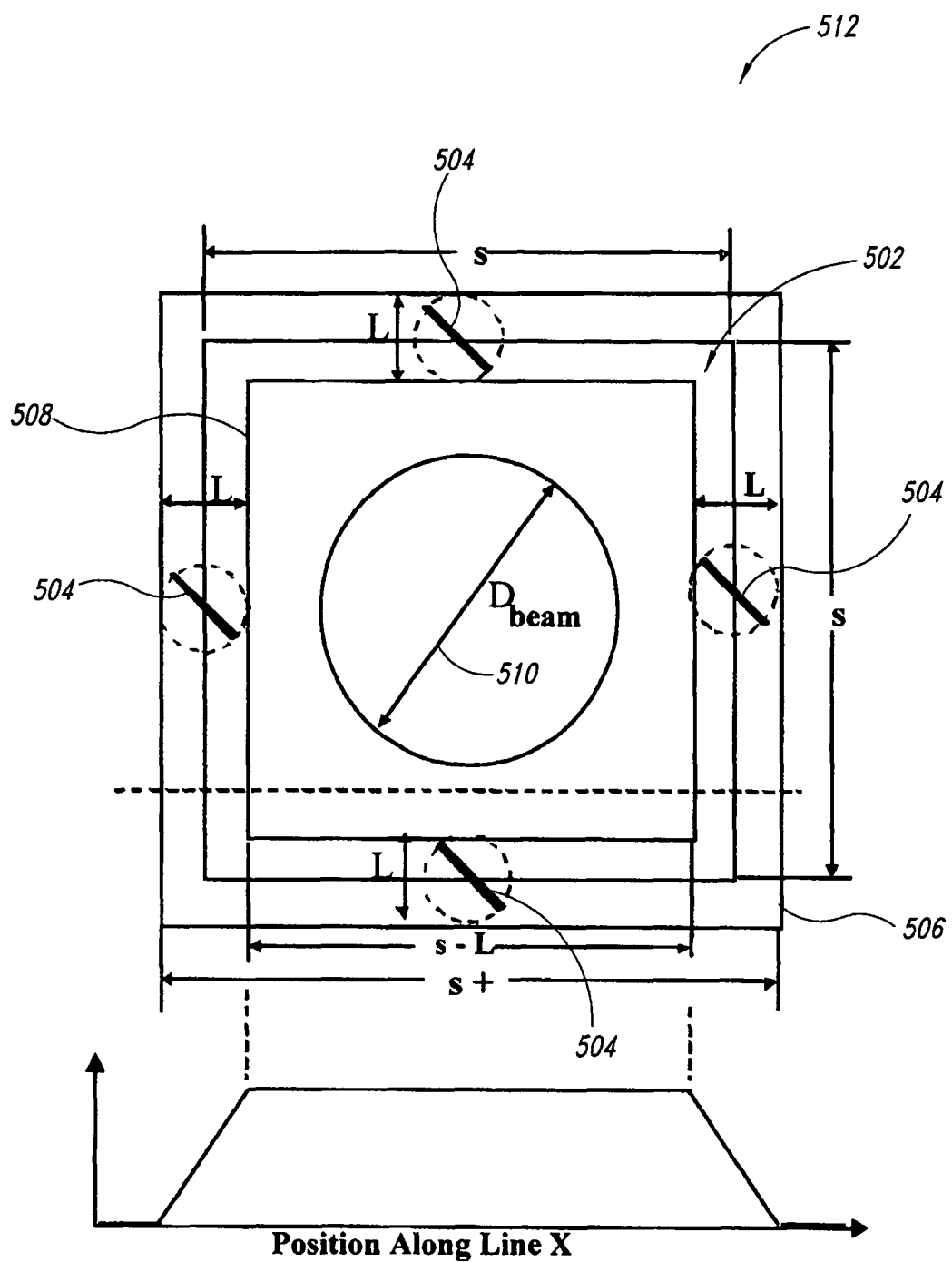
FIG. 18 is a schematic diagram of a nanowire assembly geometry according to one illustrated embodiment.

A way to address this is to evaluate the geometry of the nanowire assembly. FIG. 18 shows an exemplary geometry of the nanowire assembly. The square area 502 of side length(s) of nanowire centers 504 covers an area A=s$^2$. The number of nanowires is given by N=ρA, where ρ is the density of nanowires (nanowires per unit area). If a certain number (N) of nanowires is desired, then the side length(s) that is required to generate (N) nanowires is: s=(N/ρ)$^{1/2}$.

Figure 19:
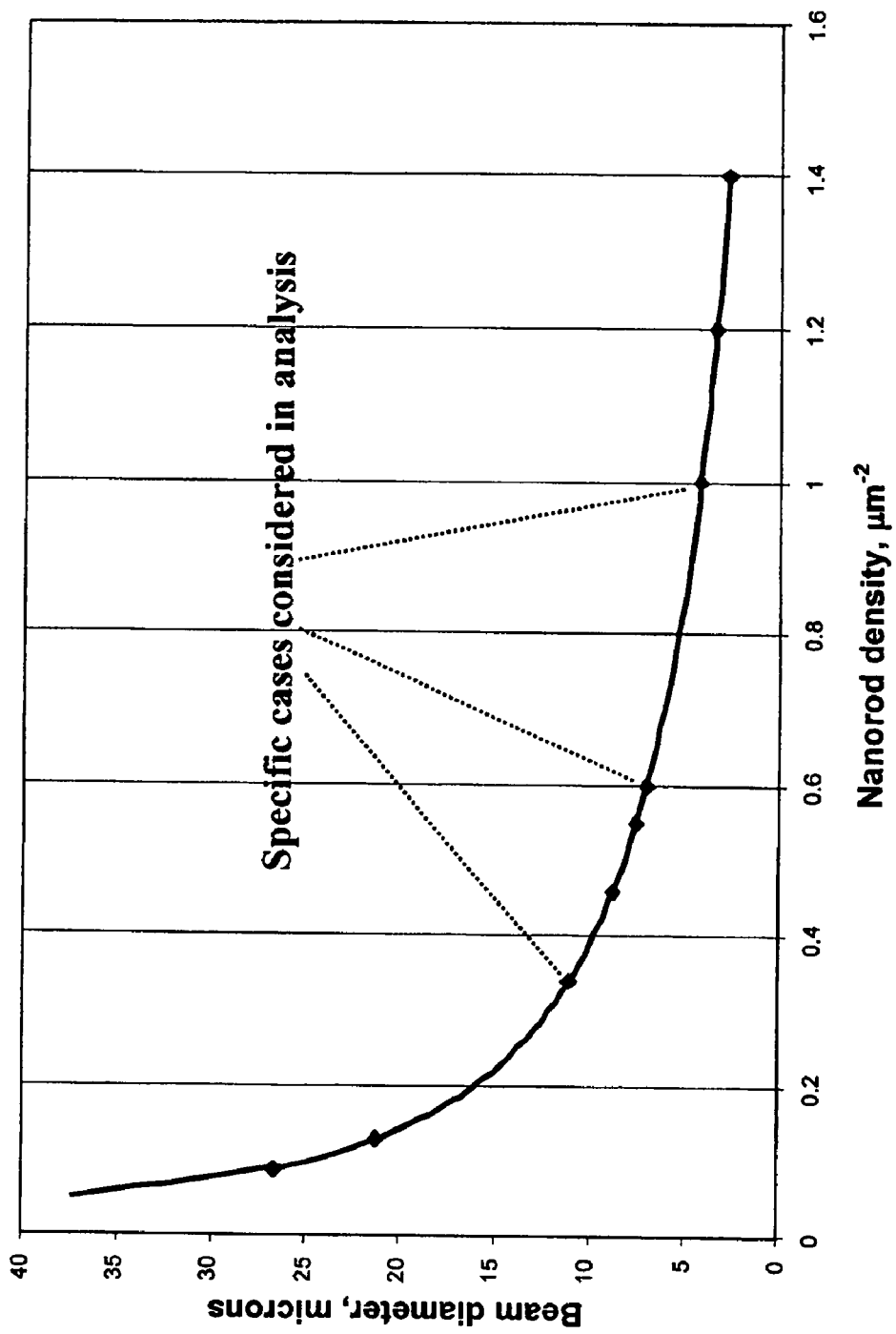
FIG. 19 is an exemplary beam diameter versus nanowire density plot according to one illustrated embodiment.

As an example, 206 was selected as the number (N) of nanowires to be used for all of the cases evaluated. The outer perimeter 506 of nanowires is a square whose side length is s+L. The uniform "plateau" region of maximum nanowire density covers a square area 508 whose side length is s−L. To avoid being influenced by edge effects, it is important for a beam that is incident on the nanowire film 512 to fit within the uniform plateau region 506 of side length s+L. In addition, it is possible (but unlikely) for a ray that strikes a nanowire to reflect sideways within the nanowire film volume, strike a second nanowire, reflect sideways again within the nanowire film volume, strike a third nanowire, and so on, before finally exiting the film. To avoid edge effects with these multiple bounce rays, the diameter ($D_{beam}$) 510 of the incident beam should be somewhat less than s−L. For the purposes of this analysis, $D_{beam}=(\frac{2}{3})(s-L)$ was selected to ensure that no edge effect occurred. The relationship between beam diameter ($D_{beam}$) and nanowire density ($\rho$) for N=206 and L=8 µm is illustrated in FIG. 19.

FIGS. 20A, 20B, and 20C show three assemblies 522, 524, 526 formed by a plurality of nanowires 10 (each having a length (L) of about 8 µm, and a diameter (D) of about 0.025 µm) being interrogated by collimated beams 528, 530, 532, respectively. Collimated beams 528 correspond to a beam diameter of 26.7 µm, collimated beams 530 correspond to a beam diameter of 7.02 µm, and collimated beams 532 correspond to a beam diameter of 2.75 µm. Assemblies 522, 524, 526 correspond to a nanowire network density of approximately 0.09 nanowires/µm², approximately 0.6 nanowires/µm², and approximately 1.4 nanowires/µm², respectively.

In some embodiments, it is important to determine the proper interrogation collimated beam diameter 510 since it affects the computational efficiency, as well as the statistical uncertainties associated with edge effects. For example, if a 26.7 µm beam diameter is used to evaluate a nanowire density of 1.4 µm⁻² (as shown 20C), the beam would be strongly affected by edge effects of the 206-nanowire assembly and the generated results would not be accurate. To avoid edge effects for this case would require the number of nanowires (N) to be set at 3232. Both the MATLAB and ZEMAX calculations would take an extremely long time for N=3232. On the other hand, if a 2.75 µm diameter beam 510 is used to evaluate a nanowire density of 1.4 µm⁻², the beam would be incident on only several nanowires and the statistical uncertainty of the simulation for that case would be very high. These problems may be avoided by automatically scaling the beam diameter 510 appropriately for each case. Scaling the beam diameter 510 as a function of, for example, nanowire density provides for a method to simultaneously reduce calculation times and statistical noise to manageable levels for all of the cases to be considered.

Referring to FIG. 16A, in some embodiments, the system 400 may further include one or more subcomponents 462 to aid in evaluating the optical properties of the nanowire assemblies. Examples of these components include a MATLAB subcomponent including a nanowire calculation program, a ZEMAX optical model subcomponent that includes an incident collimated beam, an assembly of nanowires, and an array of detectors, a ZPL (ZEMAX Programming Language) subcomponent operable to transfer MATLAB data into a ZEMAX format, and the like.

In some embodiments, the MATLAB subcomponent is operable to receive input parameters (e.g., a nanowire length (L), a nanowire diameter (D), a nanowire density ($\rho$), a number of nanowires (N), and the like). The MATLAB subcomponent generates the side length (s) of the area 502 of nanowire centers 504, based on (N) and ($\rho$). The MATLAB subcomponent generates x and y coordinate ranges over which the nanowire centers 504 will be uniformly distributed randomly. The MATLAB subcomponent assigns a random (x, y) center position and $\theta$ orientation for each nanowire, and assigns a positions (z) to nanowires one at a time, where the position (z) selected is the minimum position (z) that avoids mechanical interference (e.g., avoid physical overlap) with other nanowires.

In some embodiments, the MATLAB subcomponent is operable to scale all dimensional parameters to be consistent with a corresponding ZEMAX model. The MATLAB subcomponent is further operable to generate a summary matrix that includes a header line containing (N), the total aggregate z thickness, the nanowire diameter (D), and the nanowire length (L), and N lines containing (x, y, z, $\theta$) for each nanowire. The MATLAB subcomponent generates a summary matrix in, for example, an ASCII file, and stores it in memory.

The MATLAB subcomponent is operable to place nanowires one by one onto the minimum possible (z) position that avoids overlap, the MATLAB subcomponent makes the following approximation—the nanowire is parallel to the plane of the substrate (i.e., the orientation vector along the long axis of the nanowire has an x and y component, but no z component). In reality, like placing toothpicks on top of one another on a flat surface, the orientation vector of a nanowire lying on top of other nanowires will likely have a small z component. The resultant error in neglecting this z component is very small as long as the L/D ratio is much greater than 1, which is true for almost all of the cases considered. Without this approximation, the task of calculating how to lay down the nanowires to avoid interference with one another would have become enormously more difficult.

In some embodiments, the ZEMAX subcomponent is operable to generate an assembly of N nanowires whose random positions and orientations are determined in MATLAB and subsequently communicated to a ZEMAX subcomponent from a data file using, for example, a ZPL macro. The ZEMAX subcomponent is further operable to deliver a collimated beam of normally incident light onto an array of nanowires and to trace the rays to their final destinations. In some embodiments, the ZEMAX subcomponent is further operable to determine at least one of a zero order (unscattered) transmittance, a transmittance into a solid angle cone of 2.5 degree half angle, an integrated transmittance into the forward hemisphere, and a backward reflectance into the rear hemisphere.

ZEMAX subcomponent is further operable to generate a false color map for each of the following parameters:
Irradiance vs. spatial position of zero-order transmitted beam,
Radiant intensity vs. angle of the transmitted beam within a 2.5 degree half angle cone,
Radiant intensity vs. angle of the beam transmitted into the forward hemisphere, and
Radiant intensity vs. angle of the beam scattered and reflected into the rear hemisphere.

In some embodiments, the ZEMAX subcomponent is further operable to determine the following optical parameters from ZEMAX data.
Haze=[(integrated transmittance into forward hemisphere)−(transmittance into a solid angle cone of 2.5 degrees half angle)]/(integrated transmittance into forward hemisphere).
Absorbance=1−forward integrated transmittance−backward integrated reflectance/scatter.

In some embodiments, the ZPL Macro subcomponent is operable to input MATLAB data into the ZEMAX subcomponent from a data file that is stored memory.

In some embodiments, the ZPL Macro subcomponent is further operable to provide the total thickness of the aggregate layer of nanowire assemblies, provide the length and diameter of each nanowire, and provide the (x, y, z) position and $\theta$ orientation of each nanowire based on the inputted MATLAB data.

Example 5

Theoretical Results for a Single Silver Nanowire

Figure 21:
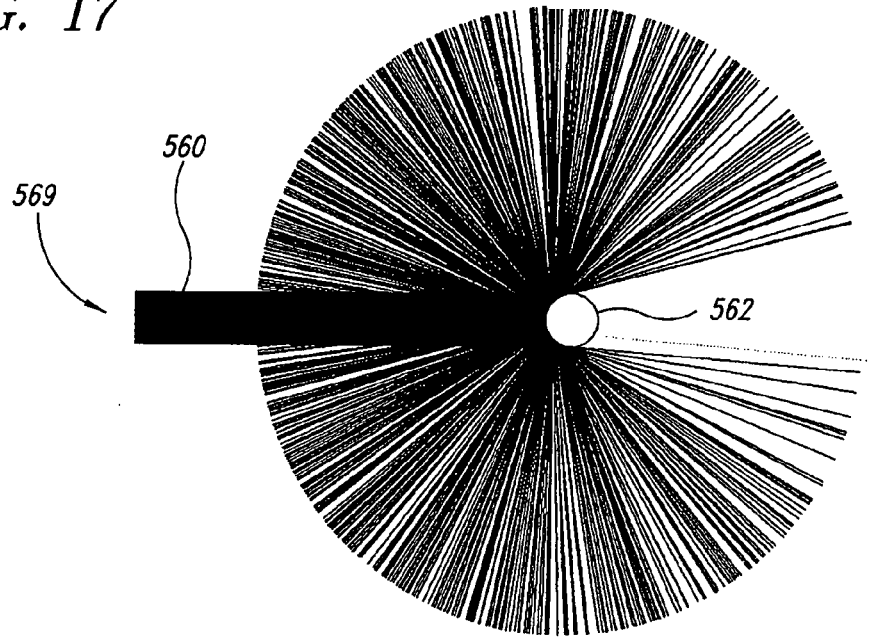
FIG. 21 is a side cross-sectional view of a collimated beam and corresponding reflection from a nanowire according to one illustrated embodiment.

In some embodiments, an appropriate starting point for an analysis of nanowire assemblies is to evaluate the optical performance of a single nanowire since the performance of the aggregate assembly is likely to primarily be a superposition of the performances of the individual nanowires. FIG. 21 is a side view of a collimated beam 560 incident on a nanowire 562, including reflection components 566. Each ray 564 that is incident on the nanowire 562 is reflected at an off-axis angle relative to the incident beam 560 direction. The greatest concentration of reflected rays 566 is generally at retroreflection (180° from the incident beam 560). As the reflection angle α decreases from 180° to 0°, the intensity of the reflected beam 566 monotonically decreases to a limit of 0 at 0° off-axis angle. It can be shown that for a 100% reflective rod, the intensity (I) of the reflected beam, in units of flux per unit angle, is given by:

$$I=\cos(\alpha/2) \quad (\text{eq. 6})$$

Figure 22:
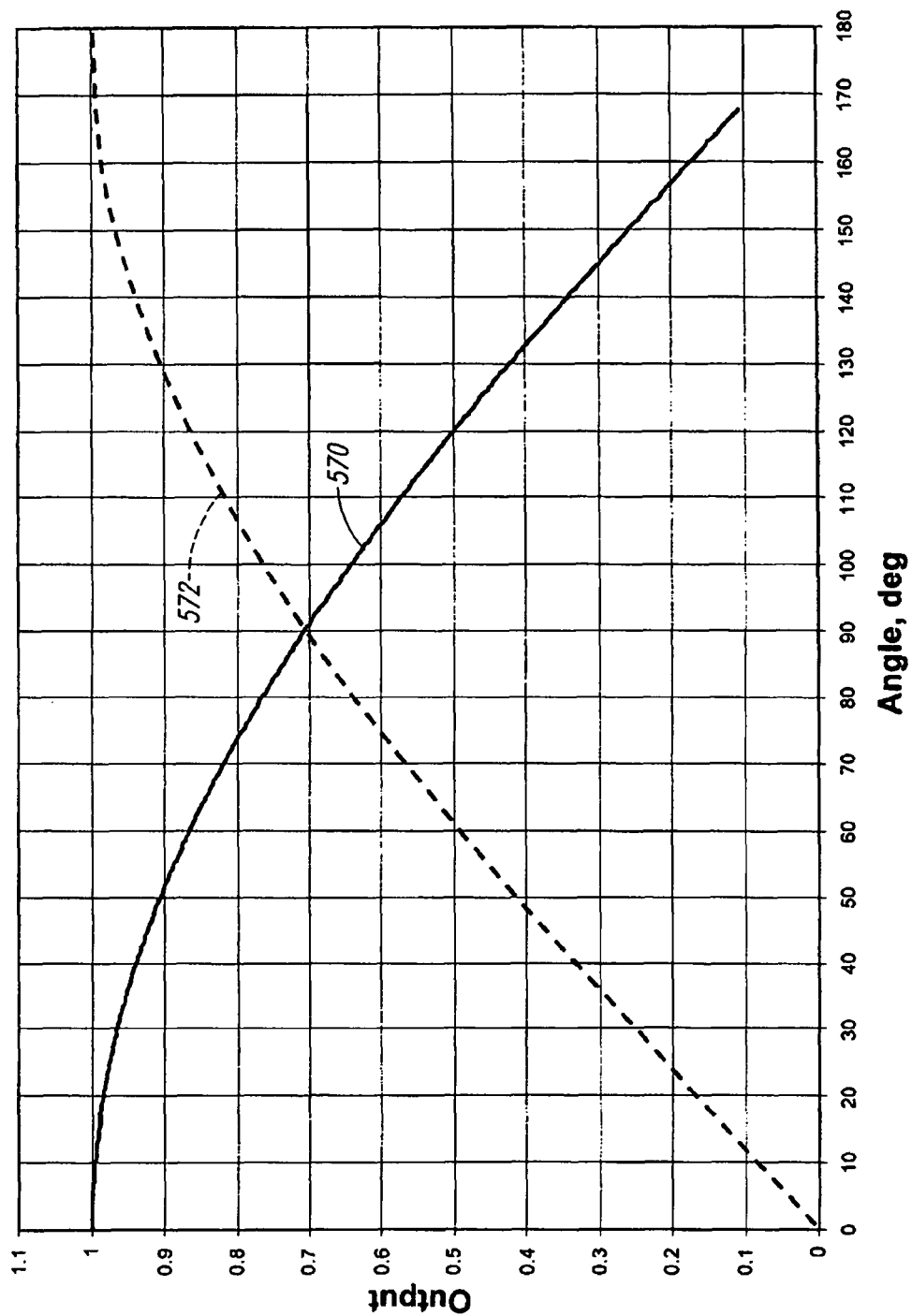
FIG. 22 is an exemplary beam intensity and integrated flux versus reflection angle plot according to one illustrated embodiment.
Figure 23:
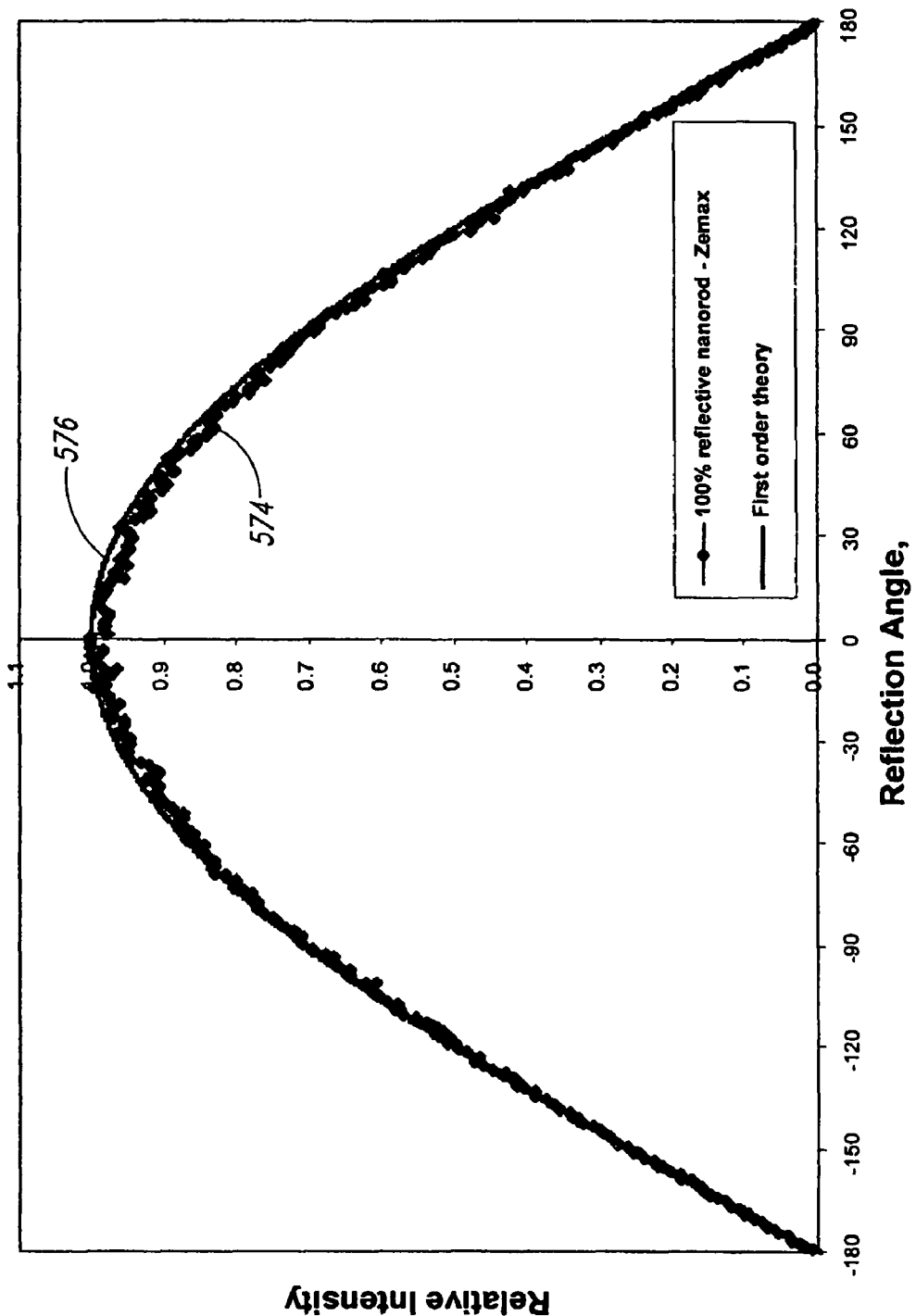
FIG. 23 is an exemplary relative intensity versus reflection angle plot according to one illustrated embodiment.

The integrated relative flux Φ (normalized to 1) at angle α is calculated by integrating I over the range from about 0° to about α. The beam intensity 570 and integrated flux 572 versus reflected angle are illustrated in FIG. 22. FIG. 23 shows a comparison between ZEMAX modeling results for the reflective nanowire 562 depicted in FIG. 21 and equation 6 for Reflected intensity versus reflection angle (α), as well as the agreement between ZEMAX results 574 and first order theory 576.

Figure 24:
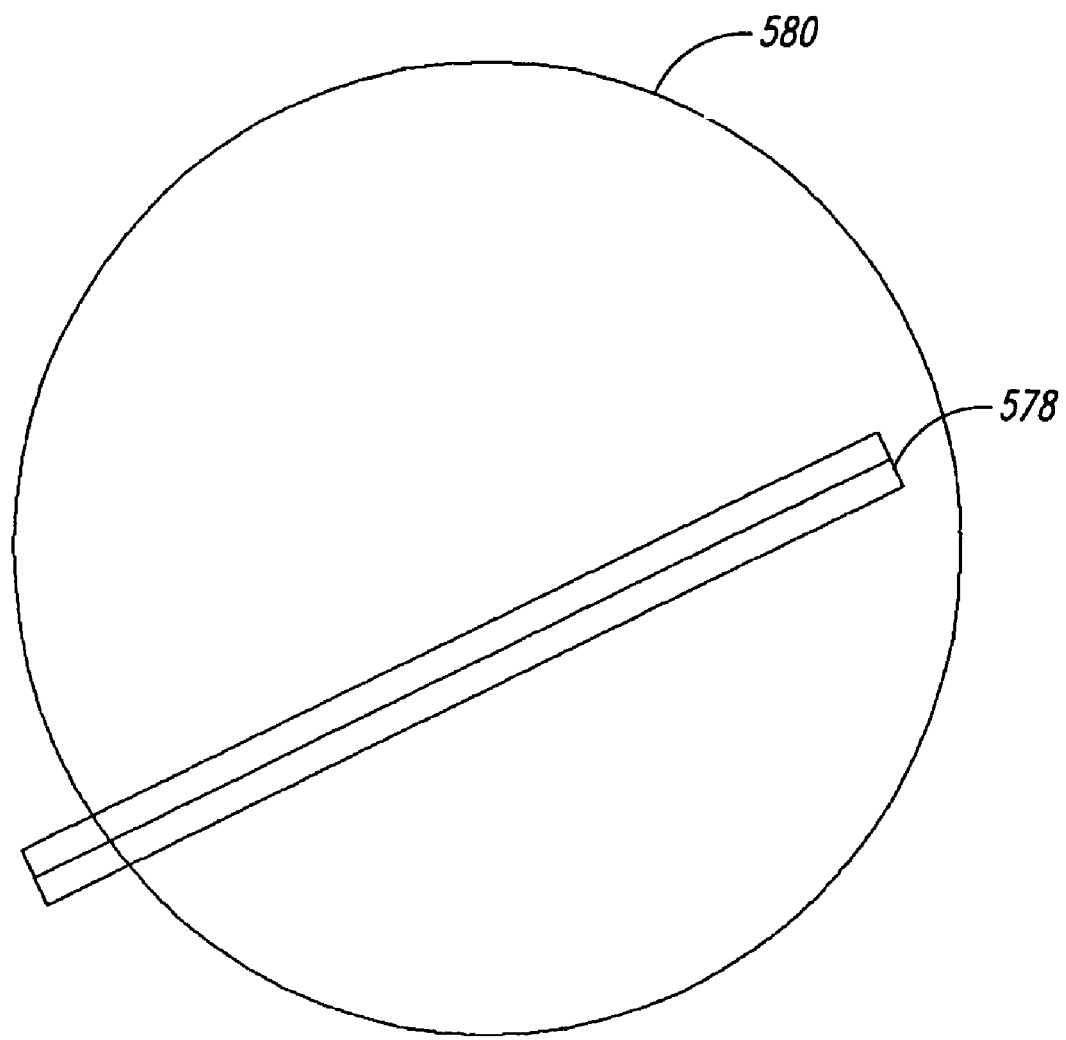
FIG. 24 is a top plan view of a single nanowire interrogated by an incident collimated beam according to one illustrated embodiment.
Figure 25A:
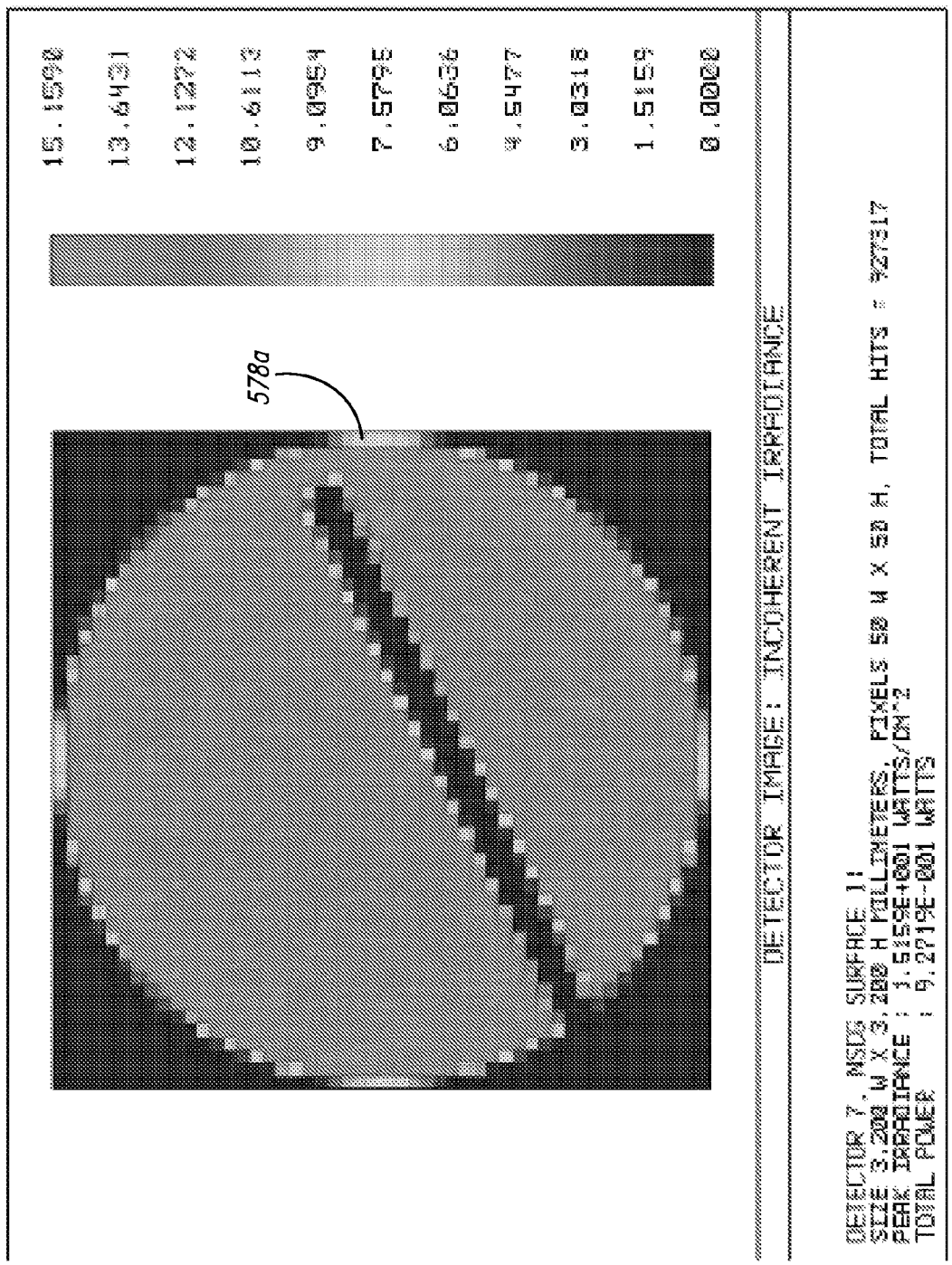
FIGS. 25A, 25B, 25C, and 25D are beam data maps for a single nanowire illuminated with a normal incident beam according to multiple illustrated embodiments.
Figure 25B:
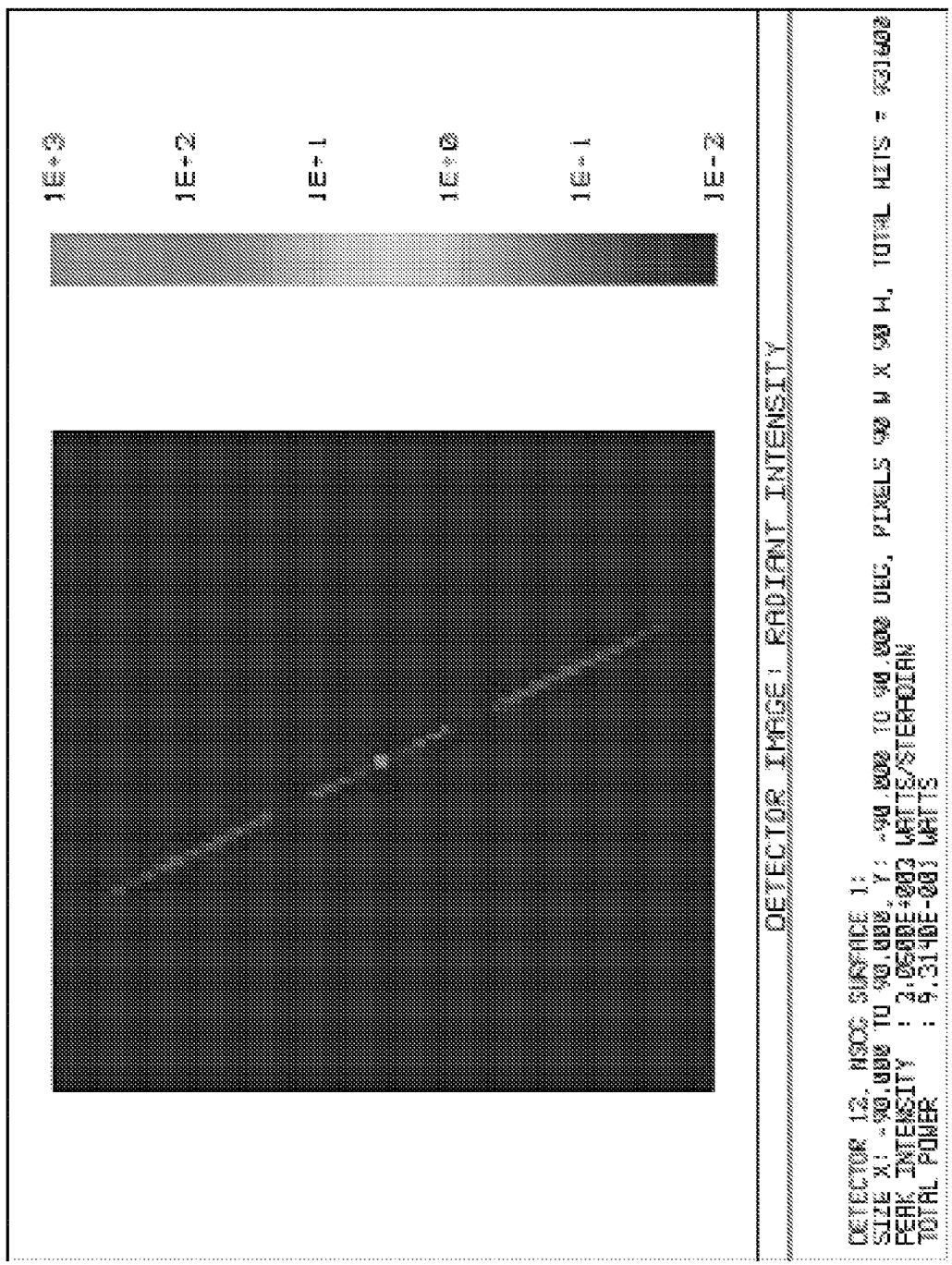
Figure 25C:
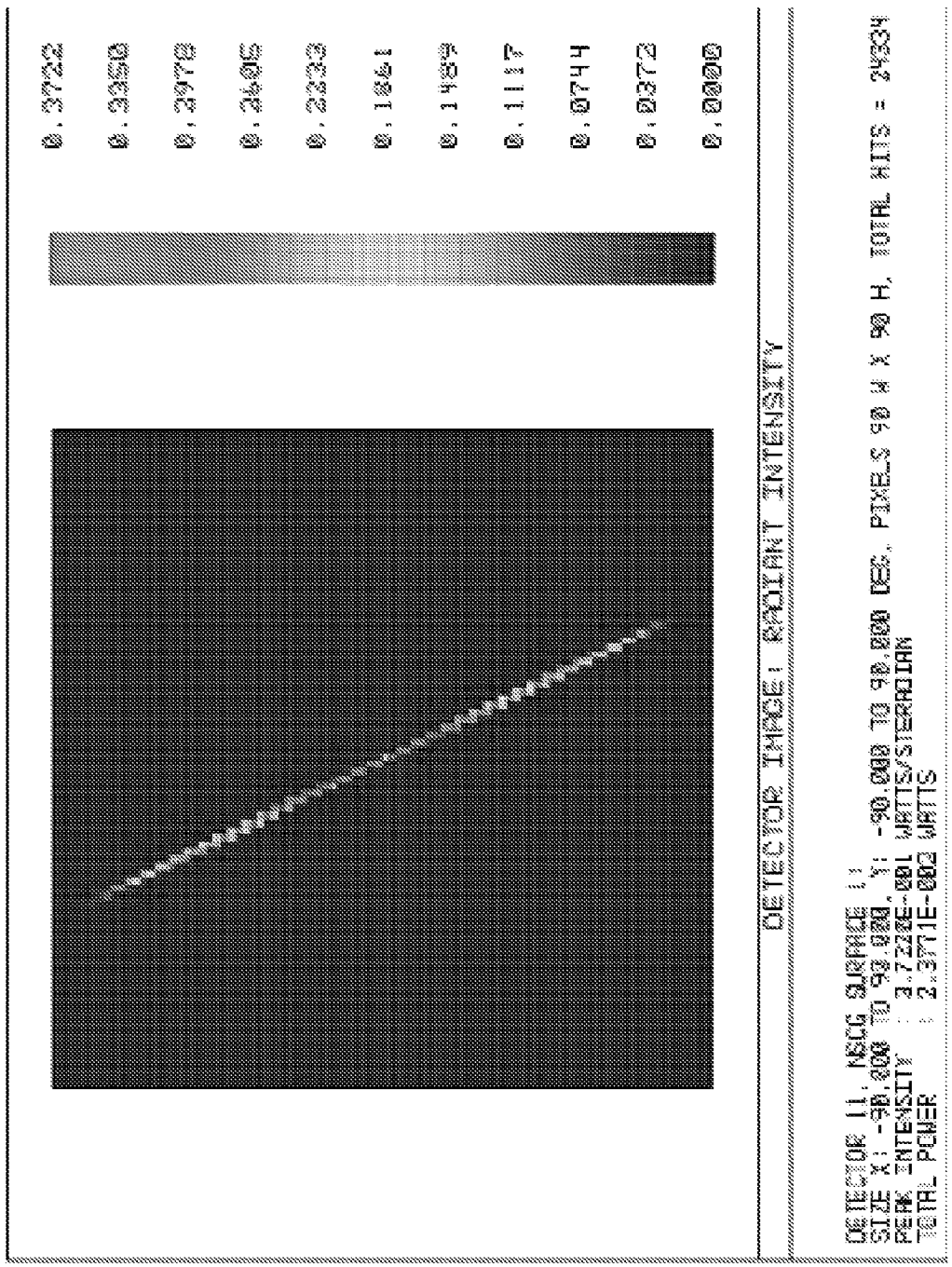
Figure 25D:
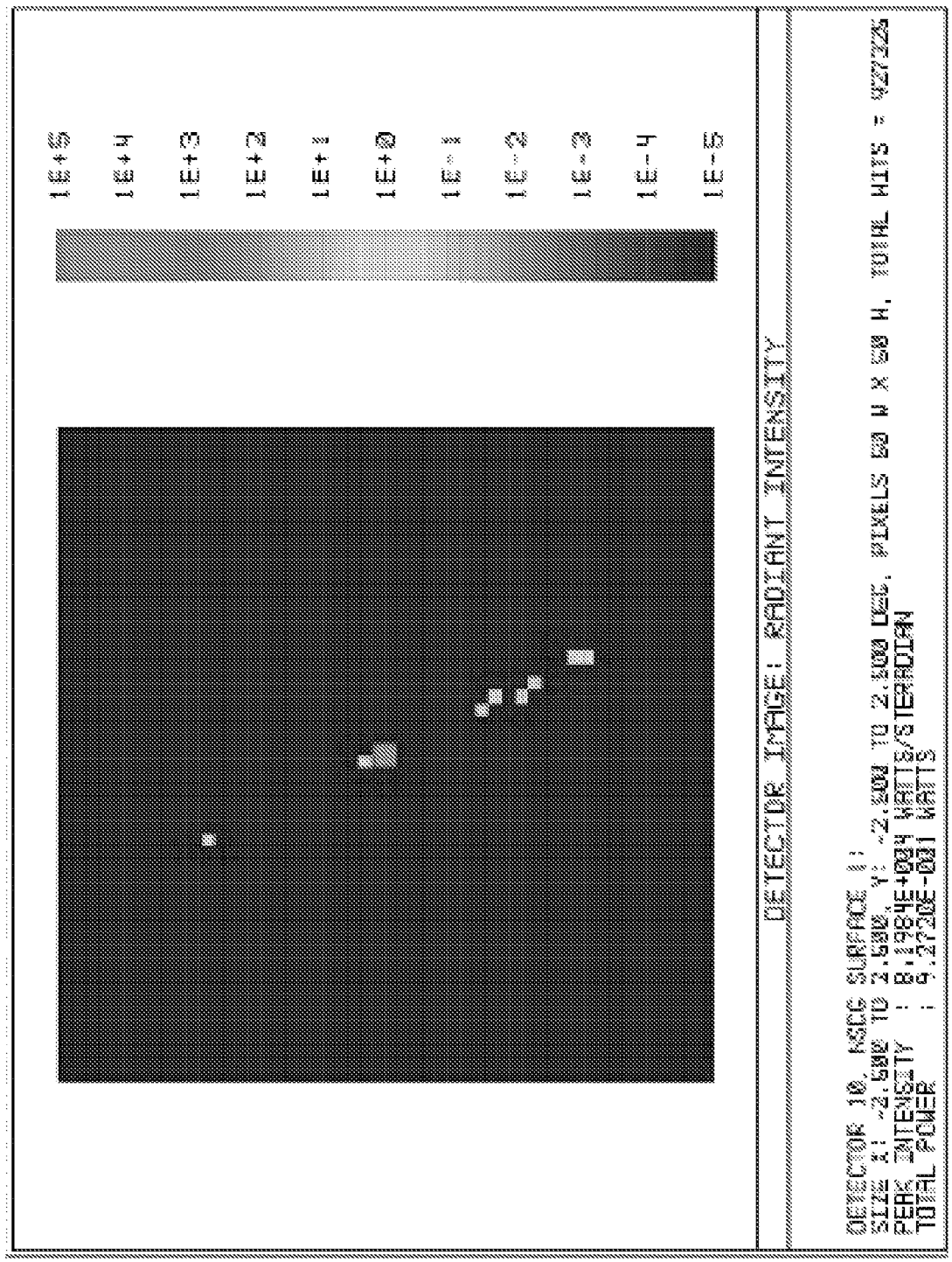

FIG. 24 shows a single tilted silver nanowire 578 being interrogated by a collimated beam 580 at normal incidence. In the illustrated embodiment, the wavelength of the beam 580 is approximately 555 nm, which is the peak of the photopic response curve. As shown in FIGS. 25A through 25D, the optical effect of the single nanowire 578 on the incident beam 580 is illustrated in the transmitted zero-order beam data map shown in FIG. 25A, the beam transmitted into the forward hemisphere data map shown in FIG. 25B, the beam reflected into the rear hemisphere data map shown in FIG. 25C, and the beam transmitted into a 2.5° half angle data map shown in FIG. 25D.

The nanowire creates a dark shadow 578a in the zero-order transmitted beam. In addition, the light that is reflected off of the nanowire 578 into the forward and rear hemispheres lies within a single plane that is perpendicular to the long dimension of the nanowire 578. This is due to the cylindrical shape of the nanowire 578, which has curvature or optical power in one direction only. In some instanced, the light reflected into the forward hemisphere was so dim that a log scale was used to visualize this light.

Example 6

Theoretical Results for Silver Nanowire Assembly

Figure 26:
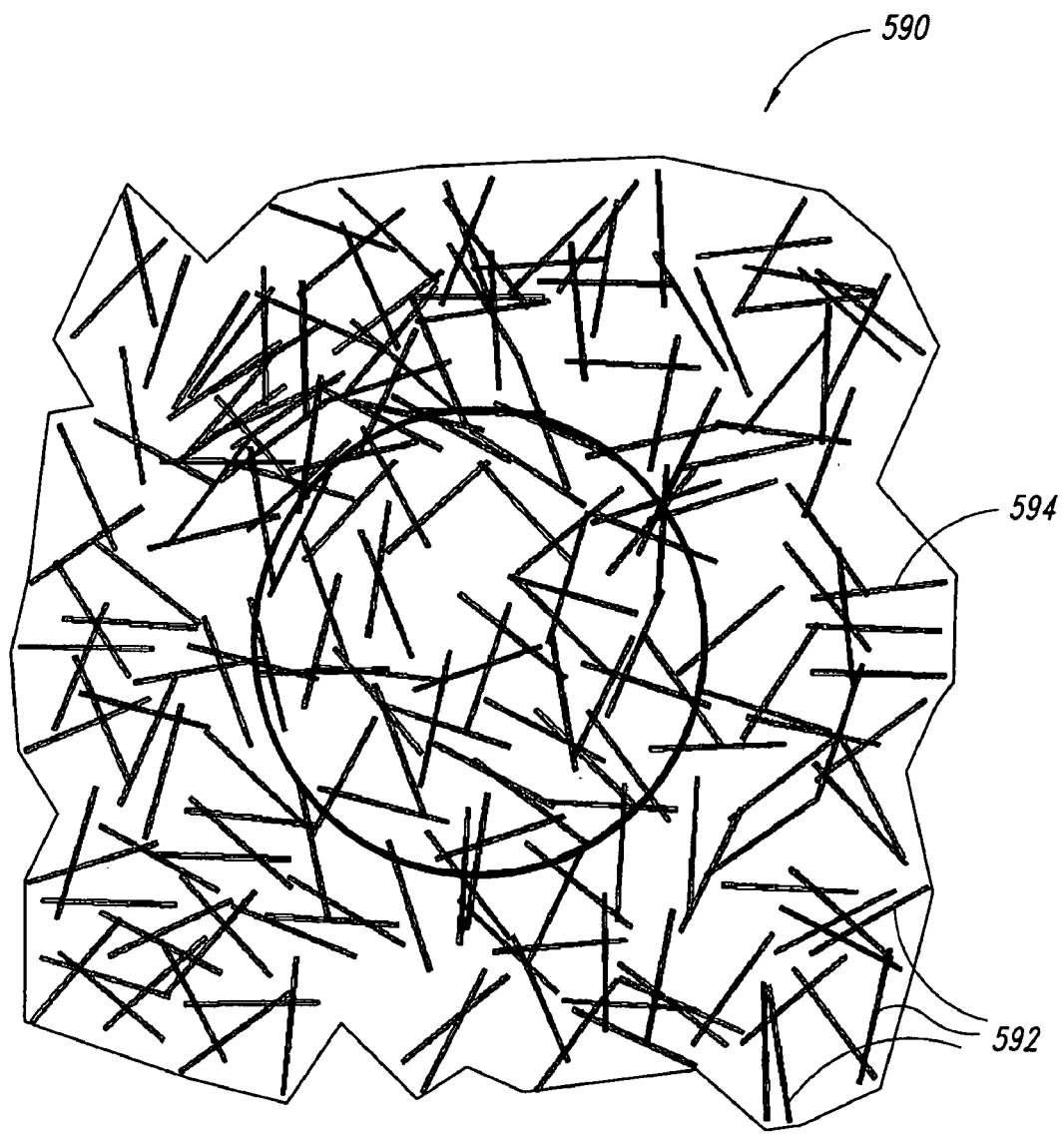
FIG. 26 is a top plan view of a random assembly of a plurality of nanowires according to one illustrated embodiment.
Figure 27:
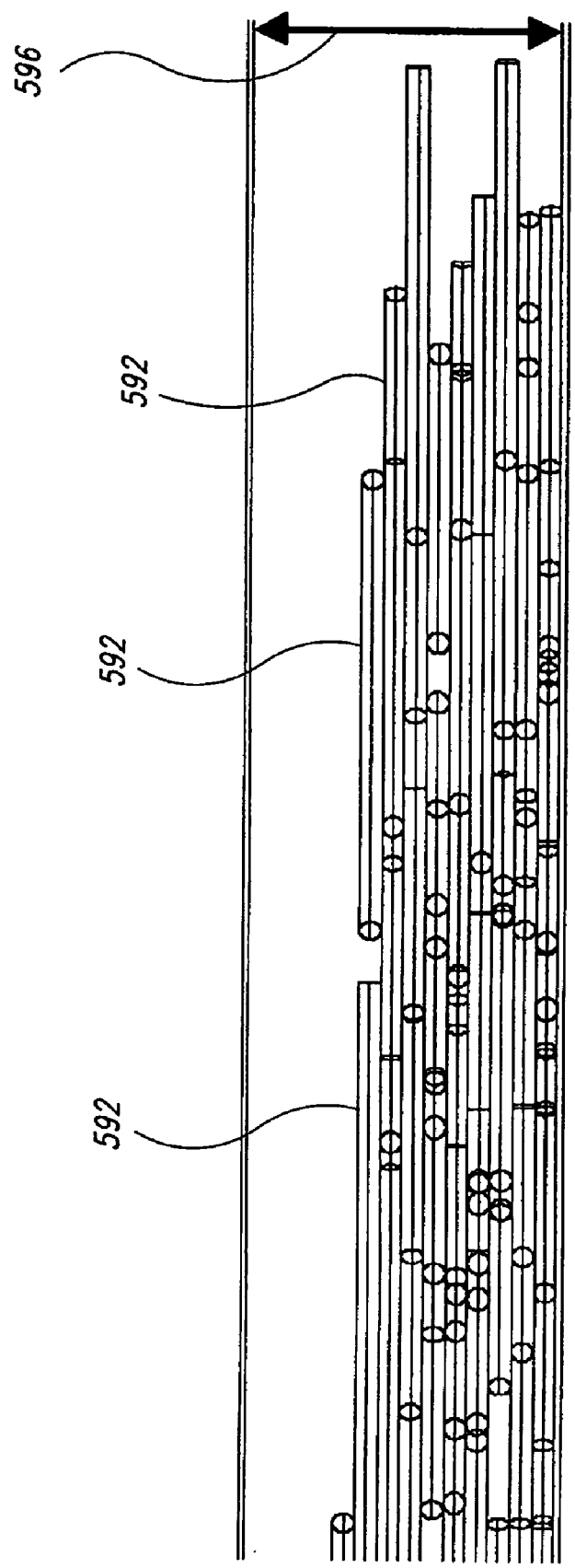
FIG. 27 is an expanded side view of the nanowire assembly in FIG. 26 according to one illustrated embodiment.
Figure 28A:
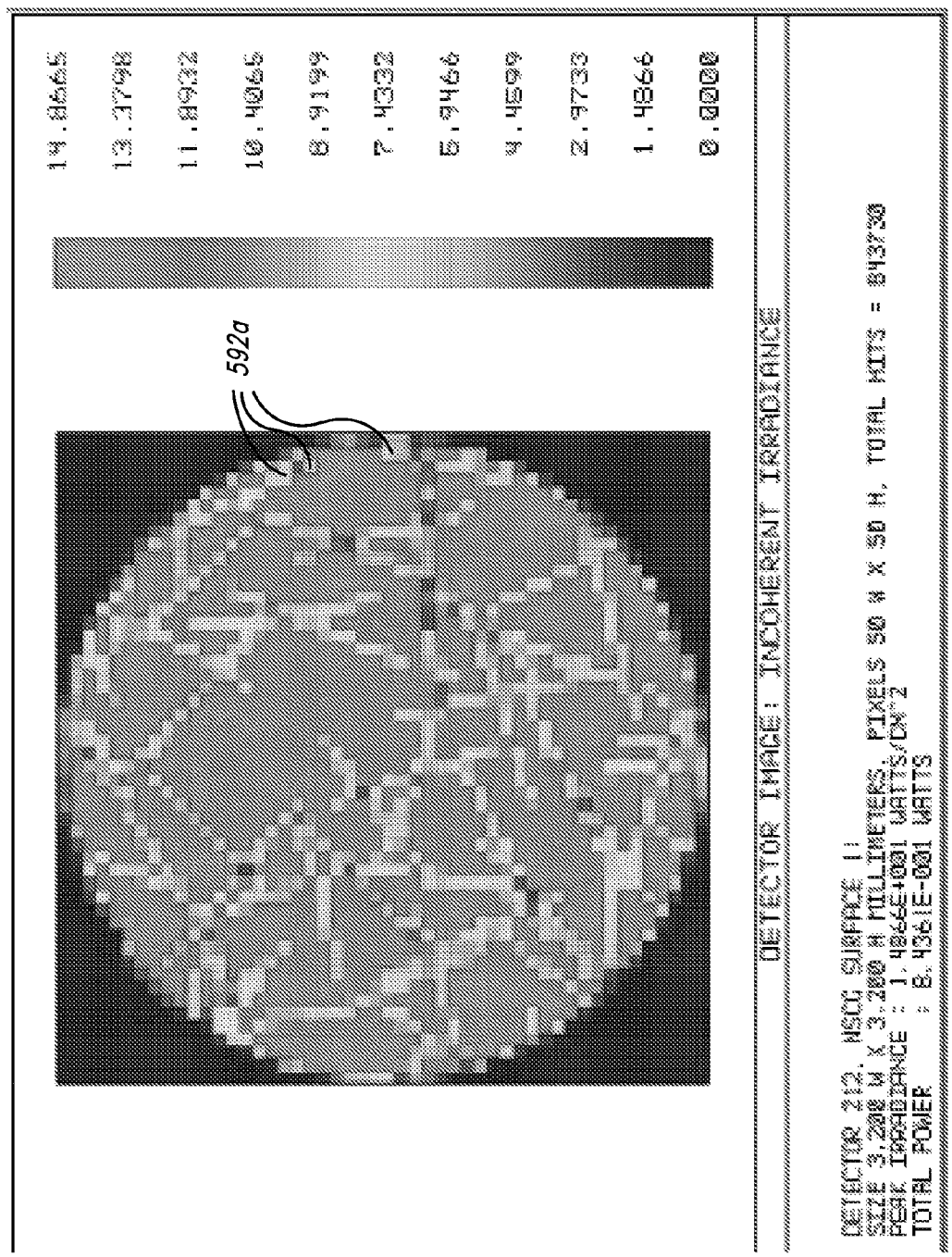
FIGS. 28A, 28B, 28C, and 28D are beam data maps of the nanowire assembly in FIG. 26 illuminated with a normal incident beam according to multiple illustrated embodiments.
Figure 28B:
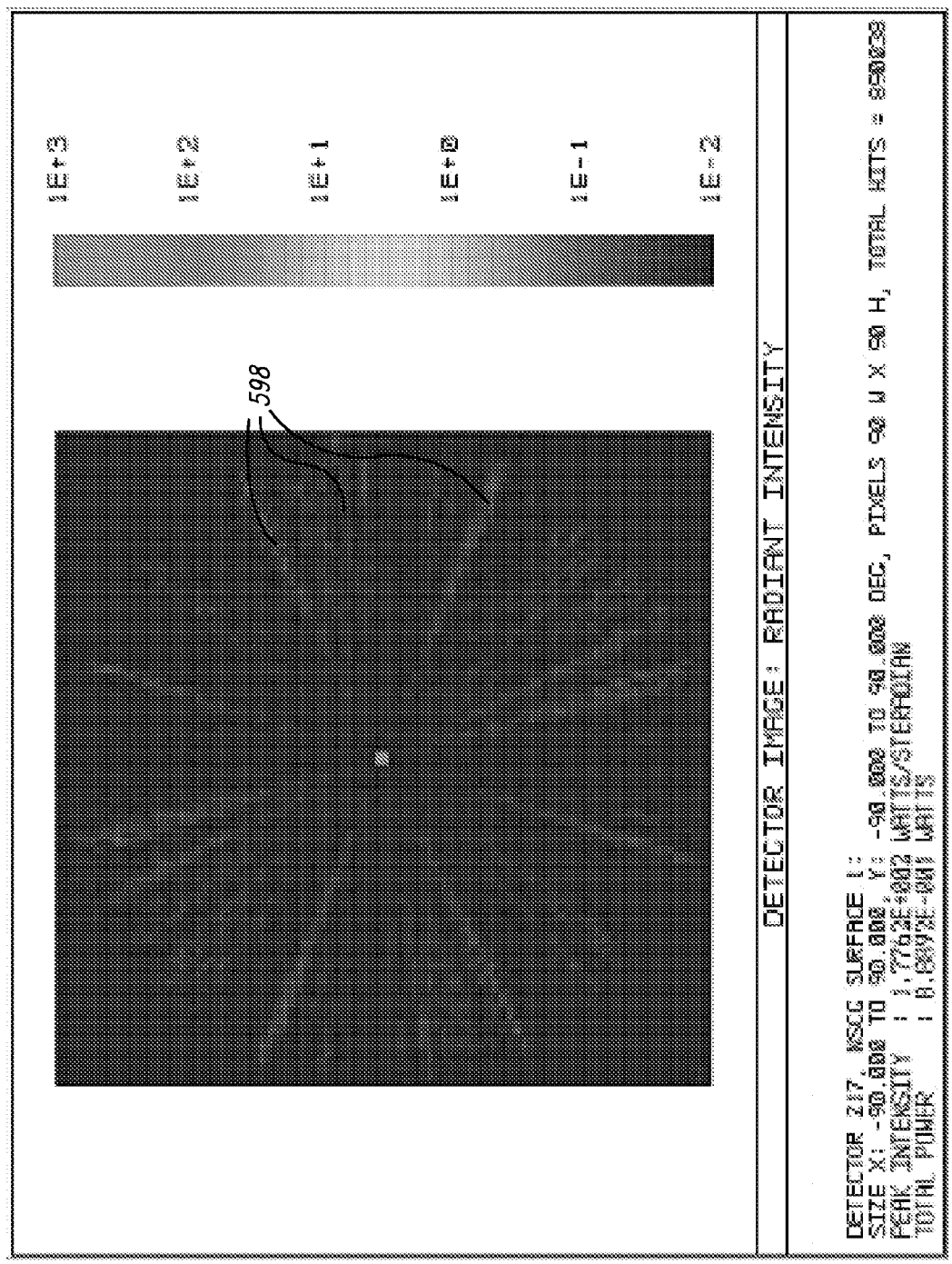
Figure 28C:
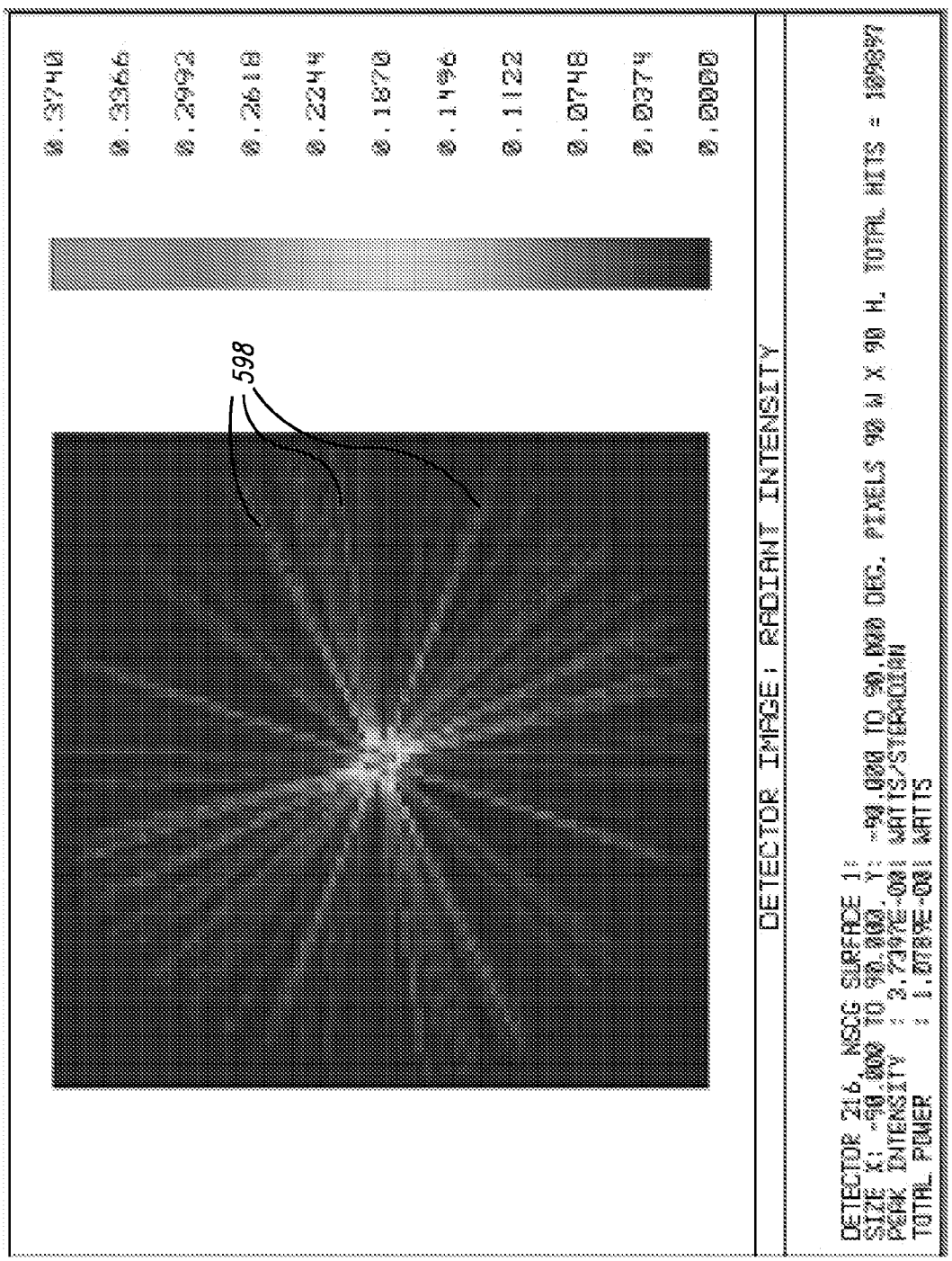
Figure 28D:
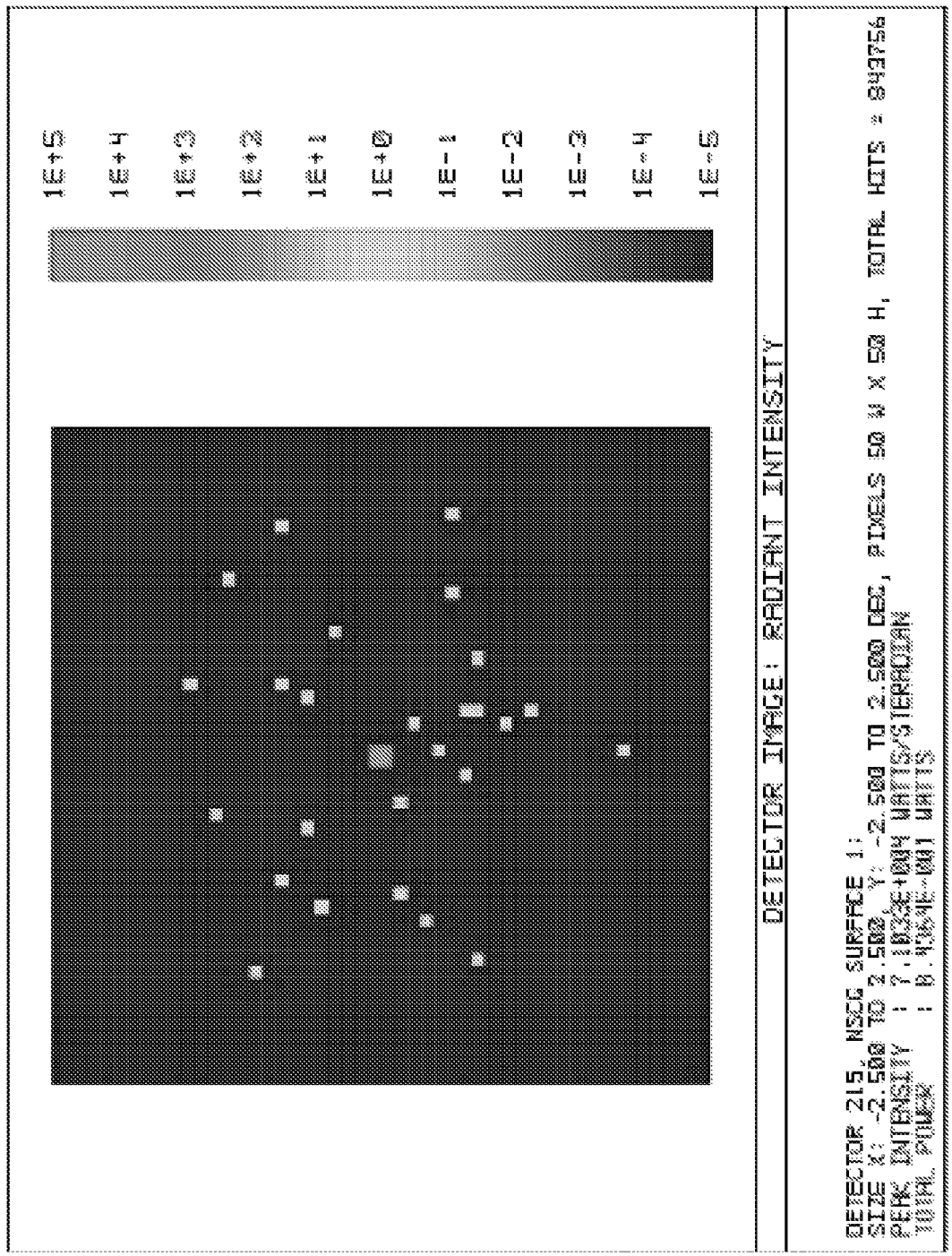
Figure 29A:
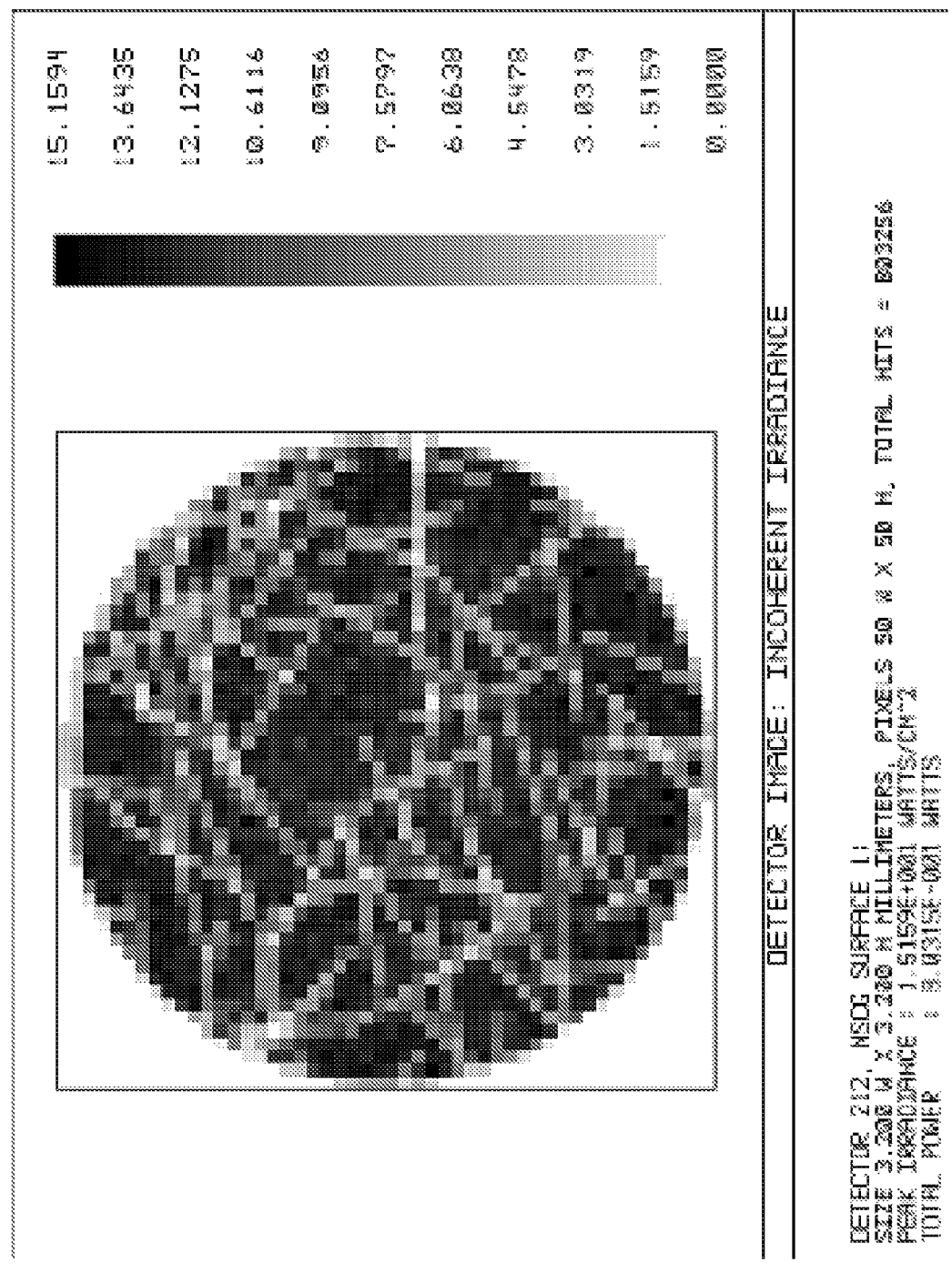
FIGS. 29A, 29B, 29C, and 29D are beam data maps of the nanowire assembly in FIG. 26 illuminated with a 45° off-axis incident beam according to multiple illustrated embodiments.
Figure 29B:
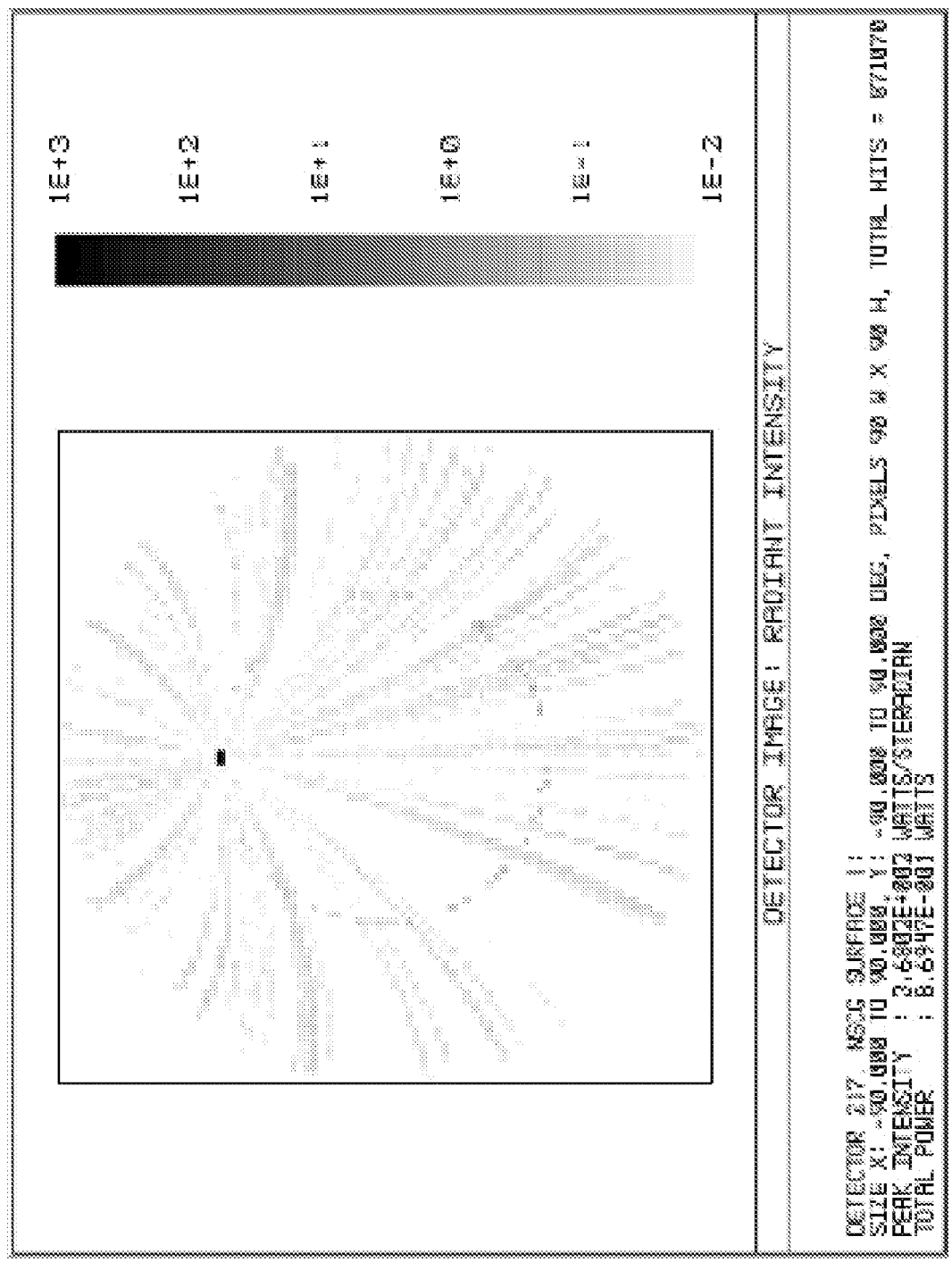
Figure 29C:
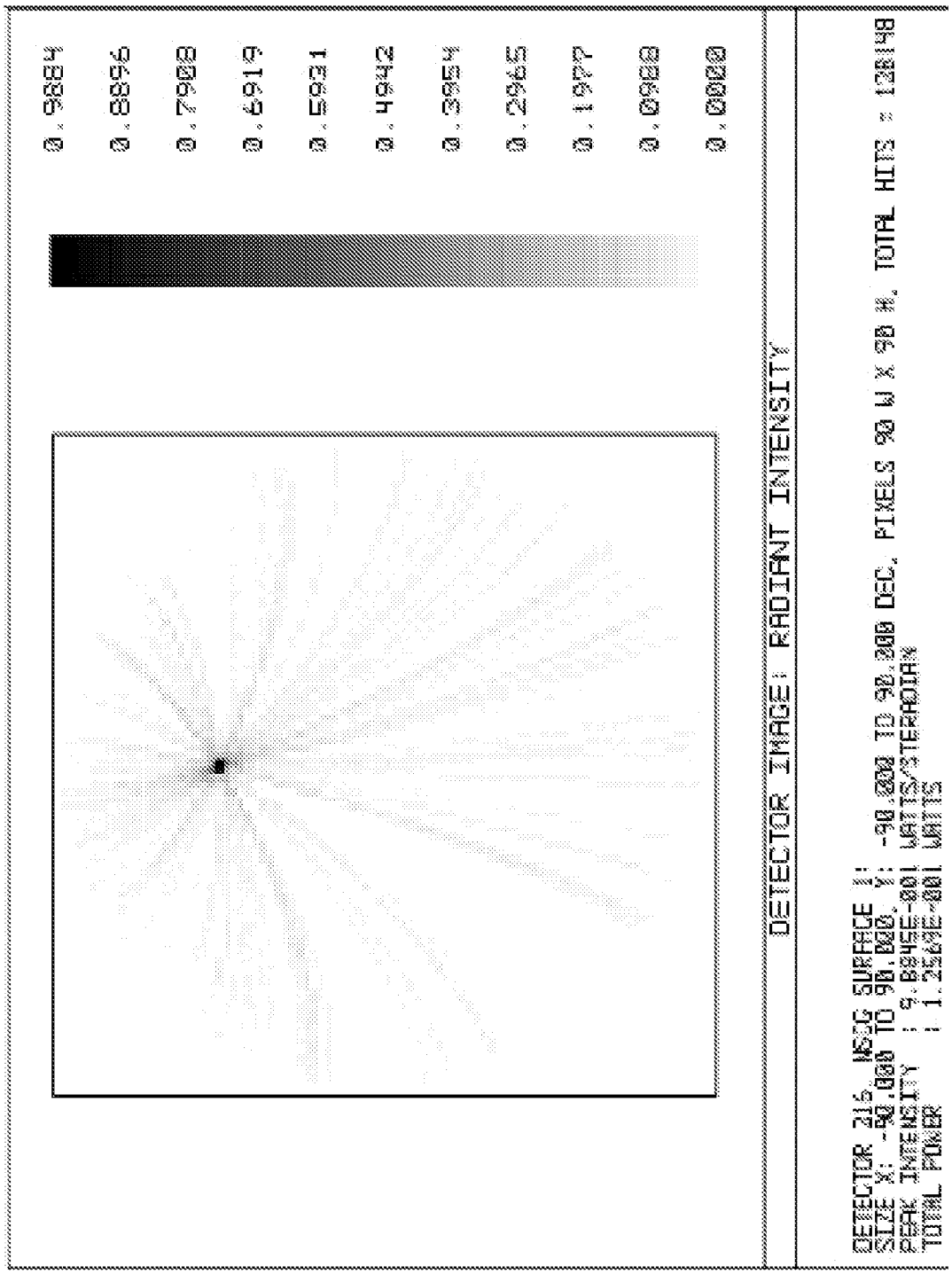
Figure 29D:
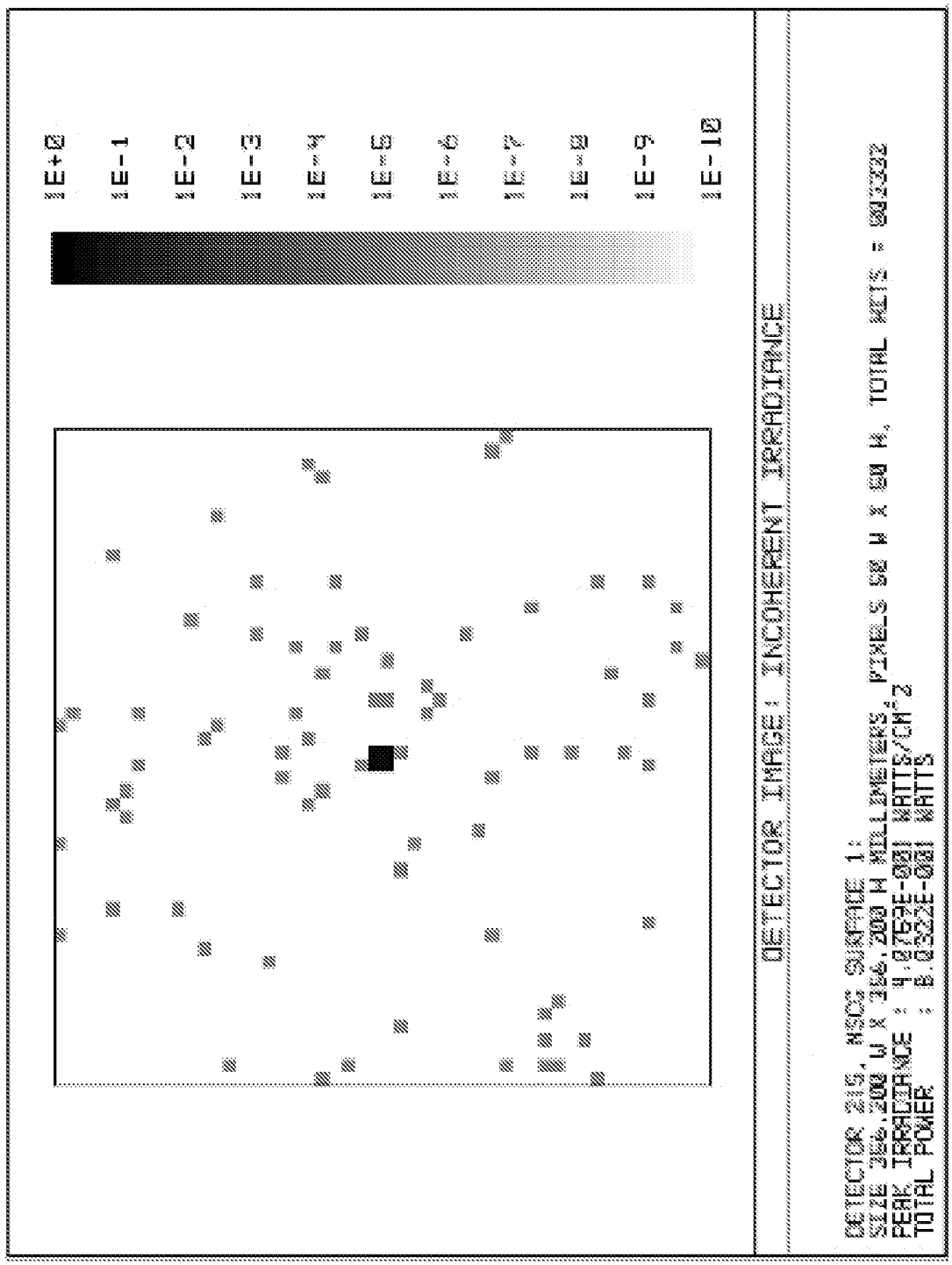

The optical performance of an assembly of nanowires can be derived by superimposing the individual performances of each nanowire. FIG. 26 is an assembly 590 of 206 randomly positioned, randomly oriented nanowires 592 (each having a length (L) of about 8 μm and a diameter (D) of about 0.25 μm) having a nanowire network density ρ of about 0.0892 μm$^{-2}$). FIG. 27 is a side view of the same assembly, showing how the nanowires 592 are stacked upon one another to just touch each other to avoid mechanical interference (i.e., overlap) with one another. FIGS. 28A through 28D show the optical effect of the silver nanowire assembly on the collimated incident beam ($D_{beam}$=26.7 μm) at 555 nm. The shadow effect 592a of the nanowires 592 can be seen in the map of the zero order transmitted beam (FIG. 28A), and the reflection off of the nanowires shows up as a multitude of radial lines 598 in the forward hemisphere and rear hemisphere maps (FIGS. 28B and 28C respectively). If the beam diameter is large enough to cover millions of nanowires, then the discrete lines would blur together into a radially symmetric continuum of light.

In some embodiments, the effect of having an off-axis incident beam was analyzed. The simulation shown in FIGS. 28A through 28D was repeated with the incident angle changed from about 0° to about 45° off-axis. The resultant optical performance is illustrated in FIGS. 29A through 29D. The key difference is that the reflected radial bands are shaped as curved arcs instead of straight lines. In addition, the following changes have occurred:

Zero order transmittance: 84.41%→80.36%

Forward integrated transmittance: 88.91%→87.00%

Backward integrated reflectance: 10.78%→12.51%

Haze: 5.05%→7.61%

Absorbance: 0.32%→0.49%.

Figures 30A, 30B:
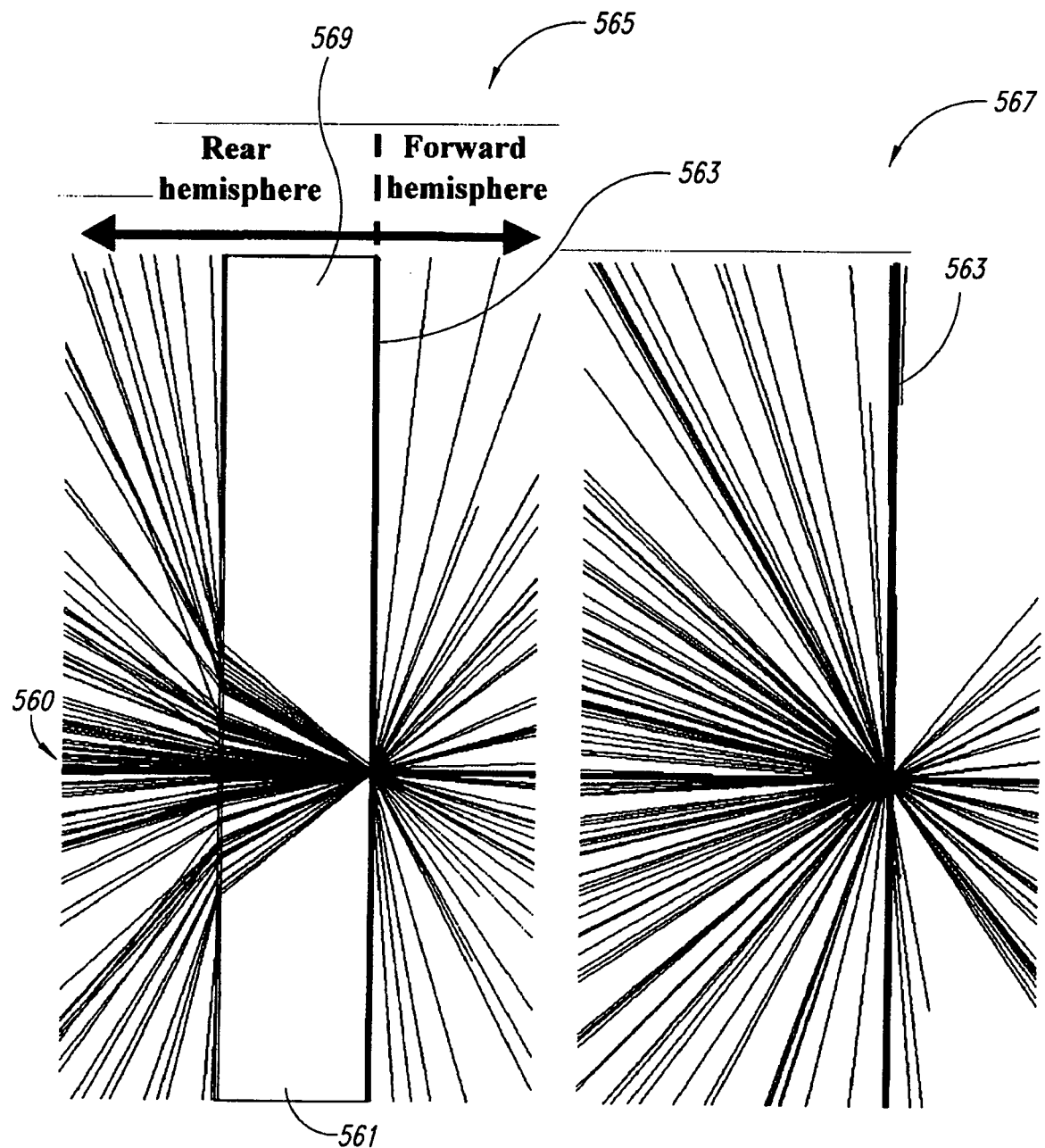
FIGS. 30A and 30B are side cross-sectional views of light rays reflected off of a nanowire assembly with and without a PET layer according to multiple illustrated embodiments.
Figure 31A:
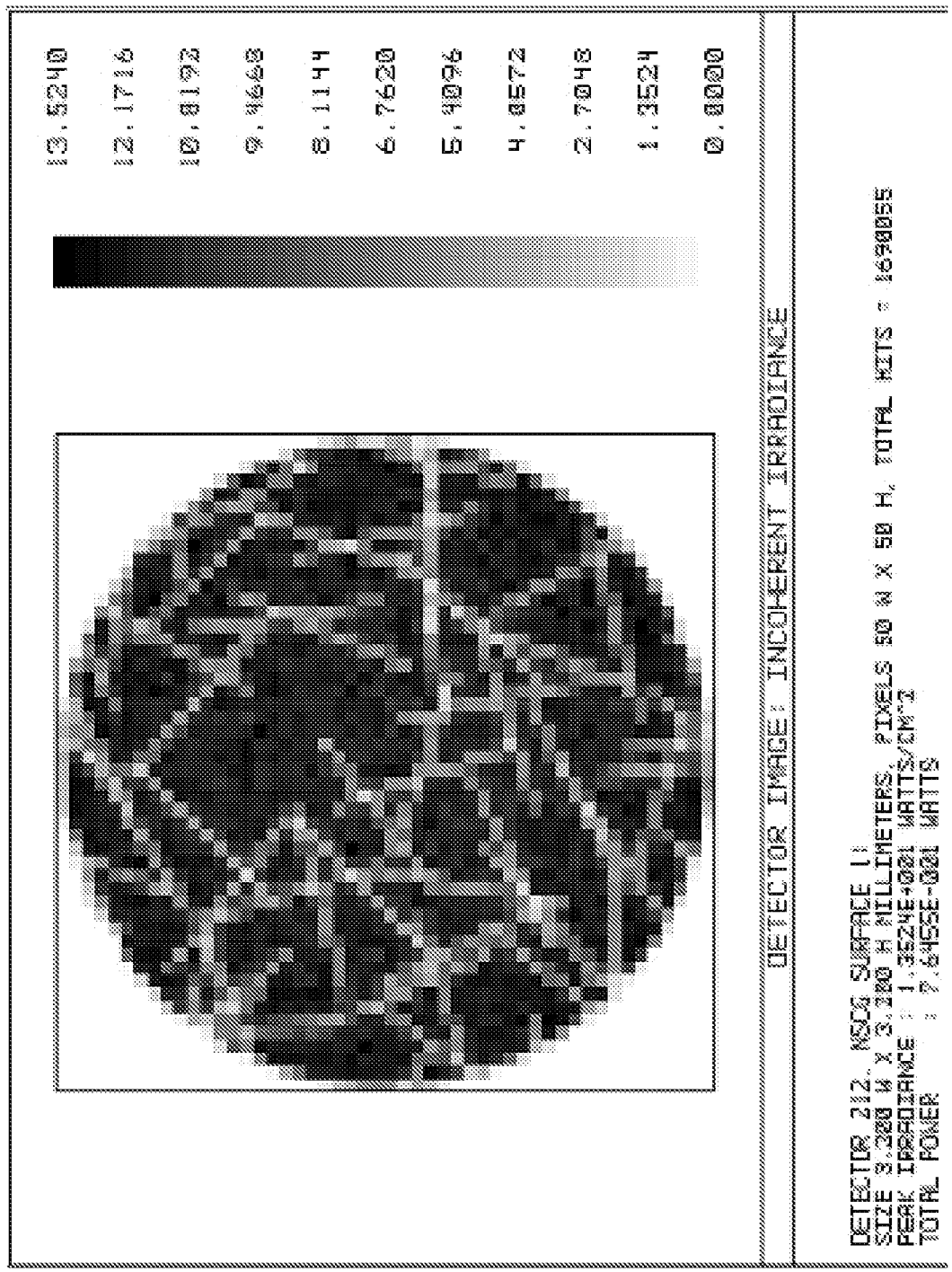
FIGS. 31A, 31B, 31C, and 31D are beam data maps of the nanowire assembly in FIG. 26 demonstrating the optical effect of adding a PET substrate according to multiple illustrated embodiments.
Figure 31B:
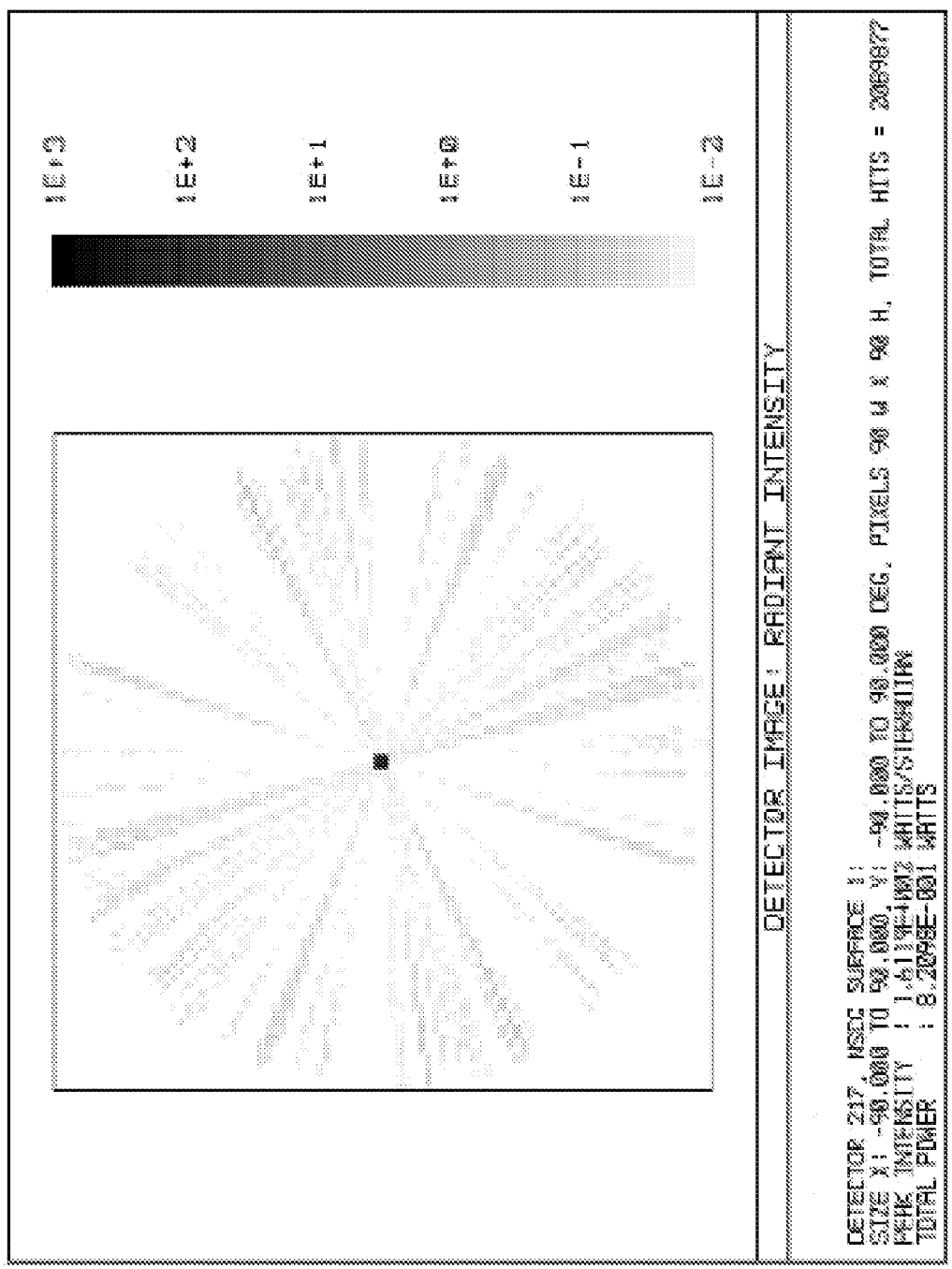
Figure 31C:
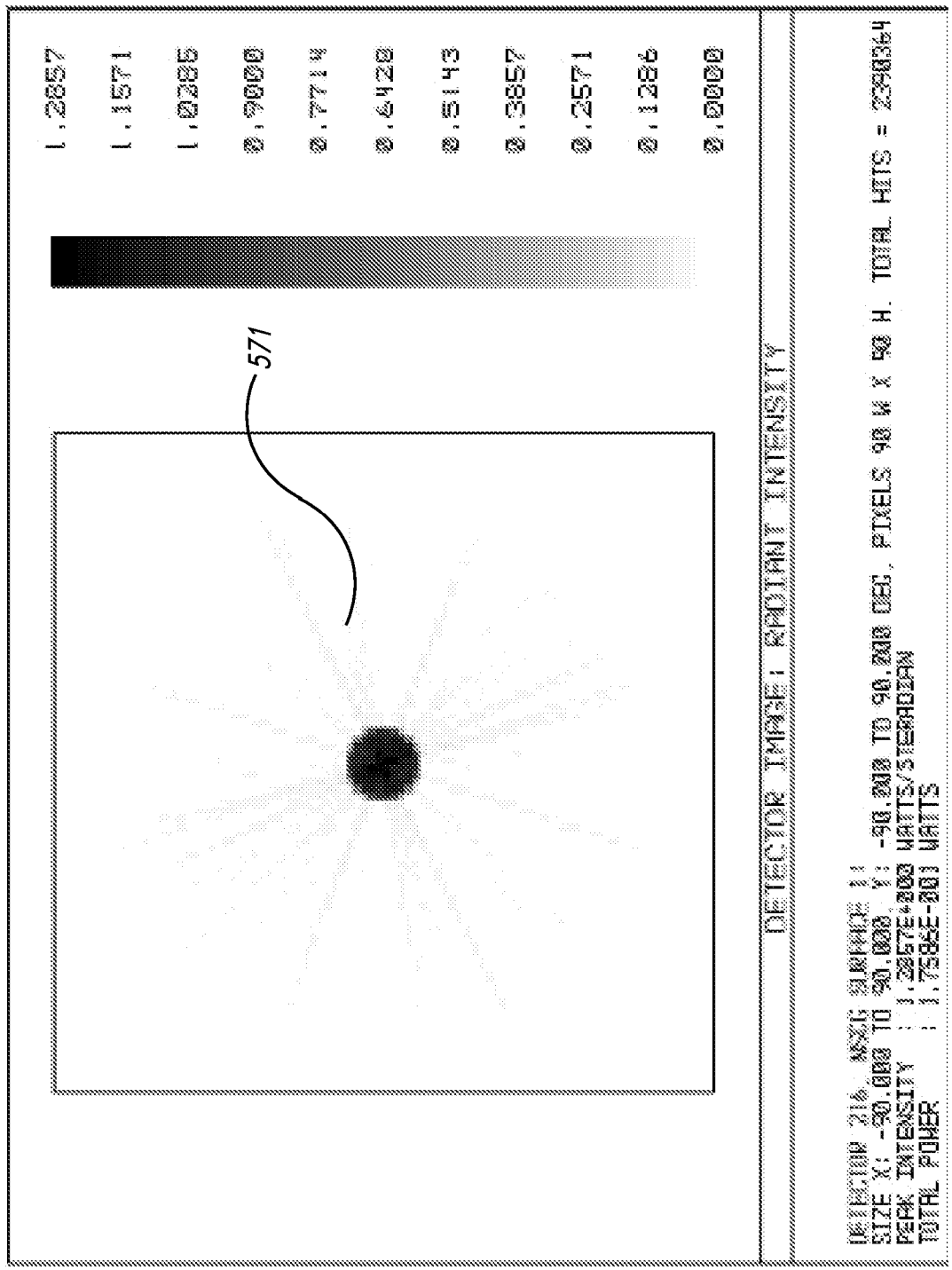
Figure 31D:
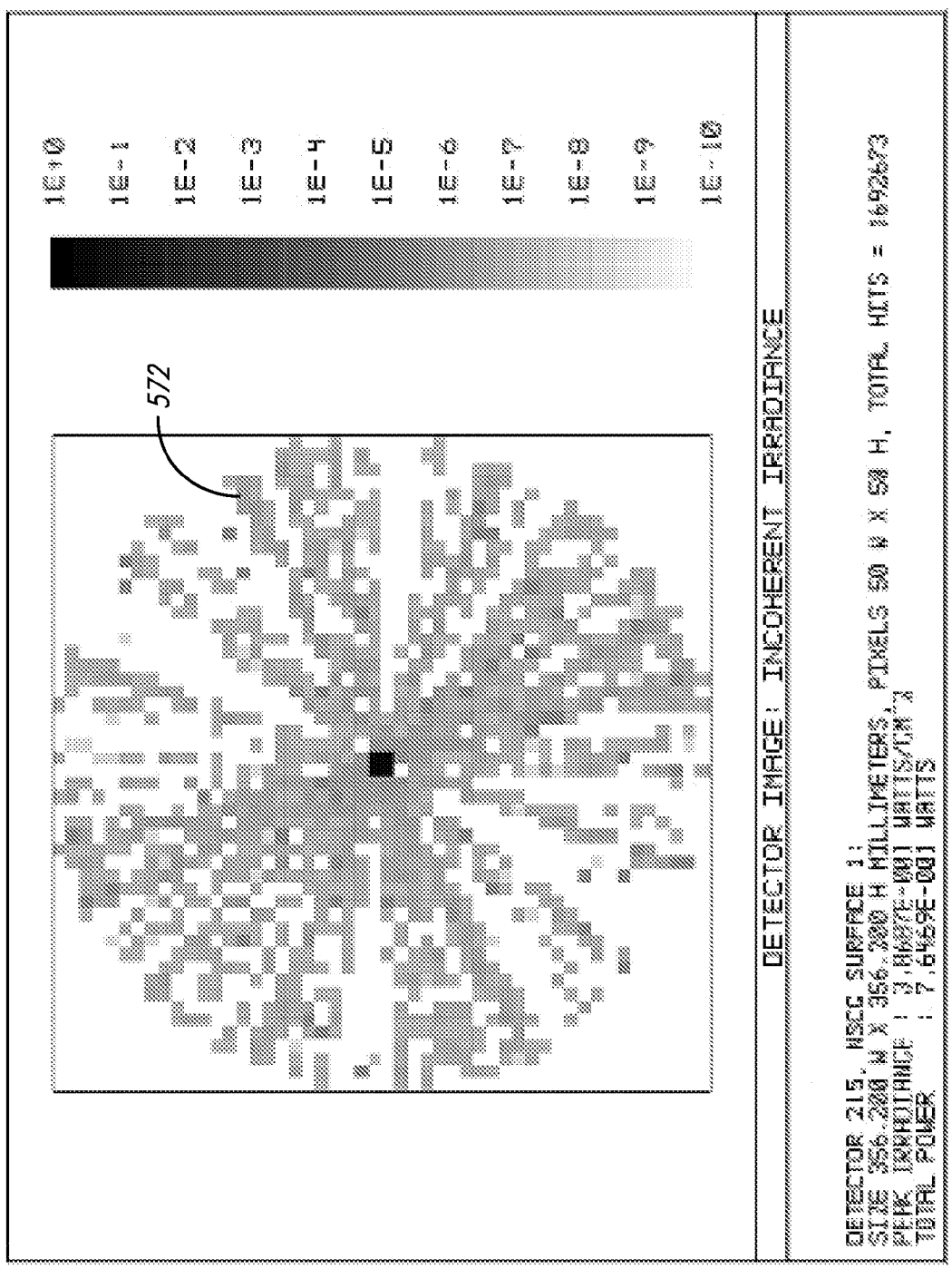

In some embodiments, the effect of including a substrate was analyzed. For this analysis, the assembly of nanowires can either be suspended in air or mounted on the downstream surface of a 125-μm thick substrate of PET or glass. The inclusion of a substrate has no effect on the angle of the reflected rays and only a small effect on spatial position of these rays. FIGS. 30A and 30B show optical raytraces 565, 567 of light reflected off a transparent conductor substrate 563 including a plurality of nanowires (e.g., a nanowire assembly, a nanowire network density, and the like) with and without a PET substrate 569, respectively. A ray reflected from the nanowires which passes through air, then is refracted into the PET layer 569, then is refracted back out into air will generally emerge with substantially the same ray angle in air that it had originally. One difference, however, is that the ray will be slightly translated in its position. But in the far field limit (viewing distance large compared to the PET substrate thickness) this small translational shift is negligible.

For clarity, only the transmitted component of each ray is illustrated in FIGS. 30A and 30B. In reality, however, there are several reflected components. For example, for non-AR coated PET or glass, approximately 4% of the incident beam is reflected off each surface of the substrate (approximately 8% total) according to the Fresnel reflectance equation:

$$R=[(1-n)/(1+n)]^2 \quad (\text{eq. 7})$$

Additionally, each ray reflected off of the plurality of nanowires and incident on the PET or glass substrate 569 is partially reflected back towards the nanowire assembly (nominally 4% but the exact value for each ray is dependent on angle and polarization). Also each ray transmitted into the PET or glass substrate and incident on the rear face of the substrate (the face closest to the incident beam) is partially reflected by the interface back into the substrate. Although it is difficult to illustrate the millions of these possible ray bounces, it is possible to determine the effect of all of these reflections using the ZEMAX subcomponent FIGS. 31A through 31D show the optical performance for the case illustrated in FIG. 26, except that a 125 μm-thick PET substrate has been added. Two primary differences between FIGS. 31A through 31D and corresponding FIGS. 28A through 28D are that the approximately 8% Fresnel reflectance off the PET shows up as a disk 571 in the center of the rear hemisphere map, and that the map of the beam transmitted into a 2.5 degree half angle shows additional scattered light 572 (this is the rearward scattered light that has partially reflected off the PET substrate into the forward direction).

A summary of the zero order transmittance $T_o$, transmittance into a 2.5 degree half angle $T_{2.5}$, forward integrated transmittance FIT, backward integrated reflectance BIR, haze, and absorbance with and without PET is given in Table 8.

TABLE 8

Summary of nanowire assembly performance with and without PET

| Run | d, μm | ρ, μm$^{-2}$ | D, μm | D$_{beam}$, μm | Substrate | To | T$_{2.5}$ | FIT | BIR | Haze | Absorbance |
|---|---|---|---|---|---|---|---|---|---|---|---|
| 39 | 0.25 | 0.0892 | 0.52445 | 26.7 | air | 84.41% | 84.41% | 88.91% | 10.78% | 5.05% | 0.32% |
| 39 | 0.25 | 0.0892 | 0.52445 | 26.7 | PET | 76.40% | 76.41% | 82.07% | 17.61% | 6.90% | 0.32% |

The approximately 8% decrease in T$_o$ and T$_{2.5}$ is due to the Fresnel reflectance off of the two PET surfaces. The increased haze is due to light reflected rearward from the nanowires that is partially reflected off the PET into the forward direction. The increase in backward integrated reflectance is only 6.83%, not the approximately 8% caused by Fresnel reflectance of the incident beam off of the PET substrate, because some of the rearward reflected light from the nanowires is reflected by the PET into the forward direction. The absorbance on the nanowire assembly is the same for both cases, approximately 0.32%.

Because ZEMAX raytraces with a non-AR coated substrate take at least 2.5× longer than raytraces with no substrate or with an AR-coated substrate (due to having to account for the millions of additional reflected rays), all subsequent simulations in this study were done using no substrate. An estimate for what these results would have been had a substrate been included can be made by applying the results of Table 8 to these cases.

Figure 32:
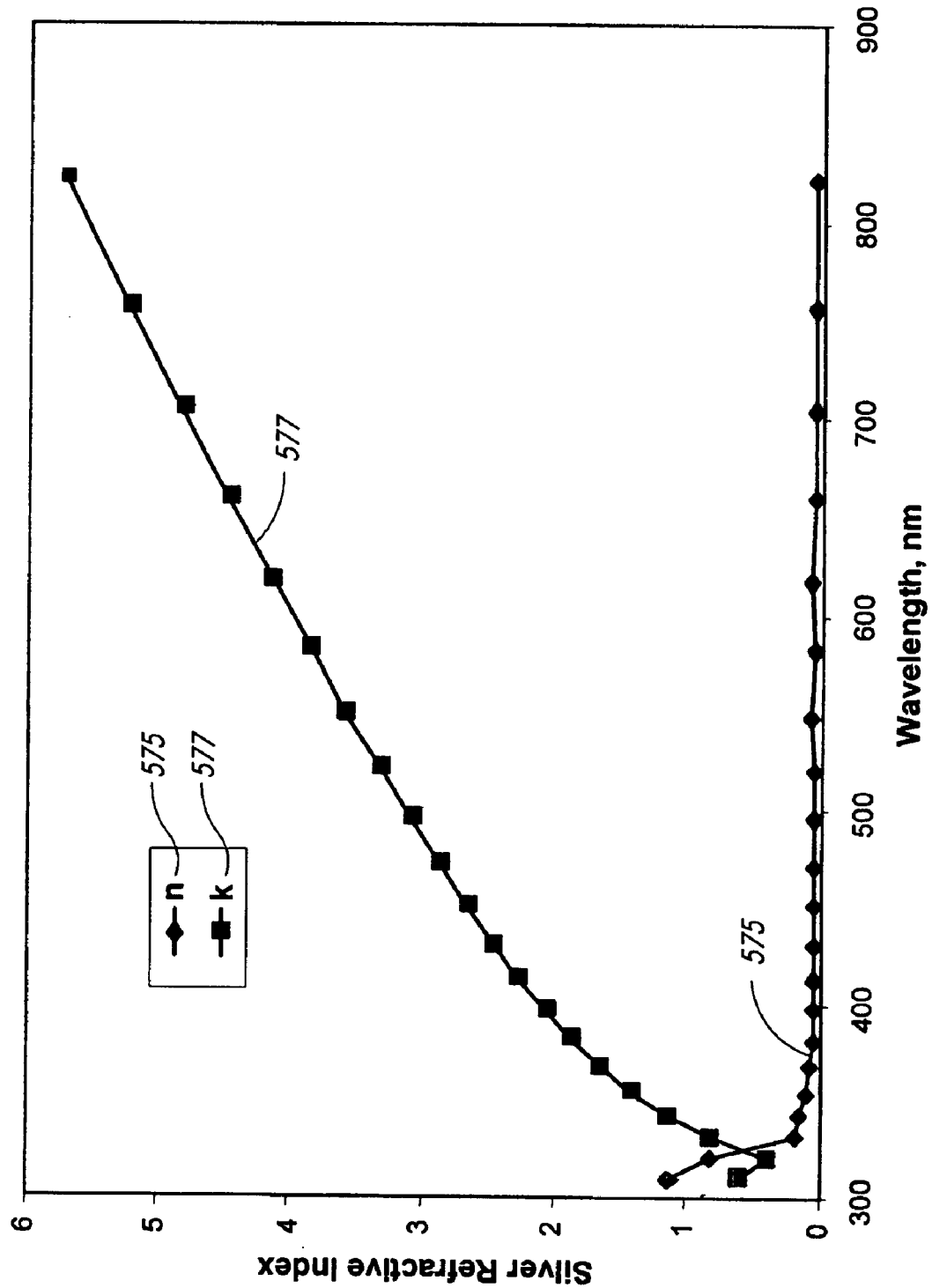
FIG. 32 is an exemplary silver complex refractive index components n and k versus Wavelength plot according to one illustrated embodiment.

In some embodiments, the effect of the wavelength was analyzed. The real part (n) 575 and the imaginary part (k) 577 of the silver refractive index as a function of wavelength is illustrated in FIG. 32. At normal incidence, the silver reflectance R is given by the equation:

$$R=[(1-n)^2+k^2]/[(1+n)^2+k^2] \quad \text{(eq. 8)}.$$

Figure 33:
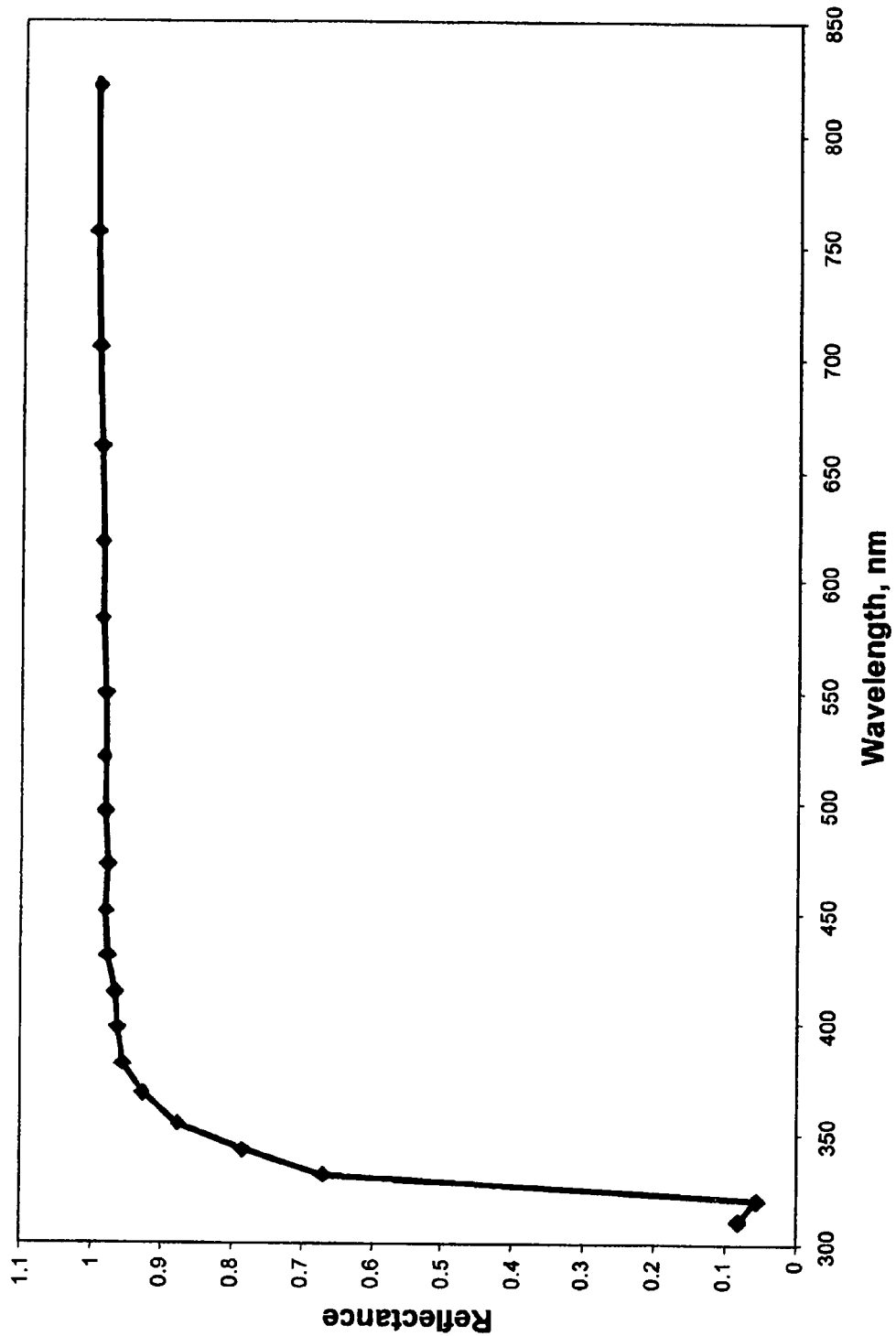
FIG. 33 is an exemplary silver reflectance versus wavelength at normal incidence plot according to one illustrated embodiment.
Figure 34:
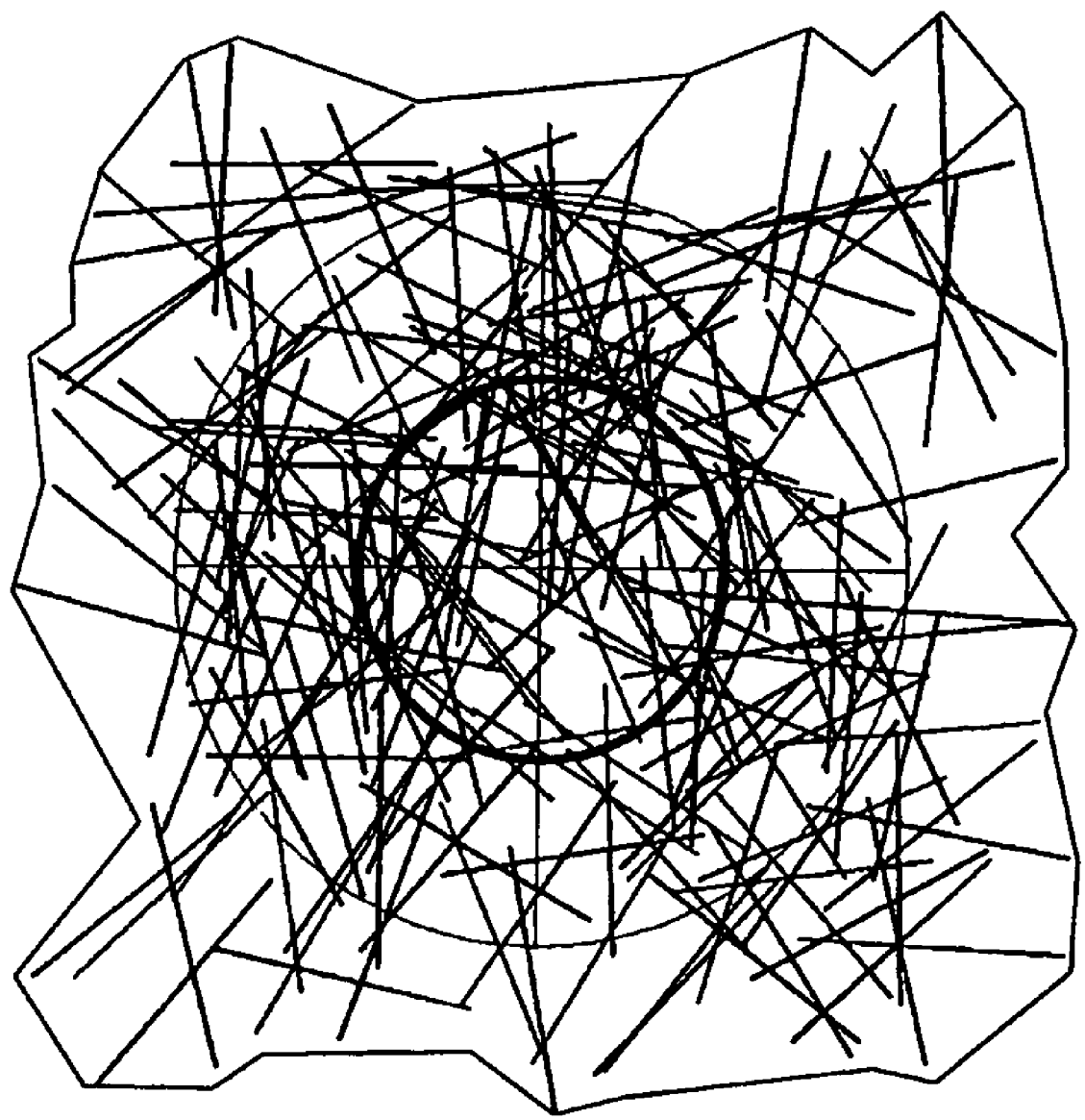
FIG. 34 is a top plan view of a nanowire assembly of 206 nanowires (having of L=8 µm, D=0.075 µm, and ρ=0.34 µm$^{-2}$) according to one illustrated embodiment.
Figure 35A:
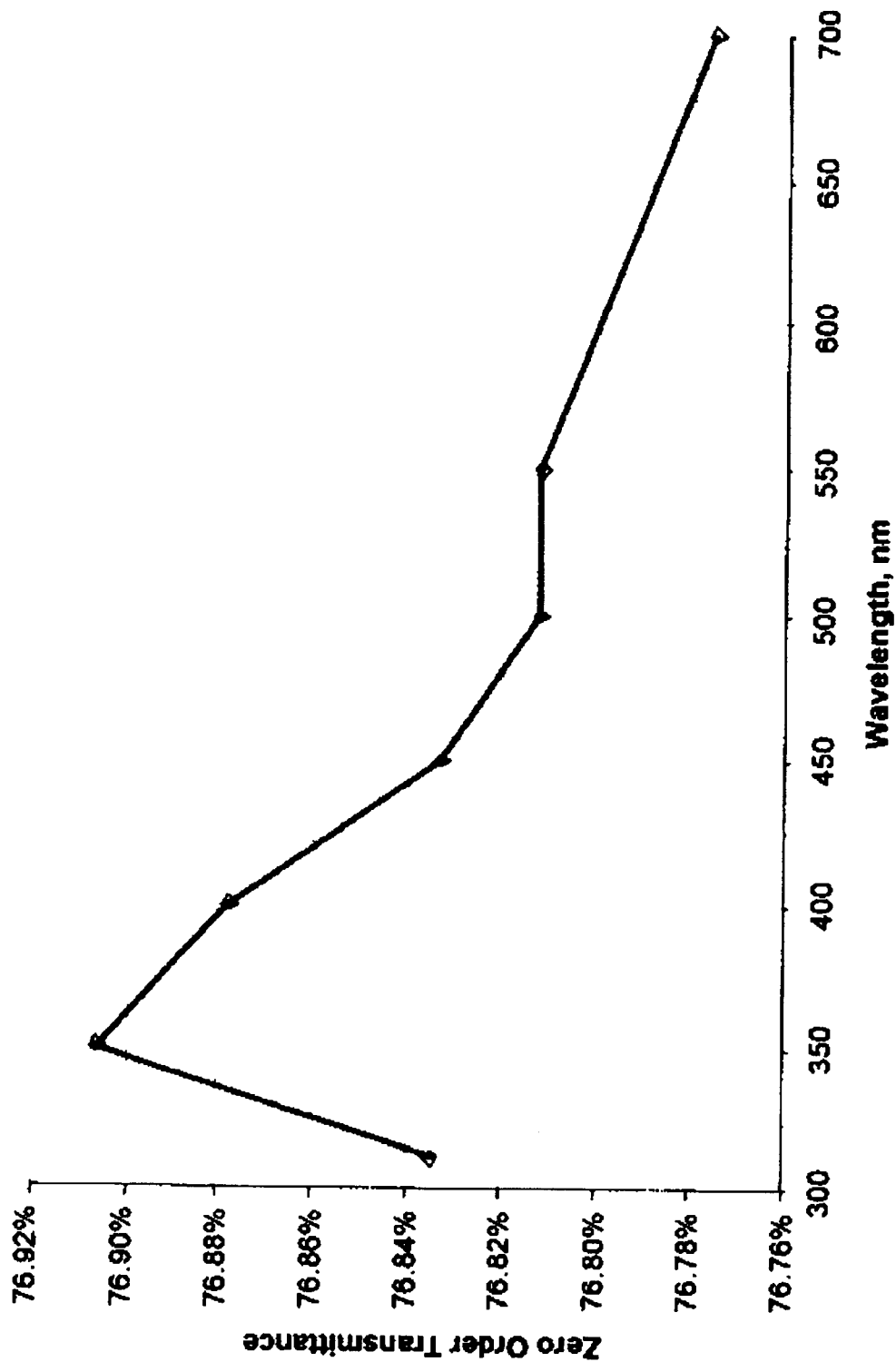
FIG. 35A is an exemplary zero order transmittance versus wavelength plot for the nanowire assembly in FIG. 34 according to one illustrated embodiment.
Figure 35B:
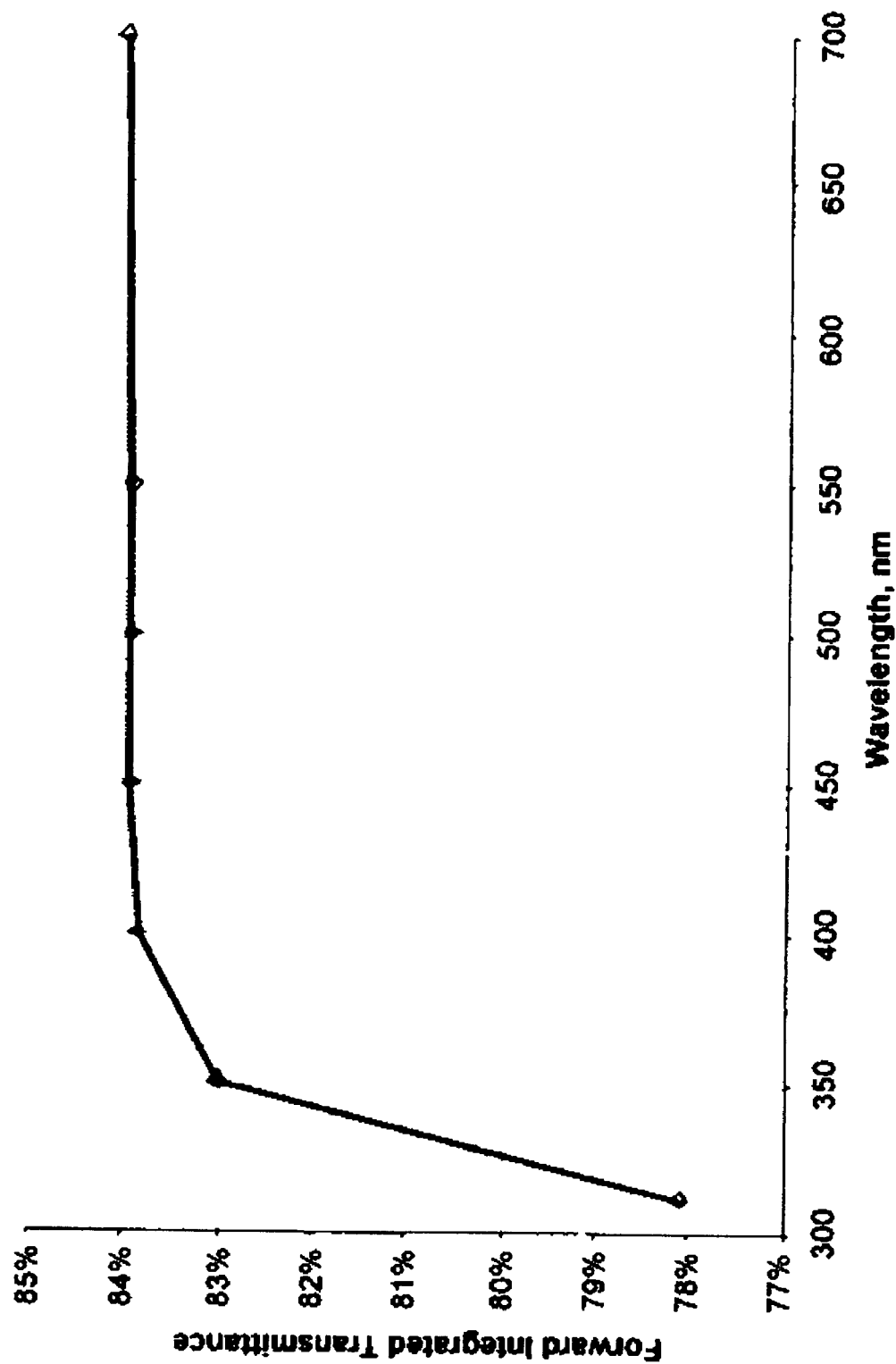
FIG. 35B is an exemplary forward integrated transmittance versus wavelength plot for the nanowire assembly in FIG. 34 according to one illustrated embodiment.
Figure 35C:
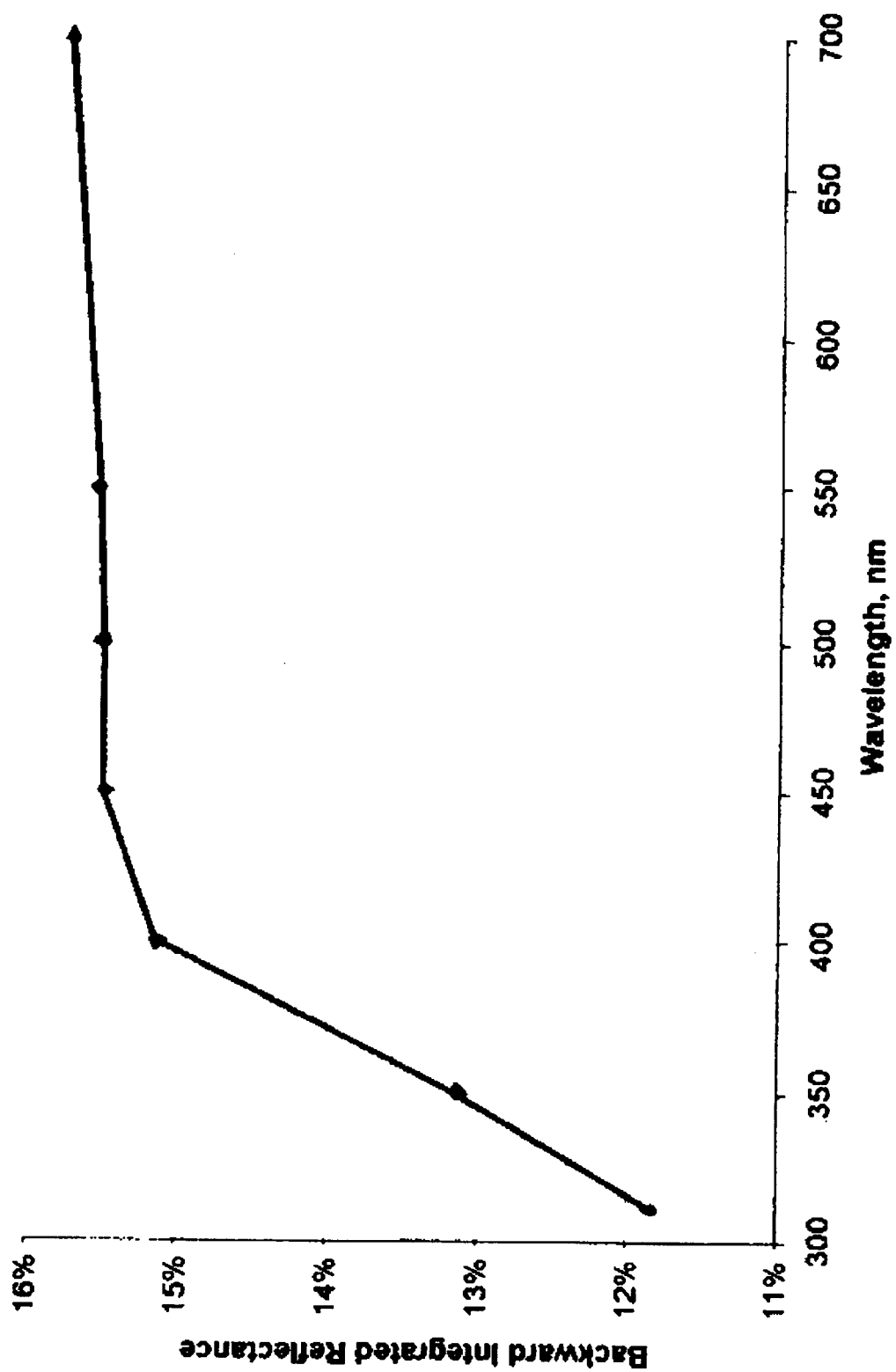
FIG. 35C is an exemplary backward integrated reflectance versus wavelength plot for the nanowire assembly in FIG. 34 according to one illustrated embodiment.
Figure 35D:
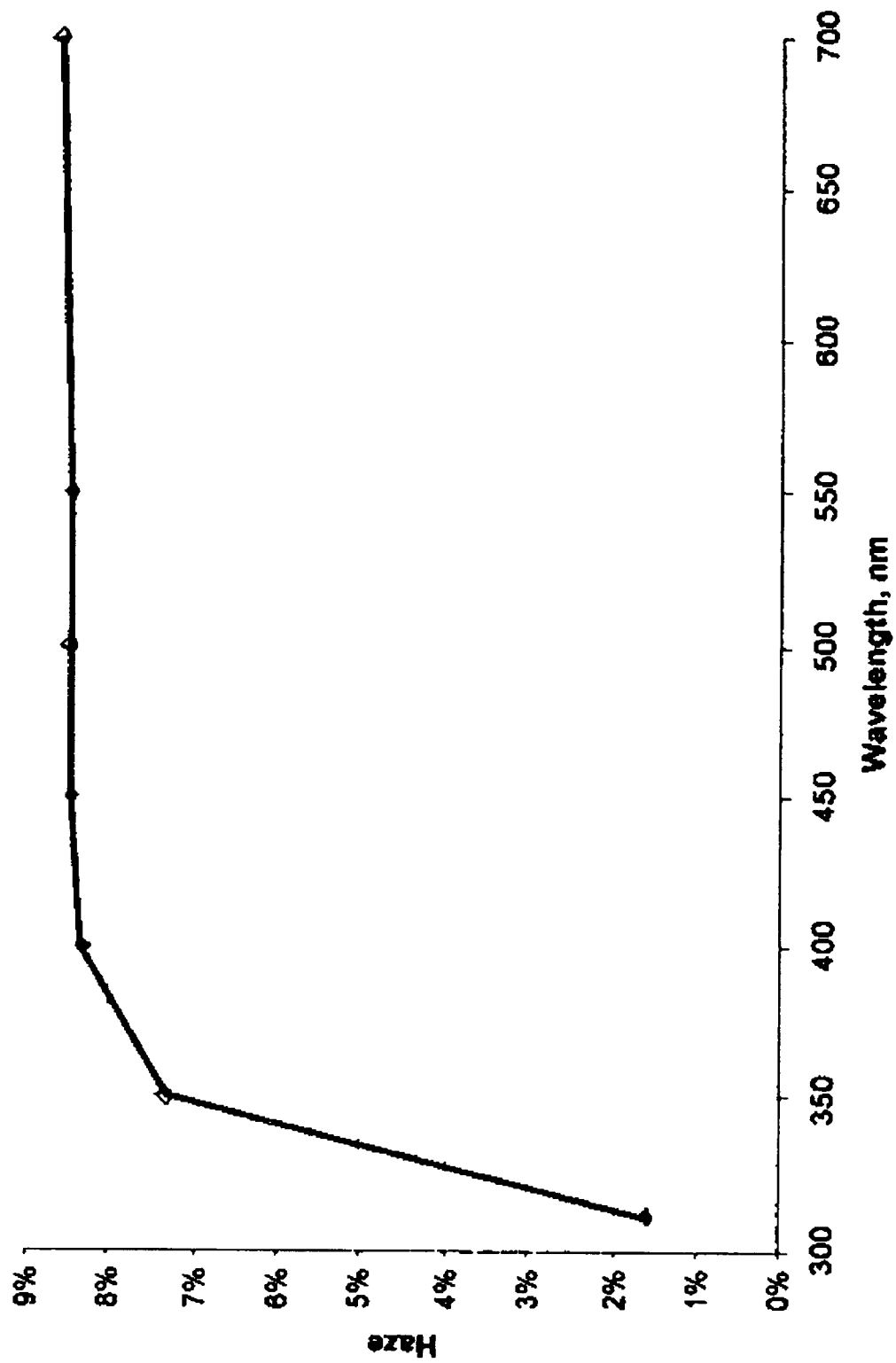
FIG. 35D is an exemplary % haze versus wavelength plot for the nanowire assembly in FIG. 34 according to one illustrated embodiment.
Figure 35E:
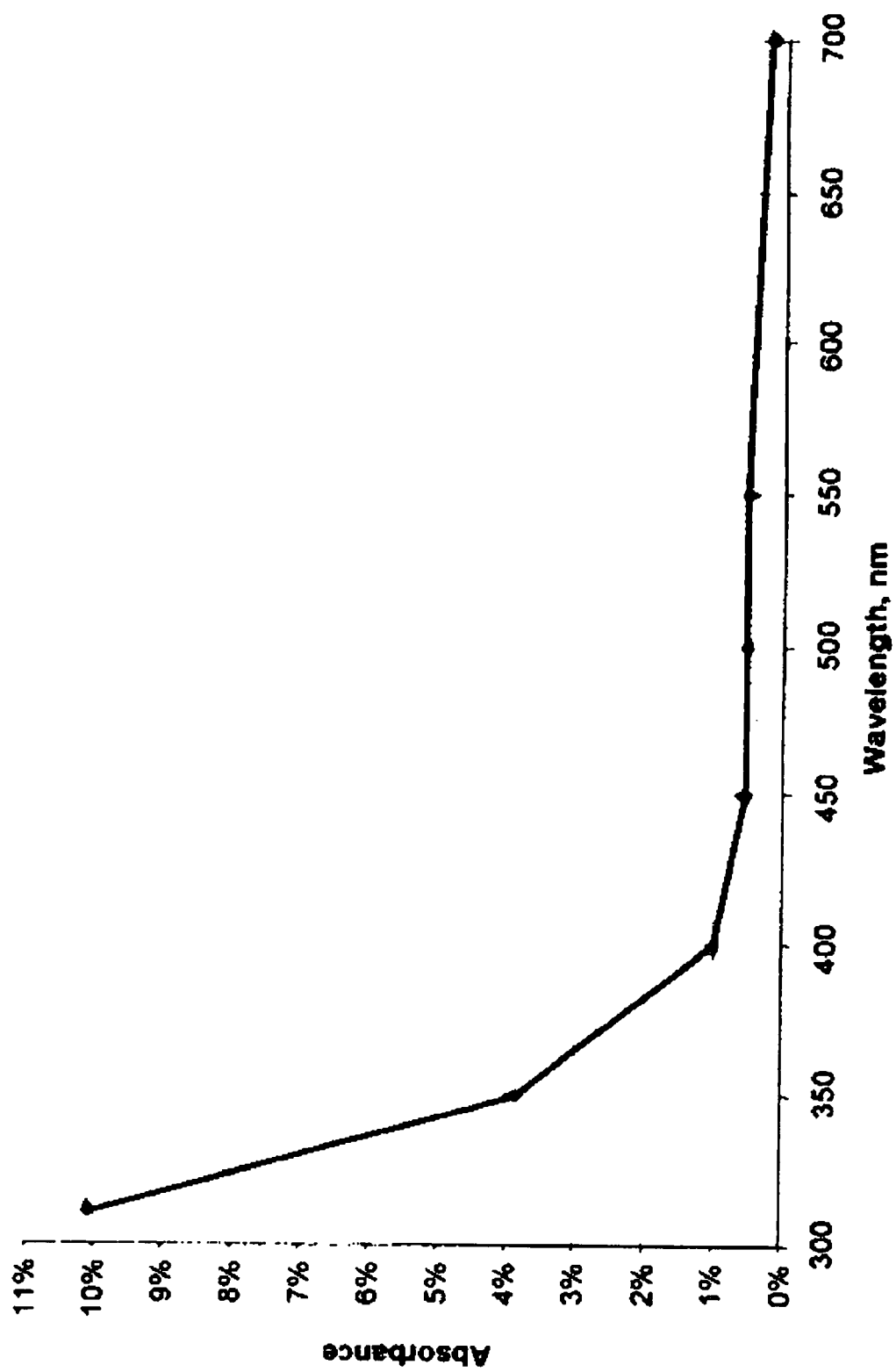
FIG. 35E is an exemplary % absorbance versus wavelength plot for the nanowire assembly in FIG. 34 according to one illustrated embodiment.
Figure 36C:
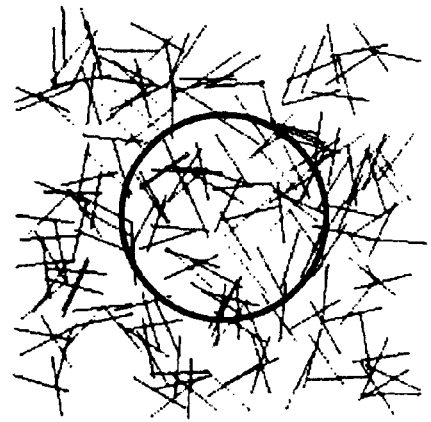
FIGS. 36A, 36B, 36C, 36D, 36E, and 36F are schematic top plan views of nanowire networks of varying density according to multiple illustrated embodiments.
Figure 36F:
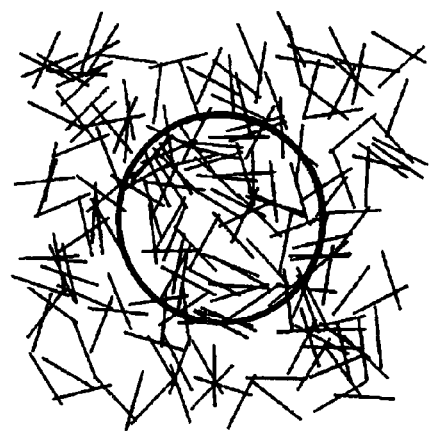
Figure 36B:
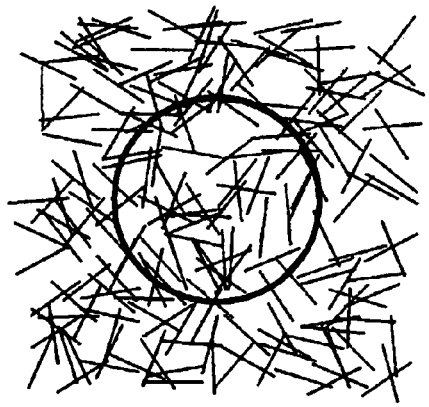
Figure 36E:
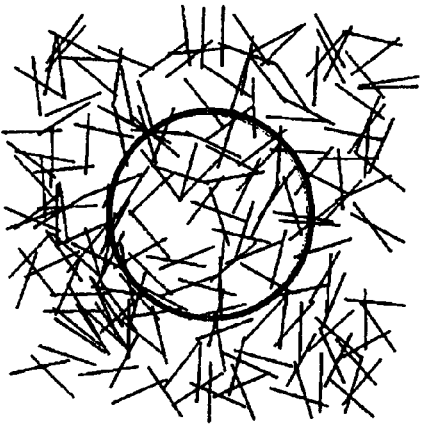
Figure 36A:
Figure 36D:
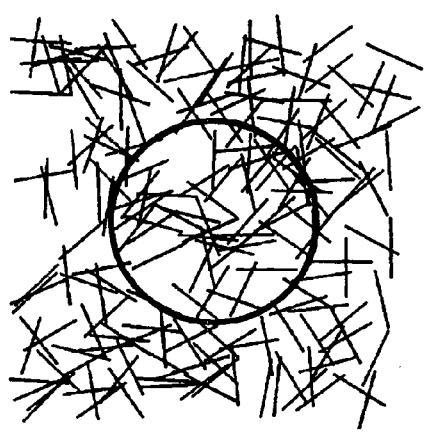
Figure 37:
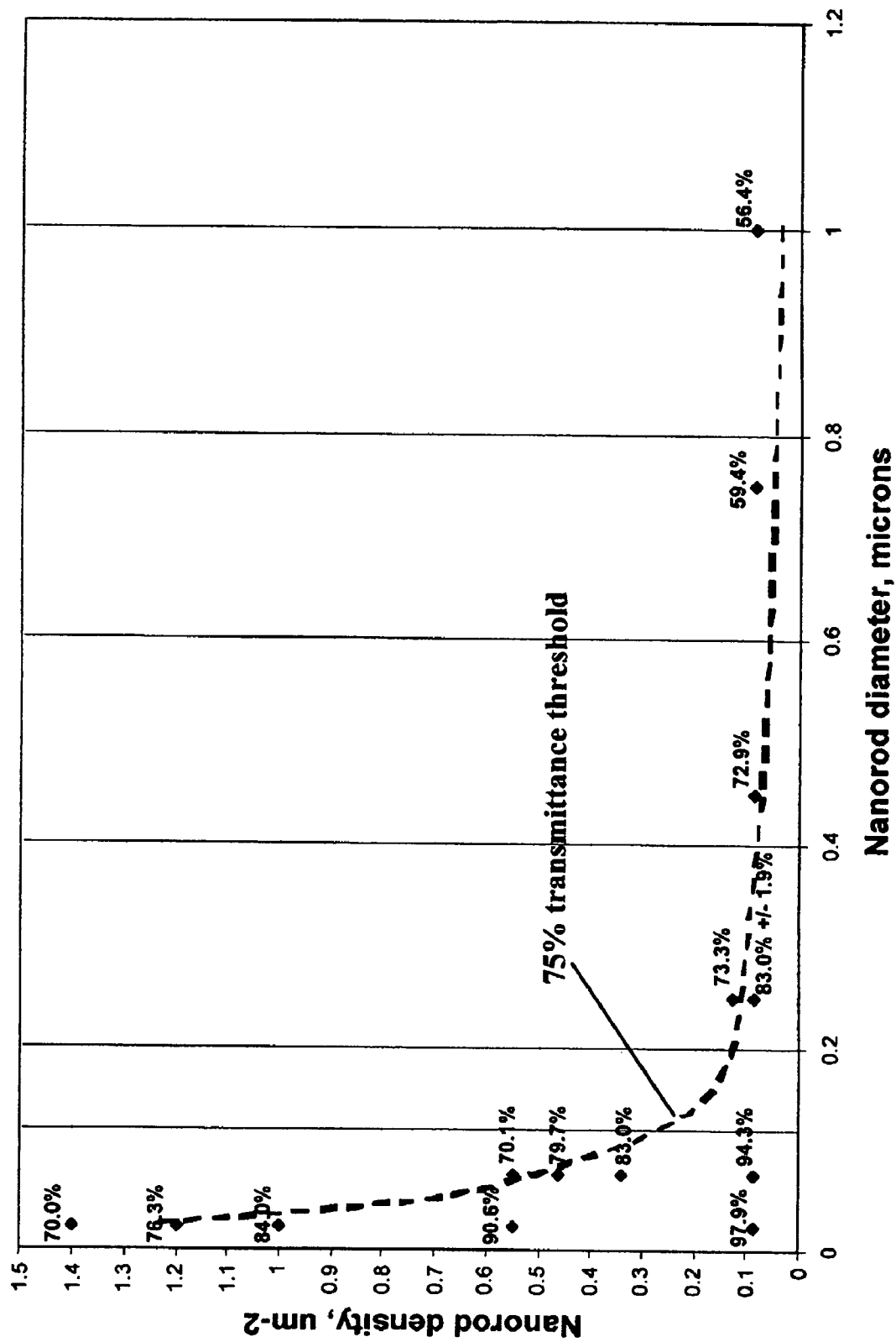
FIG. 37 is an exemplary zero order transmittance versus nanowire density and nanowire diameter plot according to one illustrated embodiment.
Figure 38:
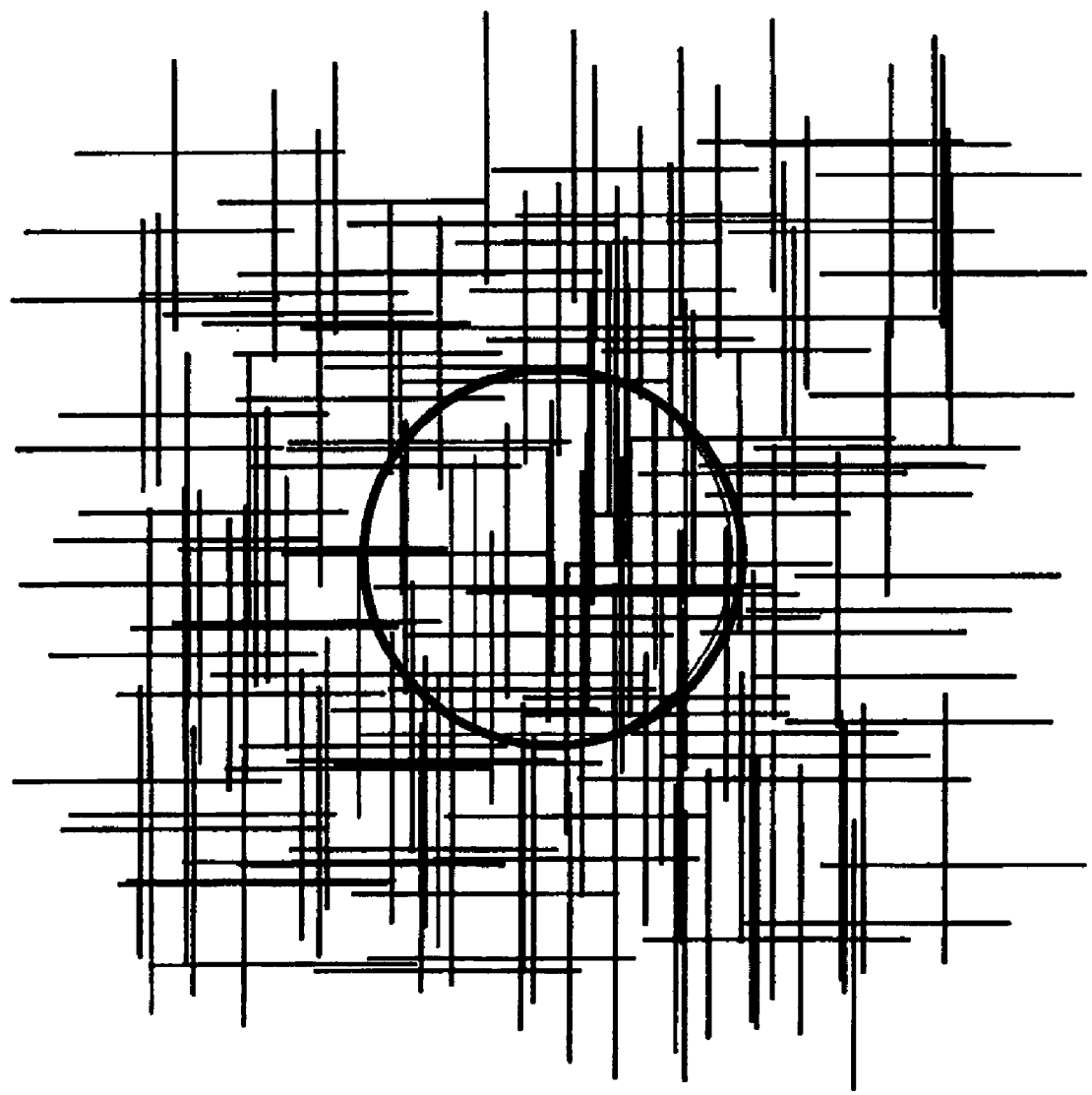
FIG. 38 is a top plan view of a bipolarly oriented assembly of a plurality of nanowires according to one illustrated embodiment.
Figure 39A:
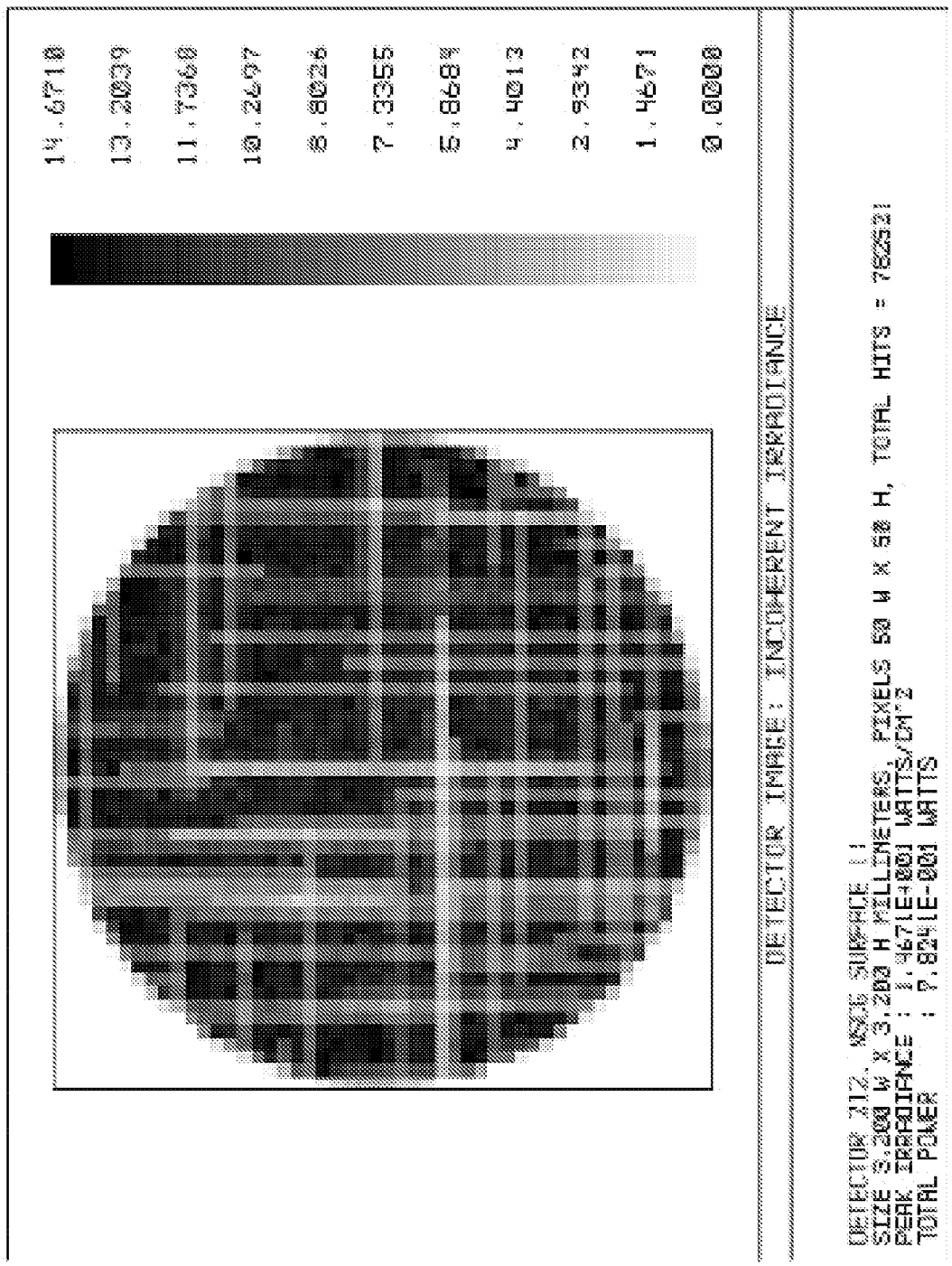
FIGS. 39A, 39B, 39C, and 39D are beam data maps of the nanowire assembly in FIG. 38 according to multiple illustrated embodiments.
Figure 39B:
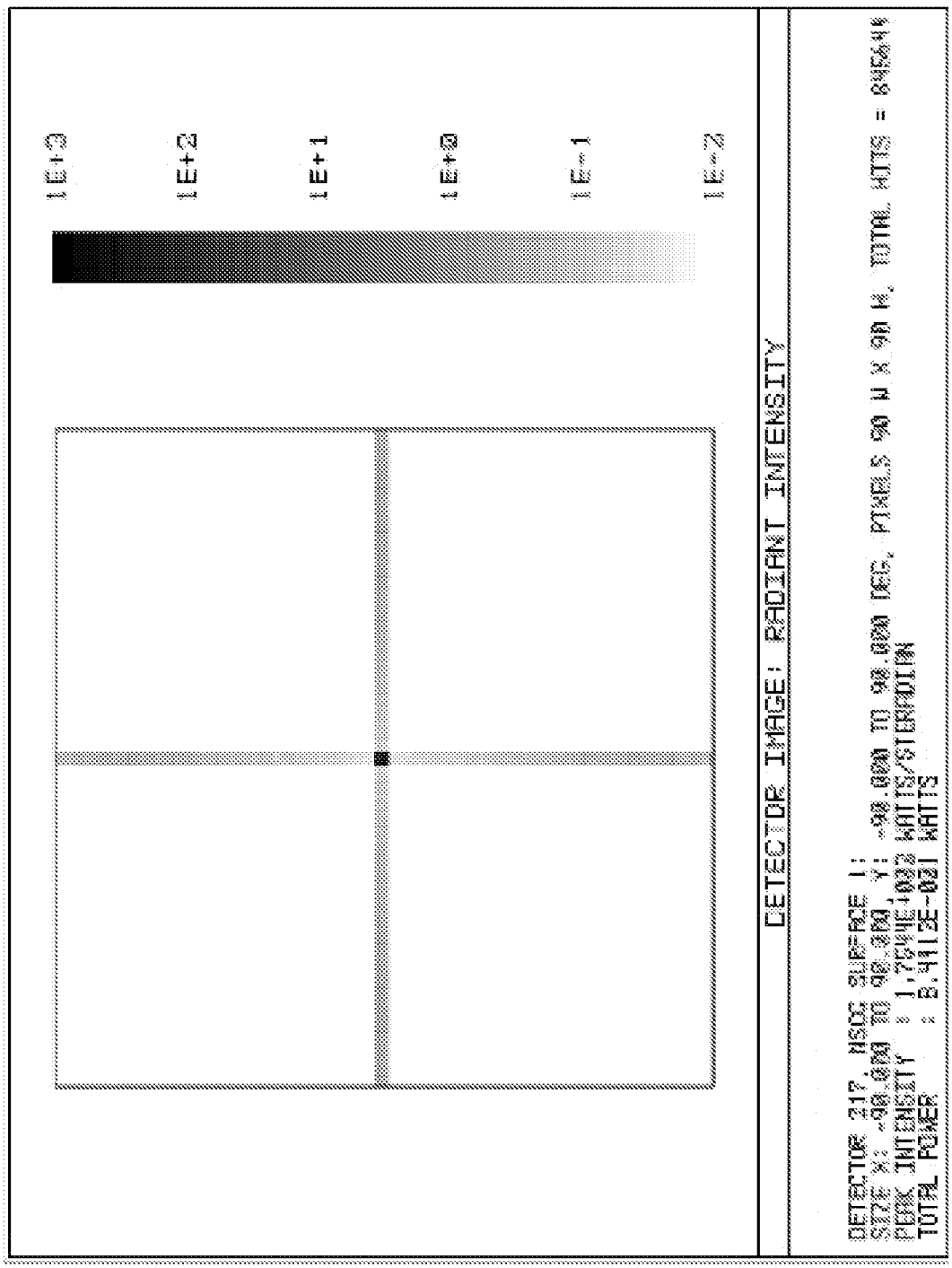
Figure 39C:
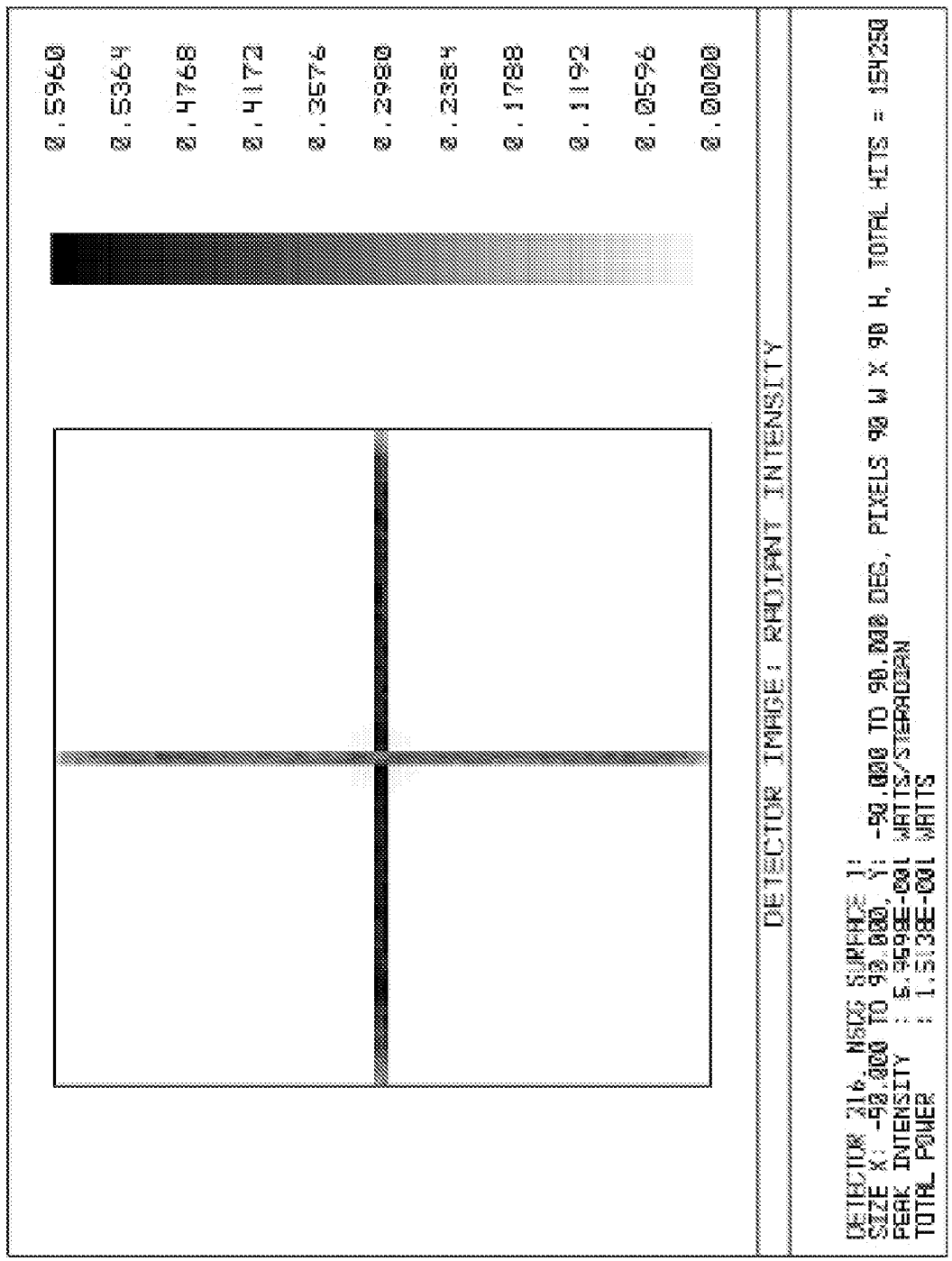
Figure 39D:
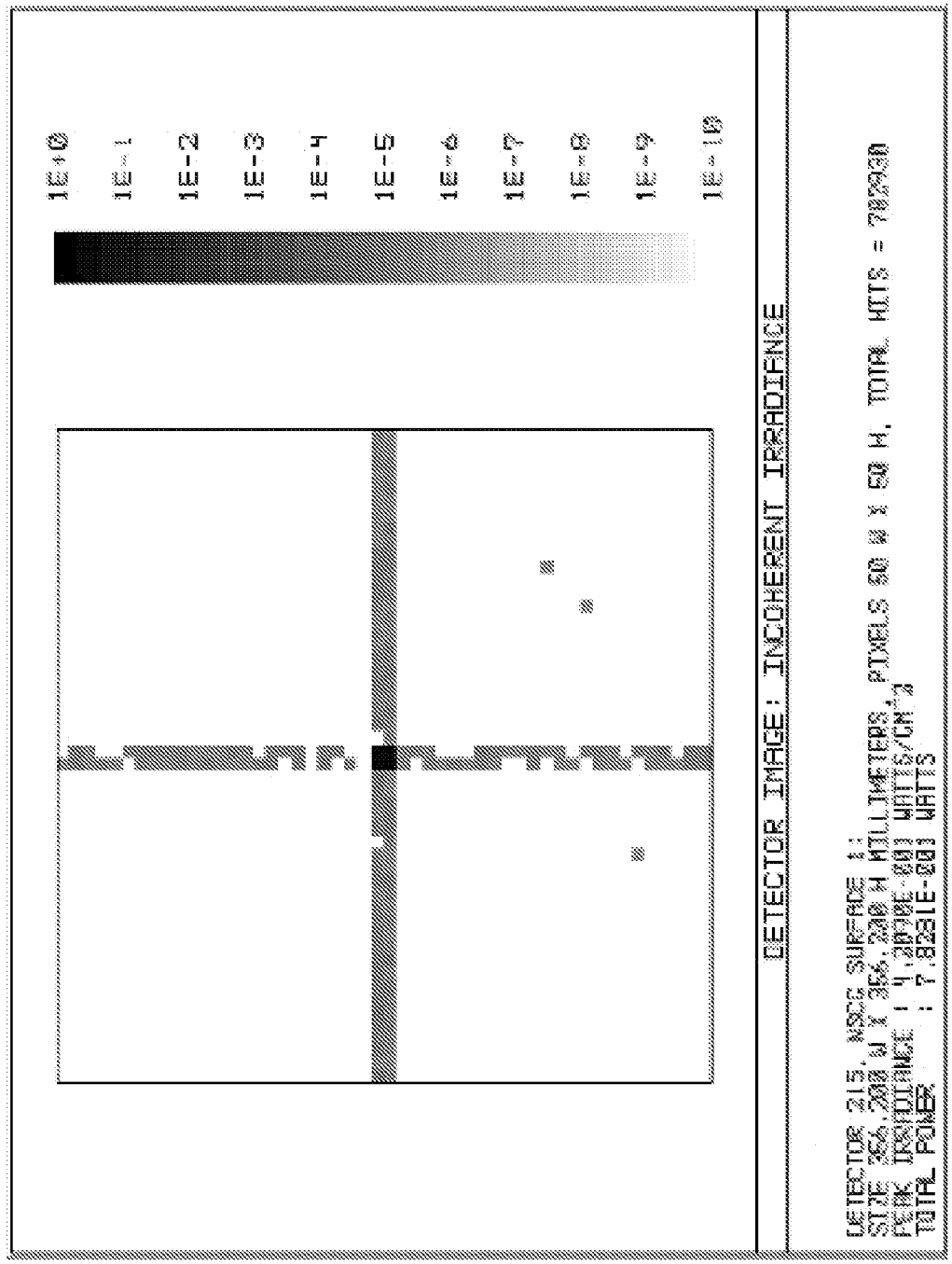

The silver reflectance versus wavelength for normal incidence illustrated in FIG. 33 is relatively flat at greater than approximately 97% above 400 nm. The optical performance versus wavelength was simulated for the nanowire assembly in FIG. 34, and the results of this simulation are illustrated in FIGS. 35A through 35E. Forward integrated transmittance, backward integrated reflectance, haze, and absorbance are all relatively flat above 400 nm, and zero order transmittance is relatively wavelength independent. All subsequent cases were analyzed at 555 nm.

In some embodiments, the effect of averaging over a number of runs was analyzed. For this study, N=206 was selected to reduce the computation times to reasonable lengths and to minimize the amount of statistical noise in the calculations. Nevertheless, some uncertainty remains in the calculations due to the fact that the nanowires are randomly assembled. Some random assemblies may have higher zero order transmittance, lower haze, etc. than other assemblies. To assess this variation, the case of D=0.25 μm, L=8 μm, and ρ=0.0892 μm$^{-2}$ was run 6 times, for the six random assemblies illustrated in FIGS. 36A through 36F.

The optical performance of these six assemblies is summarized in Table 9. The standard deviation for all computed values is relatively low, at less than 2%.

TABLE 9

Optical performance summary for six nanowire assemblies in FIGS. 36A through 36F

| Run | d, μm | ρ, μm$^{-2}$ | D, μm | D$_{beam}$, μm | To | T$_{2.5}$ | FIT | BIR | Haze | Absorbance |
|---|---|---|---|---|---|---|---|---|---|---|
| 29 | 0.25 | 0.0892 | 0.44953 | 26.7 | 81.81% | 81.82% | 87.24% | 12.39% | 6.21% | 0.38% |
| 36 | 0.25 | 0.0892 | 0.44953 | 26.7 | 83.95% | 83.96% | 88.75% | 10.92% | 5.40% | 0.33% |
| 37 | 0.25 | 0.0892 | 0.52445 | 26.7 | 83.72% | 83.72% | 88.46% | 11.20% | 5.36% | 0.34% |
| 38 | 0.25 | 0.0892 | 0.48699 | 26.7 | 84.17% | 84.17% | 88.80% | 10.87% | 5.21% | 0.33% |
| 39 | 0.25 | 0.0892 | 0.52445 | 26.7 | 84.41% | 84.41% | 88.91% | 10.78% | 5.05% | 0.32% |
| 40 | 0.25 | 0.0892 | 0.52445 | 26.7 | 79.63% | 79.64% | 85.74% | 13.83% | 7.12% | 0.43% |
| Average | | | 0.49323 | 26.7 | 82.95% | 82.95% | 87.98% | 11.66% | 5.73% | 0.35% |
| Std Dev | | | 0.03683 | 0 | 1.87% | 1.87% | 1.26% | 1.22% | 0.79% | 0.04% |

In some embodiments, optical performance versus nanowire diameter and density was analyzed. The optical performance of nanowire assemblies for a collimated normally incident beam at 555 nm was computed for the following range of parameters:

Nanowire length L=8 μm,

Nanowire diameter d ranging from 0.025 μm to 1 μm,

Nanowire density (rods/unit area) p ranging from a minimum value of 0.0892 rods/μm$^2$ (corresponding to the percolation threshold) to a value that would yield a minimum zero-order transmittance (with no substrate) of approximately 75%, and

N=206.

The results of this analysis are summarized in FIGS. 22 and 23. FIG. 22 illustrates that zero order transmittance decreases with increasing nanowire diameter and increasing nanowire density. A dotted line has been added to FIG. 22 to approximately indicate, for example, the 75% transmittance threshold. FIG. 23 indicates that a decrease in zero order transmittance is associated with a decrease in forward integrated transmittance, haze, and absorbance.

In some embodiments, bipolarly oriented nanowires were analyzed. All of the cases considered so far have involved assemblies of nanowires that are randomly oriented about 360 degrees. FIG. 24 is an illustration of a nanowire assembly (L=8 μm, D=0.075 μm, ρ=0.34 μm$^{-2}$) whose nanowires are oriented randomly at either 0 degrees or 90 degrees. The resultant scattered light illustrated in FIG. 25 is rectilinearly oriented as expected.

TABLE 10

Zero order transmittance vs. nanowire diameter and density

| Run | d, μm | ρ, μm$^{-2}$ | D, μm | D$_{beam}$, μm | To | T$_{2.5}$ | FIT | BIR | Haze | Absorbance |
|---|---|---|---|---|---|---|---|---|---|---|
| 21 | 0.025 | 0.0892 | 0.04876 | 26.7 | 97.88% | 97.88% | 89.48% | 1.47% | 0.61% | 0.05% |
| 25 | 0.025 | 0.6 | 0.32799 | 7.02 | 90.01% | 90.01% | 92.96% | 6.84% | 3.17% | 0.20% |
| 22 | 0.025 | 1 | 0.80309 | 4.24 | 84.02% | 84.03% | 88.83% | 10.84% | 5.40% | 0.33% |
| 24 | 0.025 | 1.2 | 1.29405 | 3.4 | 76.26% | 76.27% | 83.72% | 15.75% | 8.90% | 0.53% |
| 23 | 0.025 | 1.4 | 1.48954 | 2.76 | 69.99% | 70.00% | 79.65% | 19.66% | 12.11% | 0.69% |
| 20 | 0.075 | 0.0892 | 0.13489 | 26.7 | 94.25% | 94.26% | 95.92% | 3.96% | 1.74% | 0.12% |
| 26 | 0.075 | 0.34 | 0.51472 | 11.08 | 82.96% | 82.97% | 88.08% | 11.56% | 5.81% | 0.36% |
| 27 | 0.075 | 0.46 | 0.85501 | 8.7 | 79.75% | 79.75% | 85.92% | 13.64% | 7.18% | 0.44% |
| 28 | 0.075 | 0.55 | 0.99126 | 7.56 | 70.09% | 70.10% | 79.37% | 19.94% | 11.68% | 0.68% |
| Ave | 0.25 | 0.0892 | 0.49323 | 26.7 | 82.95% | 82.95% | 87.98% | 11.66% | 5.72% | 0.35% |
| 30 | 0.25 | 0.13 | 0.70756 | 21.2 | 73.29% | 73.30% | 81.38% | 18.03% | 9.93% | 0.59% |
| 19 | 0.45 | 0.0892 | 0.87635 | 26.7 | 72.94% | 72.94% | 80.96% | 18.43% | 9.90% | 0.62% |
| 31 | 0.75 | 0.0892 | 1.79761 | 26.7 | 59.44% | 59.45% | 71.26% | 27.74% | 16.57% | 1.00% |
| 18 | 1 | 0.0892 | 2.09735 | 26.7 | 53.69% | 53.70% | 67.49% | 31.29% | 20.43% | 1.22% |

SUMMARY OF RESULTS

The study of the optical properties of nanowire assemblies yielded the following results:

Light reflects off of a single nanowire in a linear pattern whose intensity is proportional to the cosine of half the reflection angle.

The pattern of light reflected off of a nanowire assembly is primarily a superposition of the reflected patterns from each individual nanowire.

Off-axis incident light results in reflected arcs instead of straight radial lines for normally incident light.

Adding a substrate does not affect ray directions but does reduce zero order transmittance and increase haze, primarily because of Fresnel reflections off of the two-substrate surfaces.

Above 400 nm, reflectance of silver at normal incidence is essentially constant.

Above 400 nm, all optical properties of silver nanowire assemblies are essentially constant.

For N=206, the uncertainty in the calculated results is quite low, with typical standard deviation values of less than 2%.

Zero order transmittance decreases with increasing nanowire diameter and increasing nanowire density A decrease in zero order transmittance is associated with a decrease in forward integrated transmittance and an increase in backward integrated reflectance, haze and absorbance.

The optical scatter pattern from a rectilinearly oriented assembly of nanowires is rectilinear.

All of the above U.S. patents, U.S. patent application publications, U.S. patent applications, foreign patents, foreign patent applications and non-patent publications referred to in this specification and/or listed in the Application Data sheet, U.S. Provisional Patent Application No. 60/829,294 filed Oct. 12, 2006, patent application Ser. No. 11/504,822 filed Aug. 14, 2006 are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for controlling a process of fabricating a transparent conductor film having nanowires, the method comprising:
   receiving, by a processor, an input specification of a physical characteristic of the transparent conductor film;
   comparing, by the processor, the input specification to stored reference data correlating a physical characteristic of reference transparent conductor films to a physical characteristic of reference nanowires;
   generating a manufacturing specification that correlates a target physical characteristic of the nanowires to the input specification; and
   controlling a physical characteristic of the nanowires of the transparent conductor film based on the manufacturing specification.

2. The method of claim 1, wherein the input specification comprises at least one of a sheet resistance, an optical density, a transmission, and a haze.

3. The method of claim 1, wherein the target physical characteristic of the nanowires comprise at least one of a nanowire length, nanowire diameter, or nanowire density.

4. The method of claim 1, wherein the stored reference data comprises one or more reference data sets indicative of characteristic sheet resistances, characteristic optical densities, characteristic transmission levels, characteristic haze levels, or combinations thereof.

5. The method of claim 1, wherein the manufacturing specification comprises:
   one or more nanowire dimensions and corresponding nanowire densities that satisfy at least one physical characteristic of the input specification, and that satisfy or exceed a minimum percolation density.

6. The method of claim 5 wherein the minimum percolation density is about a factor of 5.7 greater than an inverse of an average of a square of nanowire lengths.

7. The method of claim 1, wherein the manufacturing specification comprises:
   a nanowire dimension and a nanowire density that satisfy at least one physical characteristic of the transparent conductor film from the received input specification, and that satisfy or exceed a minimum percolation density by at least a factor of about 1.1.

8. The method of claim 1, wherein generating the manufacturing specification comprises generating a manufacturing specification that satisfies at least one physical characteristic of the transparent conductor film from the received input specification.

9. The method of claim 1, wherein the manufacturing specification comprises one or more nanowire density versus sheet resistance over nanowire resistance plots; nanowire length versus nanowire diameter, for a given sheet resistance plot; nanowire length over nanowire diameter square versus sheet resistance plots; percent haze versus nanowire density times nanowire cross-sectional area plots; or optical density versus nanowire density times nanowire cross-sectional area plots.

10. A non-transitory computer readable storage medium comprising instructions that, when executed on a computer, execute a method for designing a nanowire transparent conductor, the method comprising:
   determining sets of nanowire values based on information indicative of a desired electrical or optical property of the nanowire transparent conductor, the sets comprising a nanowire length, a nanowire width or diameter, and a corresponding density; and
   generating a manufacturing specification based on the determined sets of nanowire values for manufacturing the transparent conductor.

11. The computer readable storage medium of claim 10, wherein determining the sets of nanowire values comprises:
   retrieving model data, correlating a nanowire length, nanowire diameter, or a nanowire density, or combinations thereof, to corresponding electrical or optical property of reference nanowire transparent conductors, from a memory on which is stored a model for modeling sets of nanowire values based on information indicative of the desired electrical or optical property of the nanowire transparent conductor; and
   determining sets of nanowire values based on the retrieved model data.

12. The computer readable storage medium of claim 10, wherein the manufacturing specification includes a manufacturing process protocol, an average nanowire length, an average nanowire diameter, an average nanowire resistance, or an average nanowire density.

13. The computer readable storage medium of claim 10, wherein determining the sets of nanowire values comprises:
   retrieving stored data correlating electrical or optical property of reference nanowire transparent conductors to physical measurements of reference nanowire-including transparent conductors, experimental measurements of nanowire compositions, or manufacturing conditions that affect electrical and optical properties of the nanowire-including transparent conductor; and
   determining sets of nanowire values based on the retrieved stored data.

14. The computer readable storage medium of claim 10, wherein the manufacturing specification include's a nanowire density versus sheet resistance over nanowire resistance plot; a nanowire length versus nanowire diameter, for a given sheet resistance plot; a nanowire length over nanowire diameter square versus sheet resistance plot; a percent haze versus nanowire density times nanowire cross-sectional area plot; or an optical density versus nanowire density times nanowire cross-sectional area plot.

15. A system for evaluating optical and electrical manufacturing criteria for a transparent conductor, comprising:
   a database comprising stored reference transparent conductor data, the stored reference transparent conductor data comprising data correlating a nanowire length, a nanowire diameter, a nanowire density, or a nanowire concentration to electrical or optical properties of a transparent conductor film; and
   a controller subsystem configured to compare input acceptance manufacturing criteria for a transparent conductor to the stored reference transparent conductor data, and to generate a response based on the comparison;
   wherein the inputted acceptance manufacturing criteria comprises at least one of a sheet resistance level, an optical density level, a transmission, or a haze level.

16. The system of claim 15, wherein the stored reference transparent conductor data comprises characteristic sheet resistance data, characteristic optical density data, characteristic transmission data, and characteristic haze data, or combinations thereof.

17. The system of claim 15, wherein the stored reference transparent conductor data comprises empirical sheet resistance data, empirical optical density data, empirical transmission data, and empirical haze data or combinations thereof.

18. The system of claim 15, wherein the stored reference transparent conductor data comprises nanowire density versus sheet resistance over nanowire resistance data; nanowire length versus nanowire diameter, for a given sheet resistance data; nanowire length over nanowire diameter square versus sheet resistance data; percent haze versus nanowire density times nanowire cross-sectional area data; or optical density versus nanowire density times nanowire cross-sectional area data; or combinations thereof.

19. The system of claim 15, wherein the response comprises at least one of a comparison plot; a preferred manufacturing protocol; or a table comprising nanowire dimensions, nanowire densities, and corresponding rating values.

20. The system of claim 15, wherein the controller subsystem comprises one or more microprocessors.

21. A method for designing a nanowire transparent conductor, the method comprising:
   automatically determining sets of nanowire values based on information indicative of a desired electrical or optical property of the nanowire transparent conductor, the sets comprising a nanowire length, a nanowire width or diameter, and a corresponding density; and
   automatically generating, by a processor, a manufacturing specification based on the determined sets of nanowire values for manufacturing the transparent conductor.

22. The method of claim 21, wherein automatically determining the sets of nanowire values comprises:
   retrieving model data, correlating a nanowire length, nanowire diameter, or a nanowire density, or combinations thereof, to corresponding electrical or optical property of reference nanowire transparent conductors, from a memory on which is stored a model for modeling sets of nanowire values based on information indicative of the desired electrical or optical property of the nanowire transparent conductor; and
   automatically determining sets of nanowire values based on the retrieved model data.

23. The method of claim 21, wherein the manufacturing specification includes at least one of a manufacturing process protocol, an average nanowire length, an average nanowire diameter, an average nanowire resistance, and an average nanowire density.

24. The method of claim 21, wherein determining the sets of nanowire values comprises:
   retrieving stored data correlating electrical or optical property of reference nanowire transparent conductors to physical measurements of reference nanowire including transparent conductors, experimental measurements of nanowire compositions, or manufacturing conditions that affect electrical and optical properties of the nanowire-including transparent conductor; and automatically determining sets of nanowire values based on the retrieved stored data.

25. The method of claim 21, wherein the manufacturing specification includes at least one of a nanowire density versus sheet resistance over nanowire resistance plot; a nanowire length versus nanowire diameter, for a given sheet resistance plot; a nanowire length over nanowire diameter square versus sheet resistance plot; a percent haze versus nanowire density times nanowire cross-sectional area plot; and an optical density versus nanowire density times nanowire cross-sectional area plot.

\* \* \* \* \*